United States Patent
Molnar et al.

(10) Patent No.: US 6,587,678 B1
(45) Date of Patent: Jul. 1, 2003

(54) DIRECT CONVERSION RECEIVER EMPLOYING SUBHARMONIC FREQUENCY TRANSLATOR ARCHITECTURE AND RELATED PREPROCESSOR

(75) Inventors: Alyosha C. Molnar, Costa Mesa, CA (US); Rahul Magoon, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/386,956

(22) Filed: Aug. 27, 1999

Related U.S. Application Data

(63) Continuation-in-part of application No. 09/261,056, filed on Mar. 2, 1999.

(51) Int. Cl.$^7$ ................................................ H04B 1/26
(52) U.S. Cl. ...................................... 455/323; 455/304
(58) Field of Search ................................. 455/323, 326, 455/330, 333, 304, 310; 327/356

(56) References Cited

U.S. PATENT DOCUMENTS

| | | | |
|---|---|---|---|
| 5,373,533 A | * 12/1994 | Hayashihara et al. | 375/88 |
| 5,574,755 A | 11/1996 | Persico | 375/295 |
| 5,943,370 A | * 8/1999 | Smith | 375/334 |

FOREIGN PATENT DOCUMENTS

| WO | WO 96/38924 | 12/1996 |
|---|---|---|

OTHER PUBLICATIONS

Ian Doyle, "A Simplified Subharmonic I/Q Modulator", *Applied Microwave & Wireless*, Oct. 1998.
Takafumi Yamaji et al., "An I/Q Active Balanced harmonic Mixer with IM2 Cancelers and a 45° Phase Shifter", *IEEE Journal of Solid–State Circuits*, vol. 33, No. 12, Dec. 1998.

* cited by examiner

Primary Examiner—Edward F. Urban
Assistant Examiner—N. Mehrpour
(74) Attorney, Agent, or Firm—Mintz Levin Cohn Ferris Glovsky and Popeo PC

(57) ABSTRACT

A direct conversion receiver for receiving a first input signal and directly downconverting it to baseband frequencies. The receiver includes a frequency translator which is responsive to a phase-split input signal having 2n components, wherein n is an integer greater than 1. The phase-split signal has a period T which is about n times the period of the first input. The frequency translator alternates, at a rate of about 2n/T, between switching the first input signal to a first output, and switching the first signal to a second output. A preprocessor is available to improve the switching characteristics of the phase-split input signal.

30 Claims, 40 Drawing Sheets

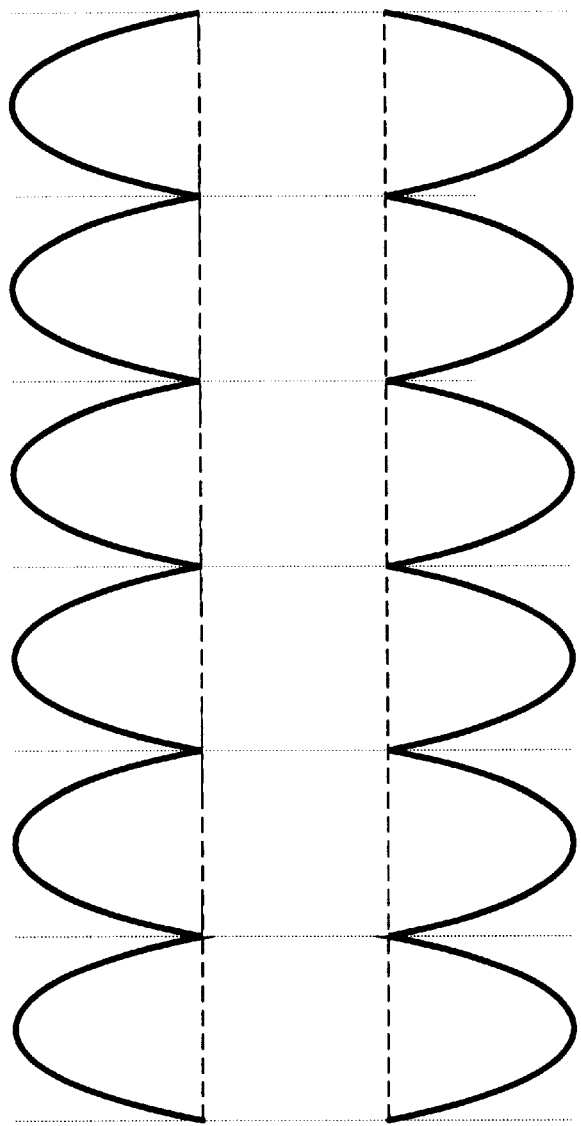
*FIGURE 14B*
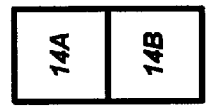

US 6,587,678 B1

DIRECT CONVERSION RECEIVER EMPLOYING SUBHARMONIC FREQUENCY TRANSLATOR ARCHITECTURE AND RELATED PREPROCESSOR

BACKGROUND OF THE INVENTION

This application is a continuation-in-part of U.S. patent application Ser. No. 09/261,056, "PREPROCESSOR AND RELATED FREQUENCY TRANSLATOR," filed Mar. 2, 1999, which is hereby fully incorporated by reference herein as though set forth in full.

1. Field of the Invention

The field of this invention relates generally to direct conversion receivers, and, more specifically, to subharmonic frequency translators for use in such receivers, and preprocessors for improving the switching characteristics of the LO input to such frequency translators.

2. Background

Conventional receivers downconvert a radio frequency (RF) signal to baseband frequencies in two steps. In the first step, the signal is downconverted to intermediate frequencies (IF), and in the second step, the signal is downconverted to baseband frequencies. A conventional receiver is illustrated in FIG. 1. An RF signal 1 having a carrier frequency $F_{RF}$ is applied to RF input port 3 of mixer 2. A signal 10 having a frequency $F_X$ less or greater than $F_{RF}$ originating from local oscillator (LO) 9 is passed through bandpass filter 15 and then through a low noise amplifier (LNA) (not shown). The resulting signal is then applied to the LO input port 4 of mixer 2. The mixer 3 mixes the two signals and provides an output signal at output port 5. The output signal has two principal frequency components: one at the frequency $F_{RF}-F_X$ (or $F_X-F_{RF}$ in the case in which $F_X$ is greater than $F_{RF}$), the so-called intermediate or IF frequency $F_{IF}$, and the other at the frequency $F_{RF}+F_X$.

The signal is passed through IF filter 6 which substantially attenuates the component at the frequency $F_{RF}+F_X$, thus leaving the intermediate frequency component. The output of the filter including this intermediate frequency component is identified with numeral 7.

This signal is provided to the signal input port of mixer 8. At the same time, a signal 12 at the same intermediate frequency and originating from local oscillator 12 is applied to the LO input port of mixer 8. Mixer 8 mixes the signals provided at its two inputs, and produces an output signal having two principal frequency components: one at the frequency $2F_{IF}$, and the other at zero or baseband frequencies $F_{BB}$. The output of the mixer 8 is passed through baseband filter 14 which substantially attenuates the component at the frequency $2F_{IF}$, thus leaving the component at baseband frequencies. The output of the filter is identified in the figure with numeral 13.

Direct conversion receivers downconvert an RF signal to baseband frequencies in a single step. Typically, a mixer mixes an RF signal with an LO signal at the same frequency as the carrier of the RF signal. The mixer produces two primary frequency components in the output signal: one at the difference frequency $F_{RF}-F_{LO}$, and the other at the frequency $F_{RF}+F_{LO}$. Since the LO signal is at the same frequency at the RF signal, the first such component is at baseband frequencies, and the second such component is at high frequencies.

The output of the mixer is passed through a baseband filter, which substantially attenuates the high frequency component of the output, leaving the baseband component.

Compared to the conventional receiver of FIG. 1, direct conversion receivers eliminate components such as the IF filter 6, one of the mixers, and one of the local oscillators. The elimination of the IF filter is particularly advantageous because such filters tend to be bulky, expensive, and not implementable on-chip.

However, direct conversion receivers are typically limited in their sensitivity because of leakage from the LO port to the RF port, or leakage of large RF blockers from the RF port to the LO port, both of which can result in self-mixing, and introduction of a large unwanted DC component in the output signal.

Subharmonic mixers are mixers in which the LO frequency is a subharmonic of the RF frequency. Subharmonic mixers allow generation of lower frequency LO signals, which eases synthesizer and voltage controlled oscillator (VCO) design. They also provide the potential for frequency isolation between the LO and RF signals.

Unfortunately, most subharmonic mixers have relatively low conversion gain and high noise as compared to standard mixers. They are also plagued by the presence, on an internal node or pin, of LO harmonics which, because they are at the mixing frequency, can still self-mix to DC. Some also require bulky transformers that limit or prevent on-chip implementation. Most also have substantially non-linear RF transfer functions.

The Gilbert mixer is one type of mixer which allows for conversion gain. However, conventional Gilbert mixers include a mixer core which is unable to accommodate a LO frequency which is a subharmonic of the RF frequency.

More specifically, the standard Gilbert mixer is driven by an LO signal having two components which are 180° are of phase with respect to one another. The components are clipped in order to increase the transition times thereof, thereby improving noise performance and achieving a higher conversion gain. However, such techniques cannot be generalized to the subharmonic mixer case.

Therefore, there is a need for a direct conversion receiver with increased gain, noise performance, and sensitivity compared to the prior art.

There is also a need for a subharmonic mixer which is capable of on-chip implementation, has conversion gain, noise figure, and linearity characteristics comparable to or exceeding those of conventional mixers, and does not generate on an internal pin or node LO harmonics at the mixing frequency.

There is also a need for a preprocessor which improves the switching characteristics of successive phase-split LO inputs.

SUMMARY OF THE INVENTION

In accordance with the purpose of the invention as broadly described therein, there is provided a direct conversion receiver comprising a subharmonic frequency translator configured to receive a phase-split LO input. In one embodiment, the receiver also includes a preprocessor for preprocessing the phase-split LO inputs to improve the switching characteristics thereof. An example application of such a receiver is within a mobile communications device or handset in a wireless communications system.

A first aspect of the invention comprises the frequency translator. A second aspect comprises the preprocessor. A third aspect comprises the frequency translator in combination with the preprocessor. A fourth aspect comprises the direct conversion receiver. A fifth aspect comprises a wireless communications system including a wireless communications device which includes the direct conversion receiver of the subject invention.

In one embodiment, the frequency translator comprises: a first input for receiving a first input signal; at least one input for receiving a phase-split second input signal having 2n components, wherein n is an integer greater than 1; first and second outputs; a frequency translator core configured to switch the first input signal to the first output responsive to assertion of any of a first group of components of the phase-split input signal, and configured to switch the first input signal to the second output responsive to assertion of any of a second group of components of the phase-split input signal.

In one implementation, the first group comprising alternate ones of the components of the phase-split input signal, and the second group comprising the remaining components of the phase-split input signal.

Each of the 2n components of the seconnd input signal can be one of a plurality of 2n single-ended signals, or a component of one of a plurality of n differential signals, each having positive phase and negative phase components. To avoid confusion, and to allow usage of a common terminology in this specification, both cases will be described in terms of a phase-split input signal having 2n components.

Similarly, the signals produced on the first and second outputs may each be single-ended signals, or may be components of a differential output signal. The two may remain as separate signals or components, as the case may be, or may be combined to form a single-ended output signal.

In addition, the first input signal may either be a single-ended input signal or one of the components of a differential input signal. In one implementation, the first input signal is one of the components of a differential input signal, and the frequency translator core is configured to switch the other component of the differential input signal to the second output responsive to assertion of any of the first group of components of the phase-split input signal, and is configured to switch the other component of the differential input signal to the first output responsive to assertion of any of the second group of components of the phase-split input signal.

In another embodiment, the frequency translator is a multiplier having first and second inputs, and first and second outputs. The multiplier is configured to alternate, at a frequency which is about 1/n times the frequency of the second input, wherein n is an integer greater than 1, between switching the first input to the first output, and the first input to the second output, all while substantially avoiding physically generating on an internal node or pin a signal having a frequency about equal to n times the frequency of the second input. In one embodiment, the signals formed at the first and second outputs, which can either be single-ended output signals or components of a differential output signal, are combinable into a signal which is representative of the product of the first signal and a multiplication factor which switches polarity at about n times the frequency of the second signal.

In one implementation, the frequency translator is a mixer having RF and LO inputs, and a differential mode output having positive and negative phase components. The mixer has a mixer core which is configured to switch polarity, i.e., alternate between switching the RF input to the positive phase component of the output, and switching the RF input to the negative phase component of the output, at a frequency which is about n times the LO frequency, wherein n is an integer greater than 1. In one embodiment, a single-ended output is formed by combining the positive and negative phase components of the differential output. In one implementation example, the frequency of the LO input is about 1/n times the frequency of the RF input.

In one embodiment, a signal applied to the second input of the mixer has a period T, and the mixer is configured to alternate, at a rate of about T/2n, wherein n is an integer greater than 1, between 1) switching the first input signal to the positive phase component of the output, and 2) switching the first input signal to the negative phase component of the output. In one embodiment, each of these steps is performed during consecutive but substantially non-overlapping subperiods of the period T, each of the subperiods having a duration of about T/2n, where n is an integer greater than 1.

In a second embodiment, the first input signal is a differential mode signal having positive and negative phase components, and the mixer is configured to alternate, at a rate of about T/2n, between 1) switching the positive phase component of the first input to the positive phase component of the output while switching the negative phase component of the first input to the negative phase component of the output; and 2) switching the negative phase component of the first input to the positive phase component of the output while switching the positive phase component of the first input to the negative phase component of the output.

In either of these embodiments, the signals produced at the output may be kept in differential mode, or alternatively, may be combined to form a single-ended output signal.

In one implementation, the mixer is a modified Gilbert mixer. In one implementation example, the modified Gilbert mixer receives a differential RF input, and provides a differential output. In this implementation example, the mixer core comprises 4n bipolar NPN transistors in two logical groups of 2n transistors each. The differential RF input is a current mode input having positive and negative components. The positive component is coupled to the emitters of the transistors in the first group, and the negative component is coupled to the emitters of the transistors in the second group.

The collectors of the odd-numbered transistors in the first group are coupled together to form a first node, and the collectors of the even-number transistors in the first group are coupled together to form a second node. The collectors of the even-numbered transistors in the second group are coupled to the first node, and the collectors of the odd-numbered transistors in the second group are coupled to the second node.

The differential output is a current mode output having positive and negative components. The positive component of the output is taken from the first node, and the negative component of the output is taken from the second node.

The LO input is an evenly phase-split voltage mode signal provided by the preprocessor. The signal has 2n components split about 180/n degrees apart. Each of the components is in a predefined state sufficient to trigger a switching action of the mixer core for a time about equal to T/2n during a period T, where T is the period of the LO signal. Only one of the components is in the predefined state at a time. The ith component of the phase-split input is coupled to the base of the ith transistor in each group.

In one configuration, n=2, and the LO frequency is about ½ the RF carrier frequency. In this configuration, the mixer core switches polarity at about twice the LO frequency. This configuration employs what is known as one-half LO injection. In a second configuration, n>2.

In one embodiment, the preprocessor provides the preprocessed phase-split LO input responsive to a phase-split LO input. In this embodiment, the preprocessor comprises limiter circuitry and arithmetic circuitry. The limiter circuitry limits each of the components of the input to form a limited signal, and the arithmetic circuitry arithmetically combines the components of the limited signal to form the preprocessed phase-split LO signal which is input to the mixer. In one embodiment, the limiter circuitry limits the components of the input signal by amplifying and then clipping them such that each of the components resembles a square wave.

In one implementation, the limiter circuitry limits each component of the phase-split input signal to form a square wave, and the arithmetic circuitry pairwise combines the square waves to form the input signal to the mixer.

Implementation examples are possible in which any of the differential mode signals in the foregoing examples are single-ended signals, or in which any of the foregoing current mode signals are voltage mode, and vice-versa. Further implementation examples are possible in which the transistors in the mixer core comprise or embody bipolar PNP transistors, MOSFETs, HBTs, BJTs, CMOS technology, HEMTs, MODFETs, diodes, MESFETs, JFETs, or the like.

A method of operation of a direct conversion receiver in accordance with the subject invention comprises the steps of receiving a first input; providing a phase-split second input at a frequency which is about I/n times the frequency of the first input, wherein n is an integer greater than 1; preprocessing the second input to improve the switching characteristics thereof, using the preprocessed input to alternate, at a frequency which is about n times the frequency of the second input, between 1) switching the first input to a first output; and 2) switching the first input to a second output. In one embodiment, the method further comprises combining the signals produced at the two outputs to form a single-ended output, and then filtering the single-ended output signal to recover the baseband component thereof.

One embodiment of a method of mixing first and second input signals in accordance with the subject invention, the second signal having a period T, comprises alternating the following steps at a rate of about 2n/T, wherein n is an integer greater than 1: 1) switching the first signal to a first output; and 2) switching the first signal to a 3second output.

In another embodiment, a method of operation of a frequency translator in accordance with the subject invention comprises alternating, at a rate of about 2n/T, wherein T is the period of an LO input, and n is an integer greater than 1, between the steps of: 1.) switching an RF signal to a positive phase component of a differential output; and 2.) switching the RF signal to the negative phase component of the output.

In a third embodiment, wherein the RF input is a differential mode input having positive and negative phase components, RF$^+$ and RF$^-$, respectively, and the output is a differential mode output having positive and negative phase components, output$^+$ and output$^-$, respectively, the method comprises alternating, at a rate of about 2n/T, between the steps of: 1.) switching RF$^+$ to output$^+$ while switching RF$^-$ to output$^-$; and 2.) switching RF$^-$ output$^+$ while switching RF$^+$ to output$^-$.

One embodiment of a circuit for improving, in accordance with the subject invention, the switching characteristics of a phase-split input signal having 2n components, wherein n is an integer greater than 1, comprises: limiter circuitry for limiting the components of the input signal to produce a limited phase-split signal; and arithmetic circuitry for arithmetically combining the components of the limited phase-split signal to produce an output phase-split signal having improved switching characteristics in relation to the input signal, the output signal having 2n components.

A second embodiment comprises circuitry for receiving a phase-split input signal having a period T and also having 2n components, wherein n is an integer greater than 1; and circuitry for producing therefrom a phase-split output signal, also having a period T, and also having 2n components, such that 1) for each substantially non-overlapping T/2n subperiod of the period T, only one of the components of the output signal is asserted at a time, and a different one of the components is asserted in each of the subperiods, 2) each of the components is substantially symmetric about a horizontal axis, 3) the transitions times between the on and off states of each of the components are fast. In one implementation, each of the components of the output signal has a stairstep shape For purposes of this disclosure, assuming that a component of the output signal achieves an amplitude A in the 2n/T period in which it is asserted, a fast transition is one in which the transistion occurs at a rate equal to or exceeding (A+2n)/T. Also for purposes of this disclosure, a signal is asserted when it is placed in a predefined state which, in one embodiment, is the state which is sufficient to trigger a mixer to switch polarity. In one implementation, a signal is asserted when it is the highest signal at a time.

A method of preprocessing a phase-split input to form a phase-split output, the input having a period T and also having 2n phase-split components, wherein n is an integer greater than 1, comprises the steps of: limiting the components of the input to form a phase-split limited signal; and arithmetically combining the components of the limited signal to form a phase-split output signal.

The advantages of a direct conversion receiver in accordance with the subject invention include greater sensitivity compared to a conventional direct conversion receiver, a lower LO frequency, reduced LO and RF coupling, and ease of design stemming from the reduced LO and RF coupling.

The advantages of a subharmonic mixer in accordance with the subject invention, compared to a conventional subharmonic mixer, include reduction in the unwanted DC component in the output signal caused by self-mixing of the LO or RF input signals. Leakage from the LO to the RF ports is at the actual LO frequency, while the frequency of the original LO signal is effectively increased n times due to the switching action of the mixer. The result is that unwanted mixing will occur between a signal at the LO frequency, and a signal at about n times the LO frequency. Since the two are substantially different, little or no baseband components will result.

Leakage from the RF to the LO ports, which is nominally at the RF frequency, is effectively increased in frequency n times due to the switching action of the mixer. The frequency of the original RF signal remains the same, however. The result is that unwanted mixing will occur between a signal at the RF frequency, and a signal at about n times the RF frequency. Again, since the two are substantially different, little or no baseband component will occur.

Still another advantage is on-chip manufacturability given that, in one embodiment, all the components of the mixer core are transistors, and transistors are easily implementable on-chip.

Yet another advantage, compared to conventional subharmonic mixers, is a more linear RF transfer function given that, through the switching action of the mixer, the RF$^+$ and RF$^-$ currents are alternatively steered directly to the outputs of the mixer.

Finally, yet another advantage of the mixer of the subject invention is that, because it is similar in topology to a Gilbert mixer, a great deal of pre-existing experience can be brought to bear, thus speeding design.

An advantage of the preprocessor of the subject invention is a phase-split LO signal having steeper transitions between the on and off states thereof compared to a sinusoidal LO phase-split signal. When used to drive a mixer, such transitions result in improved mixer gain, improved mixer noise performance, and therefore improved mixer sensitivity.

Another advantage of the preprocessor of the subject invention is a phase-split signal in which the transitions between on and off state are defined by LO zero crossings, which provides better rejection of RF self-mixing, and less dependence on LO amplitude matching, and the type and shape of the LO waveform.

An advantage of the combination of the subharmonic mixer and the preprocessor of the subject invention compared to a subharmonic mixer driven by a sinusoidal phase-split LO signals is low conversion loss given that virtually all the RF input current is retained in the output.

Another advantage of such a combination is reduced noise and sensitivity to interference due to the steeper transitions between the on and off states of the preprocessed phase-split LO inputs.

BRIEF DESCRIPTION OF THE DRAWINGS

FIGS. 14A–14B illustrates example waveforms for the mixer implementation example of FIG. 13.

DETAILED DESCRIPTION OF THE PREFERRED EMBODIMENTS

1. Direct Conversion Receiver

Figure 1:
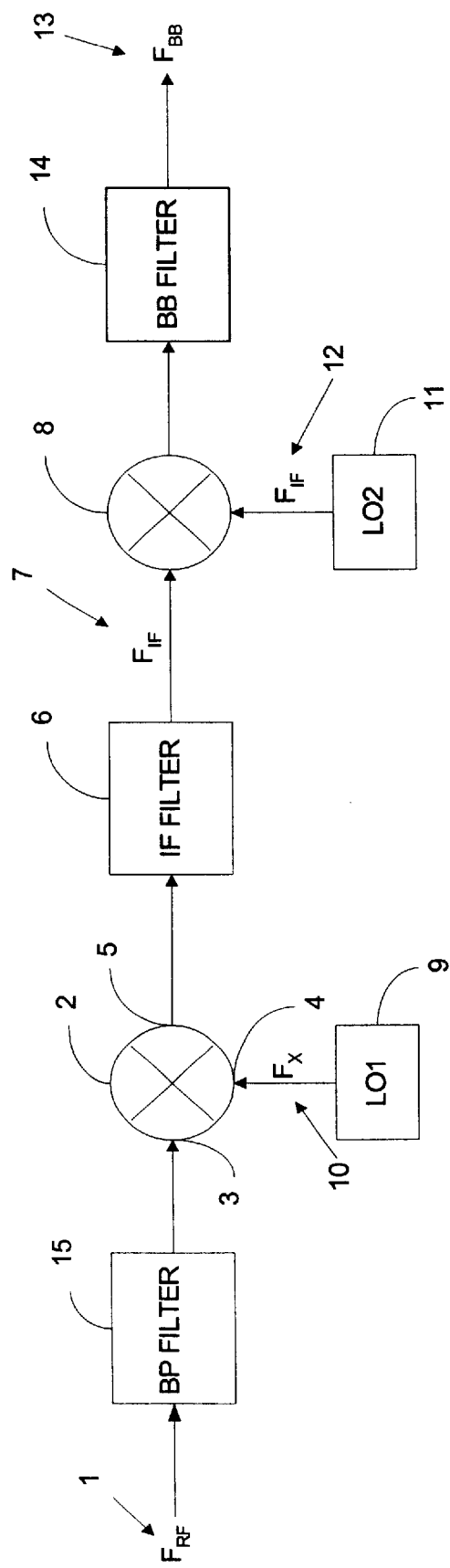
FIG. 1 illustrates a conventional receiver.
Figure 2:
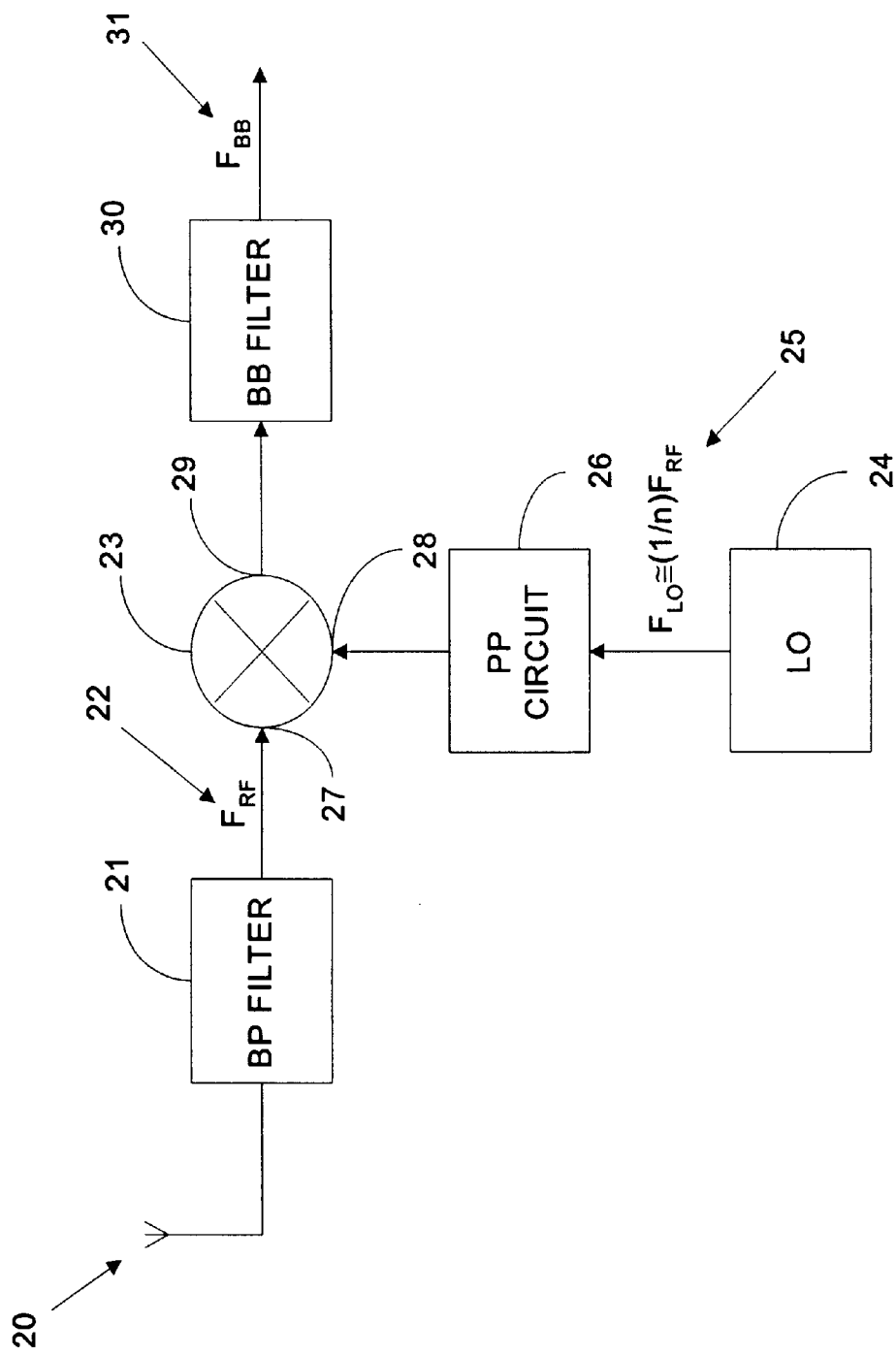
FIG. 2 illustrates one embodiment of a direct conversion receiver in accordance with the subject invention.

A direct conversion receiver in accordance with the subject invention is illustrated in FIG. 2. An antenna 20 receives a signal comprising an RF carrier signal modulated by a baseband signal. The signal is passed through bandpass filter 21 configured to substantially attenuate signals outside the band of interest. Assuming the received signal is within the band of filter 21, it passes through filter 21 substantially unattenuated. The received signal after passage through the filter 21 is identified with numeral 22. This signal is provided as an input to frequency translator 23 through input port 27. The carrier frequency of this signal is $F_{RF}$. An amplifier or low noise amplifier (LNA) may also be present between bandpass filter 21 and the frequency translator signal input port 27. In one embodiment, the frequency translator 23 is a mixer. In another embodiment, it is a multiplier.

A local oscillator 24 provides a signal 25 at a frequency $F_{LO}$ which is about a 1/n subharmonic of the RF carrier frequency of the received signal. In other words, $F_{LO} \approx (1/n) F_{RF}$, wherein n is an integer greater than 1. The signal 25 is then pre-processed by preprocessor 26. The phase-split pre-processed signal is then provided as an input to frequency translator 23 through input port 28.

The output of frequency translator 23 is available through output port 29. The output generally has two primary frequency components, one at high frequencies, and the second at baseband frequencies. The output is passed through baseband filter 30. Filter 30 is configured to substantially attenuate the high frequency component of the output of frequency translator 23, and to allow passage of the baseband component without substantial attenuation. The output of baseband filter 30, the baseband component of the output of the frequency translator at frequency $F_{BB}$, is the output 31 of the direct conversion receiver system.

The direct conversion receiver system may be a component of a transceiver which, in turn, may be a component of a wireless communications device, including a mobile wireless communications device such as a handset or laptop, or base station. The wireless communications device may be part of a wireless communications system of the type in which a geographical area is divided into a plurality of cells, with a base station situated within each of the cells. The base station communicates with and services one or more wireless communications devices situated within the cell over a wireless interface. One or more of the wireless communications devices in the system incorporate a direct conversion receiver configured in accordance with the subject invention.

In one embodiment, the frequency translator 23 has first and second inputs, identified respectively with numerals 27 and 28, in which the frequency of a signal provided to the second input 28 is about 1/n times the frequency of a signal applied to the first input 27, wherein n is an integer greater than 1.

The frequency translator has first and second outputs, and is configured to alternate, at a frequency which is about n times the frequency of the second input thereof, between 1) switching the first input to the first output; and 2) switching the first input to the second output. The signals produced at the outputs may be components of a differential mode signal, or alternatively, may be single-ended signals. In addition, the signals produced at the outputs may be combined to form a single-ended output, or may be kept separate.

Moreover, the first input may either be a single-ended signal, or a component of a differential input signal having positive and negative phase components. In this latter case, in one embodiment, the frequency translator is configured to alternate, at a frequency which is about n times the frequency of the second input thereof, between 1) switching the positive phase component of the first input to the first output while switching the negative phase component of the first input to the second output; and 2) switching the positive phase component of the first input to the second output while switching the negative phase component of the first input to the first output.

Figure 27A:
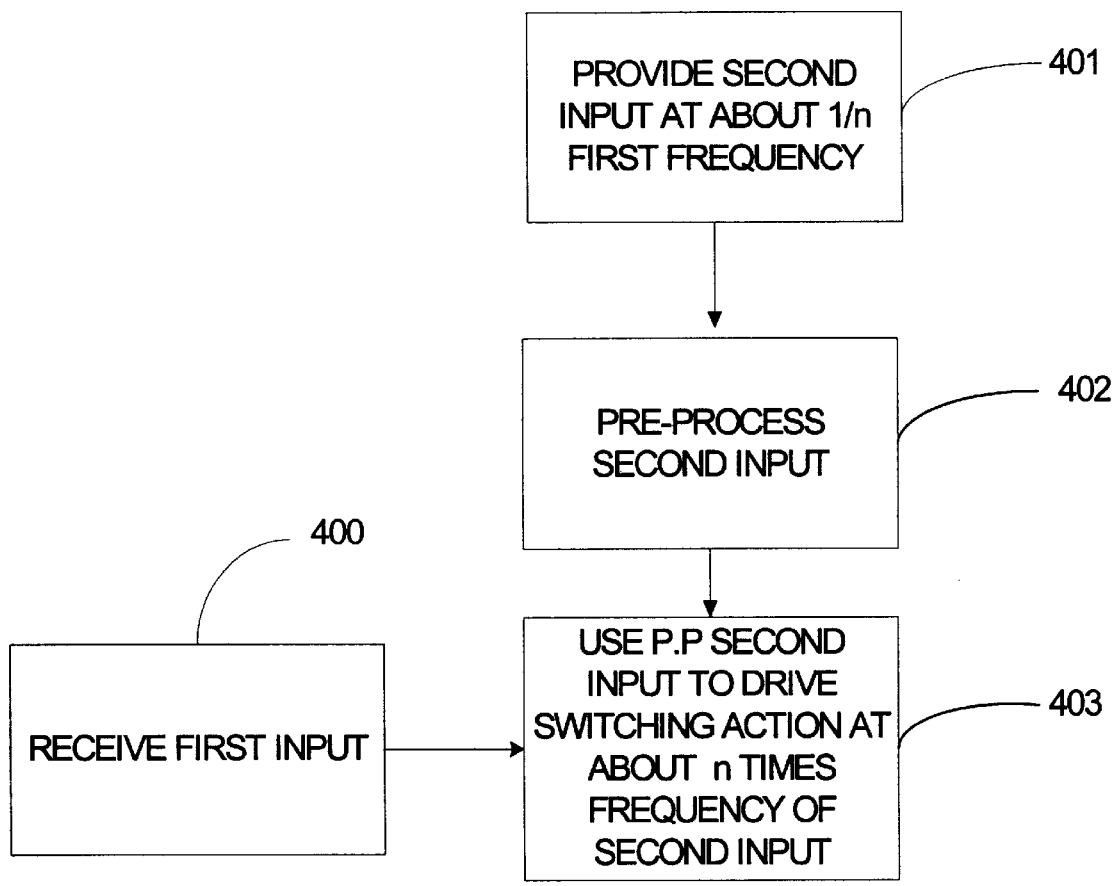
FIGS. 27A–27B illustrate embodiments of methods of operation of a direct conversion receiver in accordance with the subject invention.

A method of operation of a direct conversion receiver in accordance with the subject invention is illustrated in FIG. 27A. In step 400, a first input is received. In step 401, a second input is provided which has a frequency which is about 1/n times the frequency of the first input, wherein n is an integer greater than 1. In step 402, the second input is preprocessed to improve its switching characteristics. In step 403, the preprocessed second input is used to alternate, at a frequency which is about n times the frequency of the second input, between switching the first input to a first output, and switching the first input to a second output.

The signals produced at the outputs may be single-ended signals, or may be components of a differential signal. Optionally, the signals produced at the two outputs are combined to form a single-ended output. Moreover, the first input may be a single-ended input, or a component of a differential input having positive and negative phase components. In the latter case, the method may further comprise alternating, at a frequency which is about n times the frequency of the second input, between 1) switching the positive phase component of the differential input signal to the first output while switching the negative phase component of the differential input to the second output; and 2) switching the negative phase component of the differential input signal to the first output while switching the positive phase component of the differential input signal to the second output.

In one embodiment of frequency translator 23, the first input is an RF input, and the second input is a LO input. A signal is received at the first input which comprises an RF carrier signal modulated by a baseband signal. In one implementation, the frequency of the LO input is equal to about ½ the frequency of the RF input. In one implementation example, the frequency of the LO input is equal to about ½ the carrier frequency of the LO input.

Figure 27B:
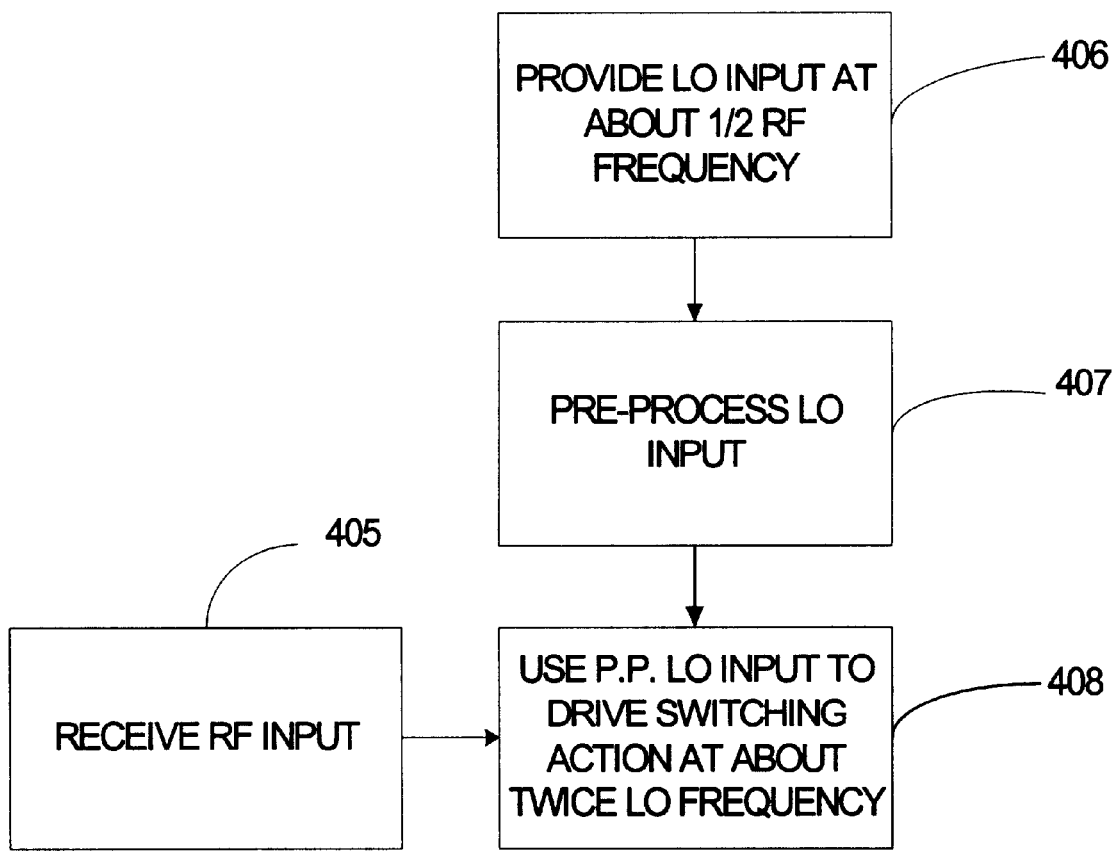

A method of operation of this implementation of a direct conversion receiver is illustrated in FIG. 27B. In step 405, an RF input is received. In step 406, the LO input is provided having a frequency equal to about ½ the frequency of the RF input. In step 407, the LO input is preprocessed to improve its switching characteristics. In step 408, the preprocessed LO input is used to alternate, at a frequency which is about twice the frequency of the LO input, between switching the RF input to a first output, and switching the RF input to a second output.

In the foregoing and subsequent discussions, it should be appreciated that, due to tolerances acceptable in the trade, that mathematical exactitude is not always possible in describing the relationship between signals. The use of terms such as "about" or "substantially" or "approximately" are intended to allow some leeway in the relationship between signals to account for these tolerances.

2. Frequency Translator

In one embodiment, the frequency translator is as described in the foregoing section, although the frequency of the second input is not necessarily constrained to be about 1/n times the frequency of the first input.

Figure 3:
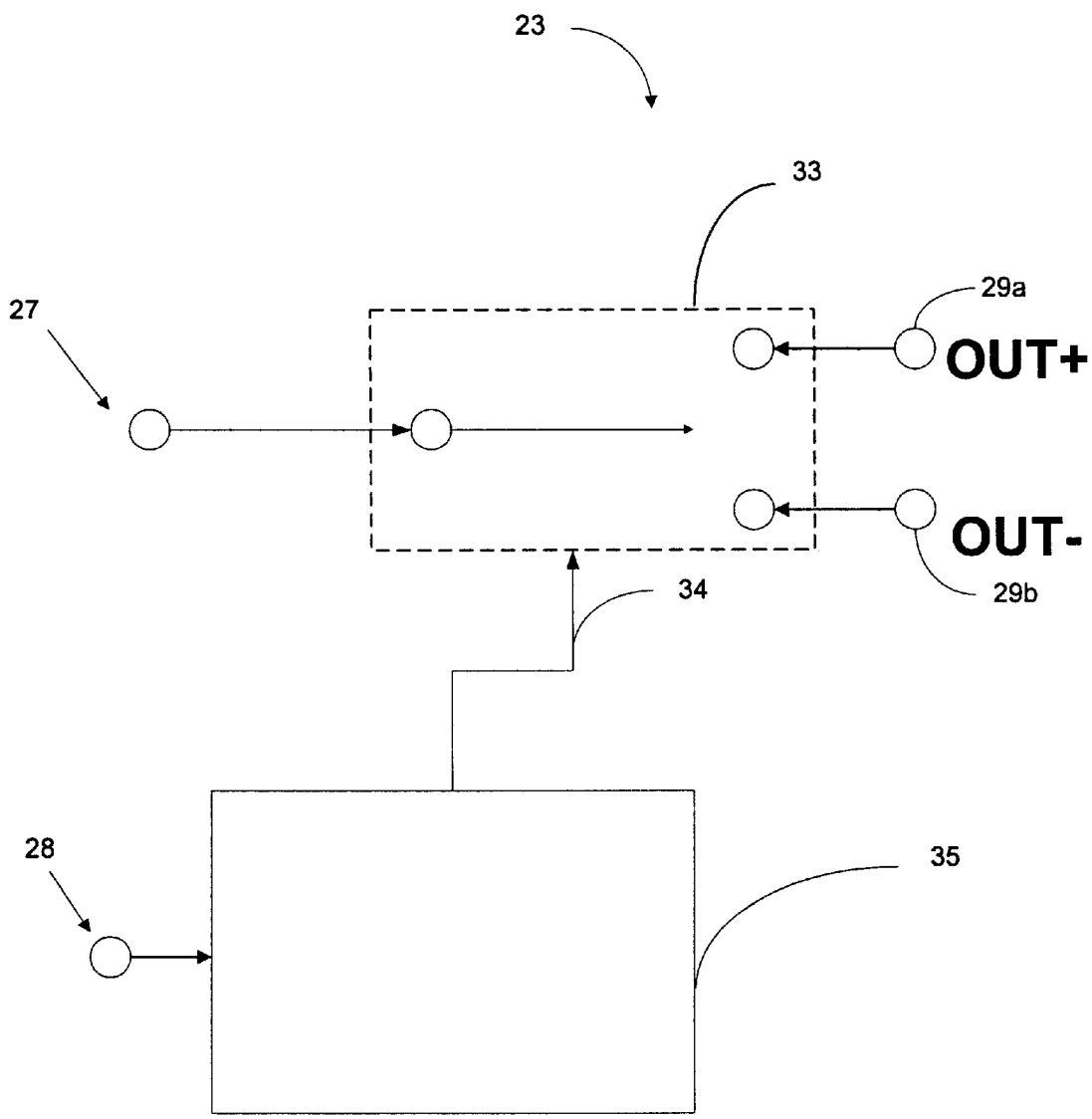
FIG. 3 is a block diagram of a multiplier in accordance with the subject invention.

In another embodiment, the frequency translator 23 is a multiplier having RF and LO inputs. A block diagram of such a multiplier is illustrated in FIG. 3. In this embodiment, an LO signal is applied to input port 28, and an RF signal is applied to input port 27. Two outputs are provided, identified with numerals 29a and 29b. The RF signal is input to Double Throw Single Pole (DTSP) switch 33. The LO signal is input to block 35 which directs, through signal line 34, DTSP switch 33 to alternate, at a frequency of about n time the frequency of the LO input, wherein n is an integer greater than 1, between switching the RF signal to the first output 29a and switching the RF signal to the second output 29b. The signals produced at the outputs 29a and 29b are such that a combination of such signals is representative of the product of a multiplication factor, which switches polarity between +1 and −1 at a frequency of about n times the frequency of the LO signal, and the RF signal.

In one example, the frequency of the LO input is about 1/n times the frequency of the RF input, wherein n is an integer greater than 1. However, it should be appreciated that examples are possible in which this relationship does not hold.

Preferably, a signal at the frequency of or embodying the multiplication factor is not substantially produced as a signal on an internal pin or node of the multiplier since, as one of skill in the art would appreciate, substantial production of such a signal on an internal pin or node could lead to self-mixing of the LO signal, and an unwanted DC component in the output. Instead, in this embodiment, the multiplication factor simply represents (1) a switching action which occurs at about n times the LO frequency; and (2) the transfer function between the incoming RF signal and the combined output signal.

Again, the signals produced at the outputs 29a and 29b may either be single-ended signals, or components of a differential signal. In addition, the RF signal provided to input 27 may either be a single-ended signal or a component of a differential signal. In the latter case, an additional DTSP switch (not illustrated) may be included to alternate, in tandem with the switch 33, between switching the other component of the differential input signal to the output 29b (while the RF signal provided to input 27 is switched to the output 29a), and switching the other component of the differential input signal to the output 29a (while the RF signal provided to input 27 is switched to the output 29b).

Figure 4:
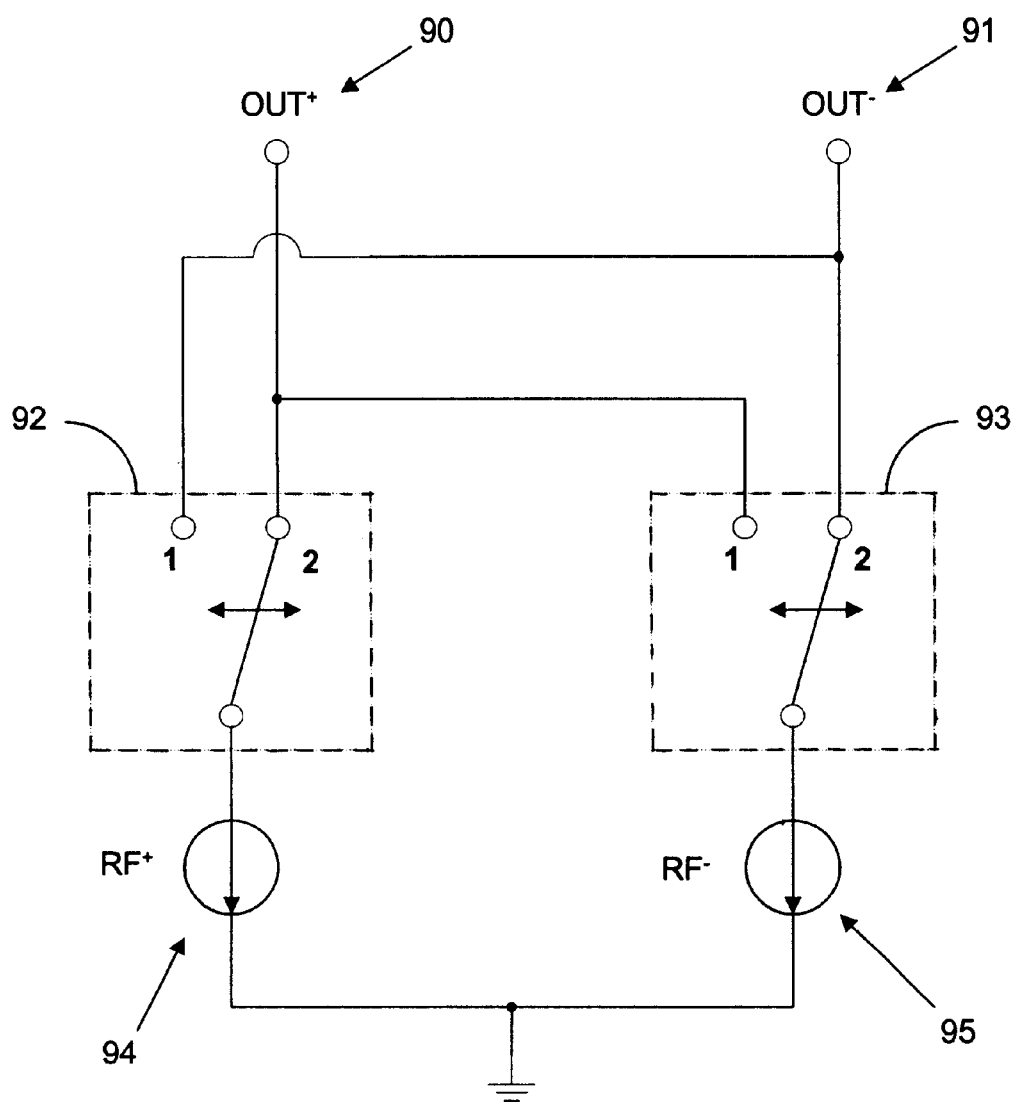
FIG. 4 illustrates in conceptual form a generalized mixer in accordance with the subject invention.

In a third embodiment, illustrated in FIG. 4, frequency translator 23 is a mixer, wherein the RF input to the mixer is a differential current mode signal having positive and negative phase components, $RF^+$ and $RF^-$, identified respectively with numerals 94 and 95. The mixer has a mixer core, represented by switches 92 and 93, each of which is configured to toggle back and forth in positions 1 and 2 at a rate equal to about n times the LO frequency. Each switch is synchronized with the other such that both switches are in position 2 at about the same time, and both are in position 1 at about the same time. The mixer has a differential current mode output signal having positive and negative components, $OUT^+$ and $OUT^-$, identified respectively with numerals 92 and 93. Switch 92 is configured to alternately steer the $RF^+$ current between the $OUT^+$ output, and the $OUT^-$ output. Similarly, switch 93 is configured to alternately steer the $RF^-$ current between the $OUT^+$ out and the $OUT^-$ output. The switching is performed such that the $RF^+$ current is steered to the $OUT^+$ output at about the same time the $RF^-$ current is steered to the $OUT^-$ output, and the $RF^-$ current is steered to the $OUT^+$ output at about the same time the $RF^+$ current is steered to the $OUT^-$ output.

Again, embodiments are possible in which the output signals $OUT^+$ and $OUT^-$ are single-ended signals, and in which only one of switches 92 and 93 is provided to alternatively switch an RF signal (which may be a single-ended signal or a component of a differential signal) between the outputs 94 and 95. In addition, examples are possible in which the frequency of the LO input is about 1 /n times the frequency of the RF input, or in which this relationship does not hold.

In one implementation, the mixer is a modified Gilbert mixer. For additional information on conventional Gilbert mixers, the reader is referred to Paul R. Gray et al., "Analysis and Design of Analog Integrated Circuits, " Third Ed., 1993, pp. 670–675, which is hereby fully incorporated by reference herein as though set forth in full. In one implementation example, illustrated in FIG. 5, the modified Gilbert mixer receives a differential current mode RF input having positive and negative phase components, $RF^+$ and $RF^-$, respectively identified with numerals 104 and 105. The mixer also receives an evenly phase-split LO differential and voltage mode input having n differential components (2n single-ended components) split about 180/n degrees apart. For purposes of this disclosure, to avoid confusion, and to allow usage of a common terminology, for both the differential and single-ended input cases, the 2n component terminology will hereinafter be used to describe both cases, it being understood that, in the differential case, the 2n components can be grouped into n pairs, each pair comprising a positive phase component of a differential signal, and a negative phase component of the differential signal.

In one embodiment, the LO input is preprocessed by a preprocessor in accordance with the subject invention. In this embodiment, the 2n (differential mode) components of the preprocessed LO input are referred to as $PLO_0^+$, $PLO_1^+$, ... $PLO_{n-1}^+$, $PLO_0^-$, $PLO_1^-$, ... $PLO_{n-1}^-$, where the subscript, a number ranging from 0 to n-1, indicates a differential signal, and the superscript, either + or −, indicates respectively a positive or negative phase component of a differential signal. In one example, the frequency of the LO input is about 1/n the carrier frequency of the RF input, wherein n is an integer greater than 1.

The mixer provides a differential current mode output, $OUT^+$ and $OUT^-$, respectively identified with numerals 100 and 101. In this implementation example, the mixer core comprises 4n bipolar NPN transistors in two logical groups, identified respectively with numerals 102 and 103, of 2n transistors each. In the figure, each of the 2n transistors in a group is assigned a number ranging from 1 to 2n. The positive component of the RF input, $RF^+$, is coupled to the emitters of the transistors in the first group 102, and the negative component of the RF input, $RF^-$, is coupled to the emitters of the transistors in the second group 103.

The collectors of the odd-numbered transistors in the first group 102 are coupled together to form a first node 106, and the collectors of the even-number transistors in the first group 102 are coupled together to form a second node 107. The collectors of the even-numbered transistors in the second group 103 are coupled to the first node 106, and the collectors of the odd-numbered transistors in the second group 103 are coupled to the second node 107.

The positive phase component of the output, $OUT^+$, is taken from the first node 106, and the negative phase component of the output, $OUT^-$, is taken from the second node 107.

As illustrated in FIGS. 6A–6E, the preprocessed LO input is an evenly phase-split differential and voltage mode signal having 2n components split about 180/n degrees apart. FIG. 6A illustrates the first component, $PLO_0^+$; FIG. 6B illustrates the second component, $PLO_1^+$; FIG. 6C illustrates the third component, $PLO_2^+$; FIG. 6D illustrates the (n+1)th component, $PLO_0^-$; and FIG. 6E illustrates the 2nth component, $PLO_{n-1}^-$. As illustrated, during each of the T/2n subperiods of the period T of the LO signal, only one of the components is asserted, that is, in a predefined state, identified with numeral 108, sufficient to trigger a switching action of the mixer core. In addition, a different one of the components is asserted in each of the subperiods. Further, the transistions between the on and off states, e.g., between level 109 and level 108, for each of the components are fast, which means, for purposes of this disclosure, that these transistions occur at a rate greater than or equal to (2n×A)/T, where A is the amplitude corresponding to the difference between level 108 and level 109. Finally, each of the components is substantially symmetrical about the horizontal axis identified with numeral 109.

Figure 5:
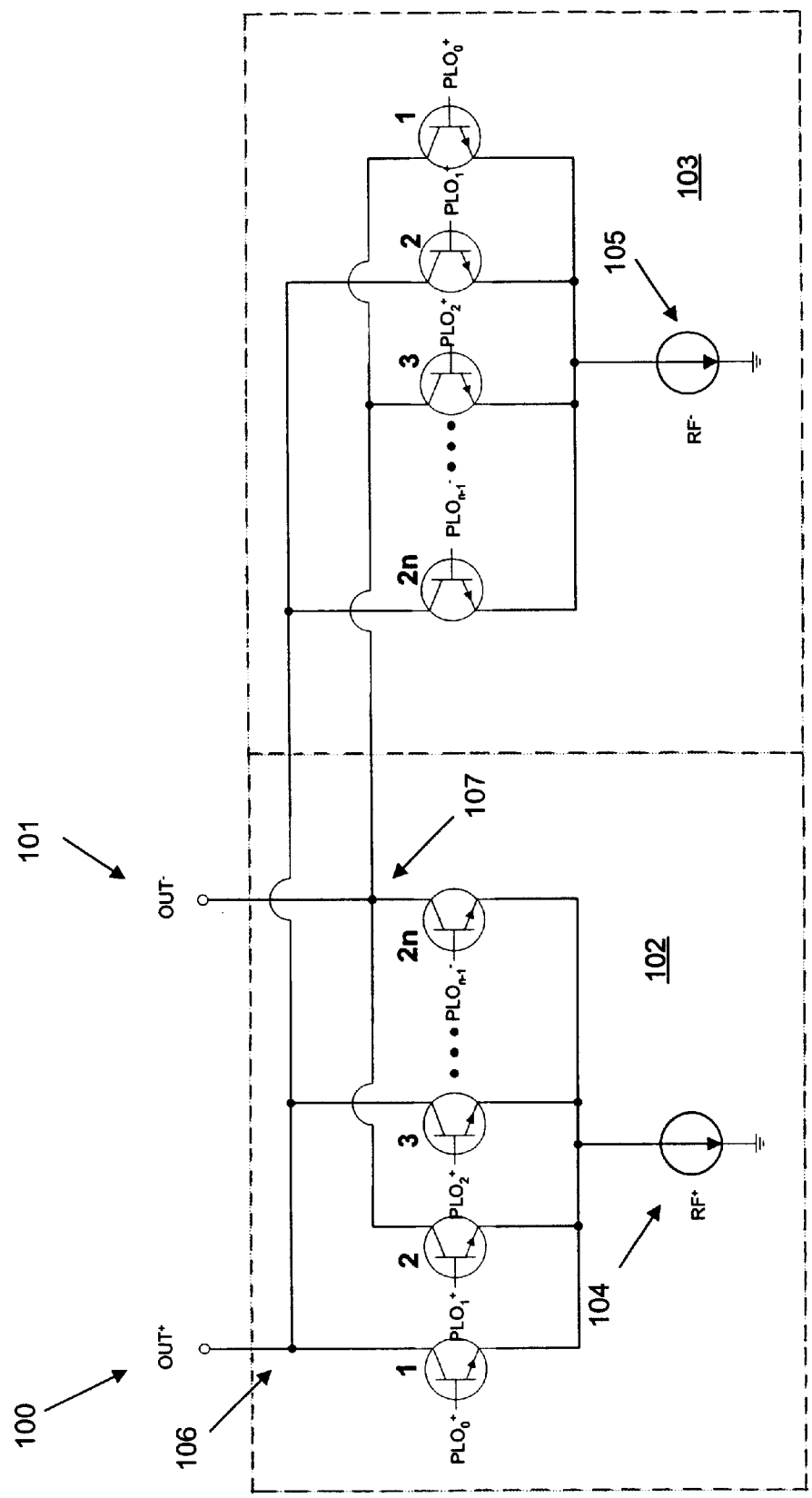
FIG. 5 illustrates an implementation of the mixer of FIG. 4.

With reference to FIG. 5, for both the first and second transistor groups 102 and 103, the ith component of the preprocessed LO input is coupled to the base of the ith transistor in the group. Thus, as illustrated in FIG. 5, in both groups 102 and 103, $PLO_0^+$ is coupled to the base of transistor 1; $PLO_1^+$ is coupled to the base of transistor 2; $PLO_2^+$ is coupled to the base of transistor 3; and $PLO_{n-1}^-$ is coupled to the base of transistor 2n.

The operation of the circuit of FIG. 5 will now be explained. In a first time period having duration T/2n, transistor 1 in both of groups 102 and 103 conducts. Responsive thereto, the current $RF^+$ is steered to the output $OUT^+$, and the current $RF^-$ is steered to the output $OUT^-$. In a second time period having the same duration, transistor 2 in both of groups 102 and 103 conducts. In response thereto, the current $RF^-$ is steered to the output $OUT^+$, and the current $RF^-$ is steered to the output $OUT^-$. In a third time period having the same duration, the current RF⁺ is again steered to the output OUT⁺, and the current RF⁻ is again steered to the output OUT⁻. This alternating progression proceeds with each subsequent time period of duration T/2n within the overall period T of the LO signal until the 2nth such time period is encountered, at which time, the 2nth transistor is groups 102 and 103 conducts. At this time, the current RF⁻ is steered to the output OUT⁺, and the current RF⁺ is steered to the output OUT⁻.

Implementation examples are possible in which the any of the differential mode signals in the foregoing example are single-ended signals, or in which any of the foregoing current mode signals are voltage mode, and vice-versa. Further implementation examples are possible in which the transistors in the mixer core comprise or embody bipolar PNP transistors, MOSFETs, BJTs. CMOS technology, HBTs, HEMTs, MODFETs, diodes, MESFETs, JFETs, or the like. With respect to FIG. 5, implementation examples are also possible in which the groups 102 and 103 are swapped, and in which the odd and even transistors within a group are swapped. Further examples are possible in which the frequency of the components of the preprocessed LO signal is about 1/n times the frequency of the components of the RF signal, and in which this relationship does not hold.

In one configuration, n=2, the LO frequency is about ½ the RF carrier frequency, and the mixer core switches polarity at about twice the LO frequency. This configuration employs what is known as one-half frequency LO injection. In a second configuration, n>2.

Figure 7A:
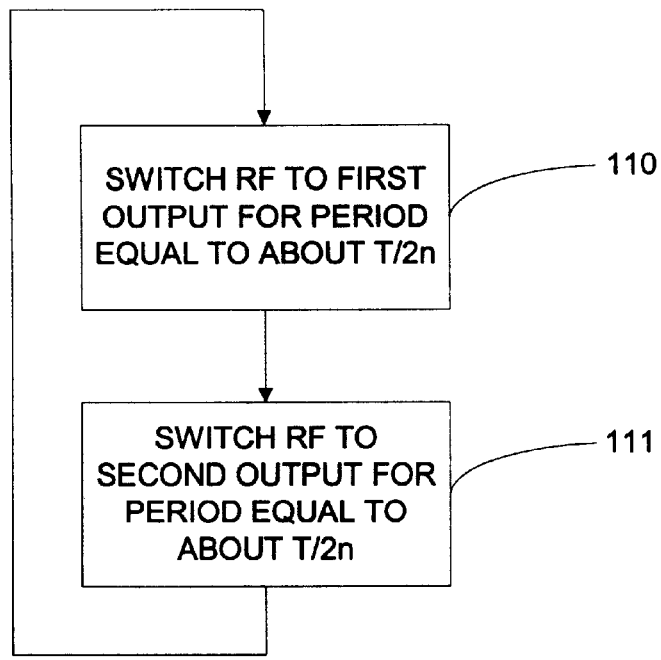
FIGS. 7A–7B illustrate methods of operation of a frequency translator in accordance with the subject invention.
Figure 7B:
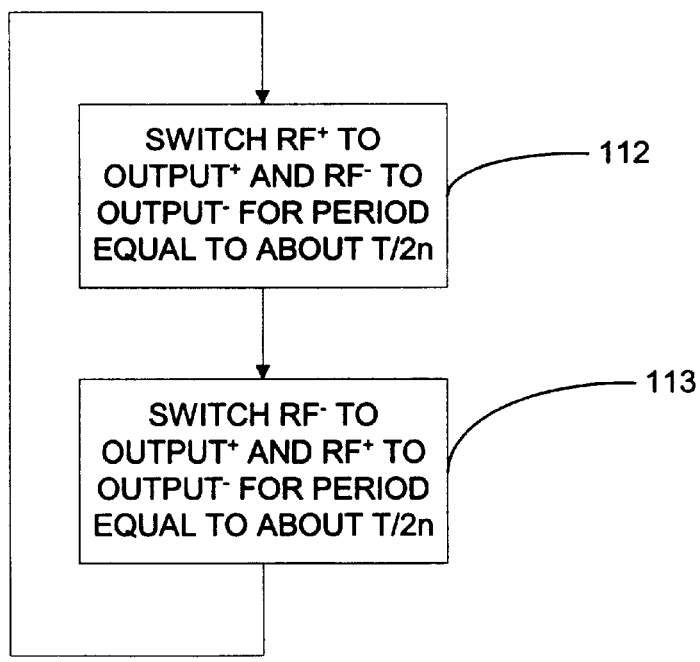

FIGS. 7A–7B illustrates embodiments of methods of operation of the frequency translator of the subject invention. The method illustrated in FIG. 7A comprises alternating the steps in step 110, switching an RF signal to a first output for a period about equal to T/2n, where n is an integer greater than 1, and T is the period of a LO input; and, in step 111, switching the RF signal to a second output for a period about equal to T/2n.

Again, the signals provided on the first and second outputs may be single-ended signals, or components of a differential signal. In addition, the RF input signal may either be a single-ended signal or a component of a differential signal.

The method illustrated in FIG. 7B comprises alternating, at a rate of about 2n/T, where n is an integer greater than 1, and T is the period of an LO input, between steps 112 and 113, wherein step 112 comprises switching RF⁺, the positive phase component of a differential input signal, to a first output OUTPUT⁺, while switching RF⁻, the negative phase component of the differential input signal, to a second output OUTPUT⁻; and wherein step 113 comprises switching RF⁻ to the first output OUTPUT⁺, while switching RF⁺ to the second output OUTPUT⁻.

In the foregoing methods, embodiments are possible in which the components RF⁺ and RF⁻ of the differential mode input signal are single-ended signals, and in which the signals produced on the first and second outputs are either components of a differential output signal or single-ended signals.

The operation in the time domain of an implementation of a multiplier configured in accordance with the subject invention can be explained further with reference to FIGS. 8A–8F. The specific implementation implemented is one in which n=2. FIG. 8A illustrates one component of a sinusoidal phase-split LO signal applied to the second input of the multiplier, and FIG. 8C is an example of a RF signal applied to the first input of the multiplier. As can be seen, the frequency of the LO signal is ½ that of the RF signal.

FIG. 8D illustrates the output signal which appears at the first output OUT⁺ of the multiplier, and FIG. 8E illustrates the output signal which appears at the second output OUT⁻ of the multiplier. FIG. 8F illustrates a combined output signal which is produced by subtracting the signal produced at OUT⁻ from the signal produced at OUT⁺.

FIG. 8B is a multiplication factor which defines the transfer function between the incoming RF signal of FIG. 8C and the combined output signal, illustrated in FIG. 8F. As can be seen, the frequency of the switching action of the multiplication factor is twice that of the LO frequency. The product of the multiplication factor and the RF signal defines the combined output signal of FIG. 8F, which can be seen to include a DC (baseband) component.

Figure 9:
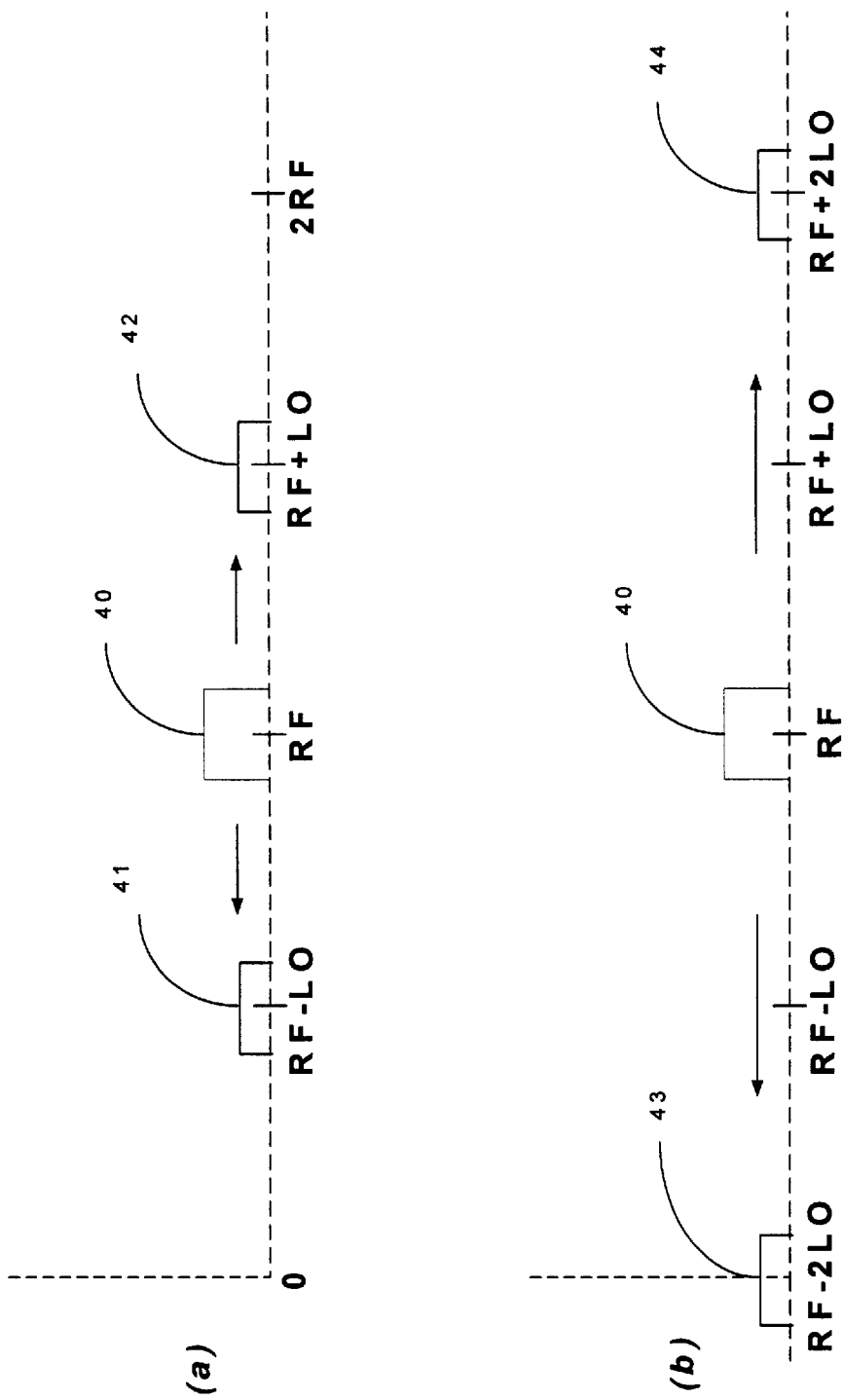
FIGS. 9A–9B illustrate in the frequency domain the switching action of an implementation of a mixer in accordance with the subject invention in which n=2.

The switching action of the frequency translator of the subject invention—in which the baseband component at the output of the frequency translator is a first order frequency component of the output—can be explained further with reference to FIGS. 9A–9B. With reference to FIG. 9A, this figure illustrates the operation in the frequency domain of a conventional mixer, under the assumption that the frequency of the LO input thereof is about ½ that of the RF input, and the switching action of the mixer is maintained at the LO frequency. The incoming RF signal, identified with numeral 40, is split into two first order output components, each having about ½ the energy of the incoming RF signal. The first component, identified with numeral 41, is at a frequency about equal to the LO frequency, or about ½ the RF frequency. The second component, identified with numeral 42, is at a frequency about equal to three times the LO frequency, or about 3/2 the RF frequency. This can be seen from the following mathematical identity:

$$(A \cos 2\pi f_{RF}t) \times (B \cos 2\pi f_{LO}t) = \tfrac{1}{2}AB[\cos 2\pi)f_{RF}-fLO)] + \tfrac{1}{2}AB[\cos 2\pi(f_{RF}+f_{LO})t]$$

The first of the foregoing components is about at the frequency ½$f_{RF}$ or $f_{LO}$, while the second of the foregoing components is about at the frequency 3/2$f_{RF}$ or 3$f_{LO}$. As can be seen, there are no first order components at baseband frequencies.

With reference to FIG. 9B, this figure illustrates the operation in the frequency domain of a frequency translator in accordance with the subject invention, again assuming the LO frequency is about ½ the RF frequency. The frequency translator is configured to provide a switching action at a rate equal to about twice the LO frequency in accordance with one embodiment of the subject invention. The incoming RF signal, which is identified with numeral 40, is split into two first order output components, identified with numerals 43 and 44. The first component, identified with numeral 43, is at baseband frequencies, and the second component, identified with numeral 44, is at about twice the RF frequency, or 2$f_{RF}$. As can be seen, unlike the case with the mixer of FIG. 9A, a first order frequency component at baseband frequencies is provided in the frequency translator of FIG. 9B.

Figure 10A:
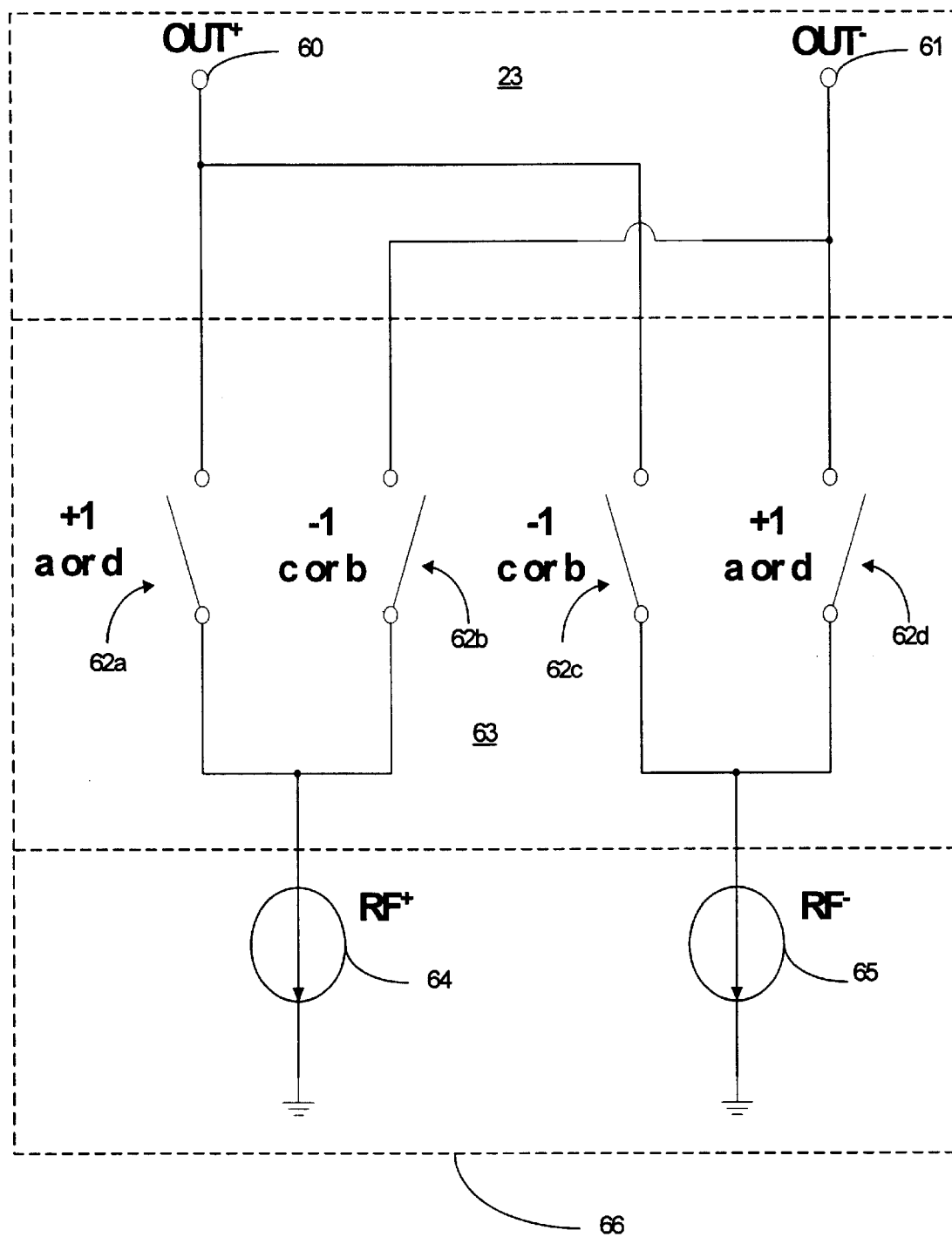
FIG. 10A illustrates in conceptual form an implementation of a mixer in accordance with the subject invention in which n=2.

An implementation of a mixer in accordance with the subject invention in which n=2 is illustrated in FIG. 10A. An input stage 66 provides a differential current mode RF signal. The positive phase component of the differential current mode RF input, RF⁺, is identified with numeral 64, and the negative phase component of the differential current mode RF input, RF⁻, is identified with numeral 65. An output stage 23 provides a differential current mode output, OUT⁺ and OUT⁻, with the positive phase component, OUT⁺, identified with numeral 60, and the negative phase component, OUT⁻, identified with numeral 61.

A current steering mixer core 63 is also illustrated. As illustrated, the mixer core 63 comprises switches 62a, 62b, 62c, and 62d coupled between input stage 66, and output stage 23 in the manner shown.

The switches 62a, 62b, 62c, and 62d are controlled by the signals a, b, c, and d as shown. Each switch is normally open, but is closed when one of the two signals associated with the switch in the figure is asserted. Thus, for example, switch 62a is closed when either of signals a or d is asserted; switch 62b is closed when either of signals c or b is asserted; switch 62c is closed when either of signals c or b is asserted; and switch 62d is closed when either of signals a or d is asserted.

Advantageously, the signals a, b, c, and d are derived from a phase-split output of a local oscillator by a preprocessor in accordance with the subject invention. As illustrated in FIG. 11A, the phase-split output of the local oscillator can be represented by four sinusoidal signals, A1, A2, B1, and B2, which are 90 degrees out of phase with respect to one another. In this example, B1 is shifted by 90 degrees with respect to A1, A2 is shifted by 180 degrees with respect to A1, and B2 is shifted by 270 degrees with respect to A1.

The preprocessor forms the signals a, b, c, and d responsive to the phase-split signals A1, B1, A2, and B2. The signal c is illustrated in FIG. 11B; the signal a in FIG. 11C; the signal d in FIG. 11D; and the signal b in FIG. 11E.

If the period of the phase-split output of the local oscillator of FIG. 11A is divided up into four successive substantially non-overlapping and equal-sized portions, comparing the signals of FIGS. 11B–11E, it will be observed that, within the LO period T, each of these signals is asserted for a subperiod of duration T/4, and during each T/4 subperiod, only one of these signals is asserted at a time. For purposes of this disclosure, a signal is asserted when it is in an on state, that is, a predefined state sufficient to actuate a mixer to reverse polarity. In one implementation, a signal within a group of signals is asserted when it is the highest member of the group. It will also be observed that, in each of these subperiods, a different one of these signals is asserted. In the first subperiod, signal "a" is asserted; in the second portion, the signal "c" is asserted; in the third portion, the signal "d" is asserted; and in the fourth portion, the signal "b" is asserted. It will also be observed that the boundaries between successive assertions are defined by steep and sharp transitions. It will also be observed that each of the signals a, b, c, and d is symmetrical about zero or a DC offset, indicating that the signals lack even harmonics. Avoidance of even harmonics is important is many applications involving RF signals since the presence of even harmonics in such applications can cause spurious and unwanted effects. For example, in a subharmonic mixer employing half-frequency LO injection, the presence of even harmonics on the LO input can introduce an unwanted DC component in the output signal due to self-mixing of the LO input. Avoidance of even harmonics is also important in applications involving differential mode inputs or outputs, since an objective of such applications is avoidance of even harmonics.

The desired characteristics of the signals a, b, c, and d are further illustrated in FIGS. 12A–12H. First, as illustrated in FIGS. 12A–12D, each of these signals achieves the redefined on state in one of the four non-overlapping portions of the LO period indicated, and a different one of the signals is placed in this predefined state at a time. In one implementation, a signal within the group a, b, c, and d is asserted, that is, placed in the on state, when it is the highest member of the group at a time. Second, only one of the signals is asserted in this predefined state at a time. Third, the slope of the signals at the transition points 71 between successive signal assertions, identified by numerals 70 and 72, is sharp and steep. Fourth, it will be observed that each of the signals a, b, c, and d is symmetrical about zero or a DC offset.

With reference to FIG. 10A, when either of switches 62a or 62d is closed, the signal RF$^+$ is provided to OUT$^+$, and the signal RF$^-$ is provided to OUT$^-$. Similarly, when either of switches 62b or 62c is closed, the signal RF$^-$ is provided to OUT$^+$, and the signal RF$^+$ is provided to OUT$^-$. In one implementation, the effect of these actions is to multiply the incoming RF signal by +1, and provide the same to the output, during the periods a and d, and to multiply the incoming RF signal by −1, and provide the same to the output, during the periods c and b.

Figure 10B:
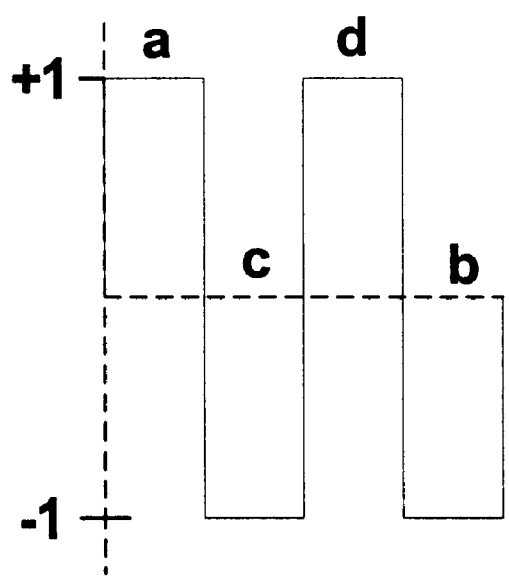
FIG. 10B illustrates the four switching time periods for the mixer implementation of FIG. 10A.

FIG. 10B illustrates the effective multiplication factor which is applied in one implementation to the RF input by the mixer of FIG. 10A over a single period of the LO signal. As can be seen, during the first portion of the cycle, in which the "a" signal is active, the multiplication factor is +1, consistent with the closing of switches 62a and 62d. During the second portion of the cycle, when the "c" signal is active, the multiplication factor is −1, consistent with the closing of switches 62b and 62c. During the third portion of the cycle, when the "d" signal is active, the multiplication factor is +1, consistent with the closing of switches 62a and 62d. Finally, during the fourth portion of the cycle, when the "b" signal output is active, the multiplication factor is −1, consistent with the closing of switches 62b and 62c.

In the foregoing example, it should be understood that the effect of the switching action is to achieve multiplication of the RF input by a multiplication factor, not that a multiplication operation is necessarily physically performed.

Figure 13:
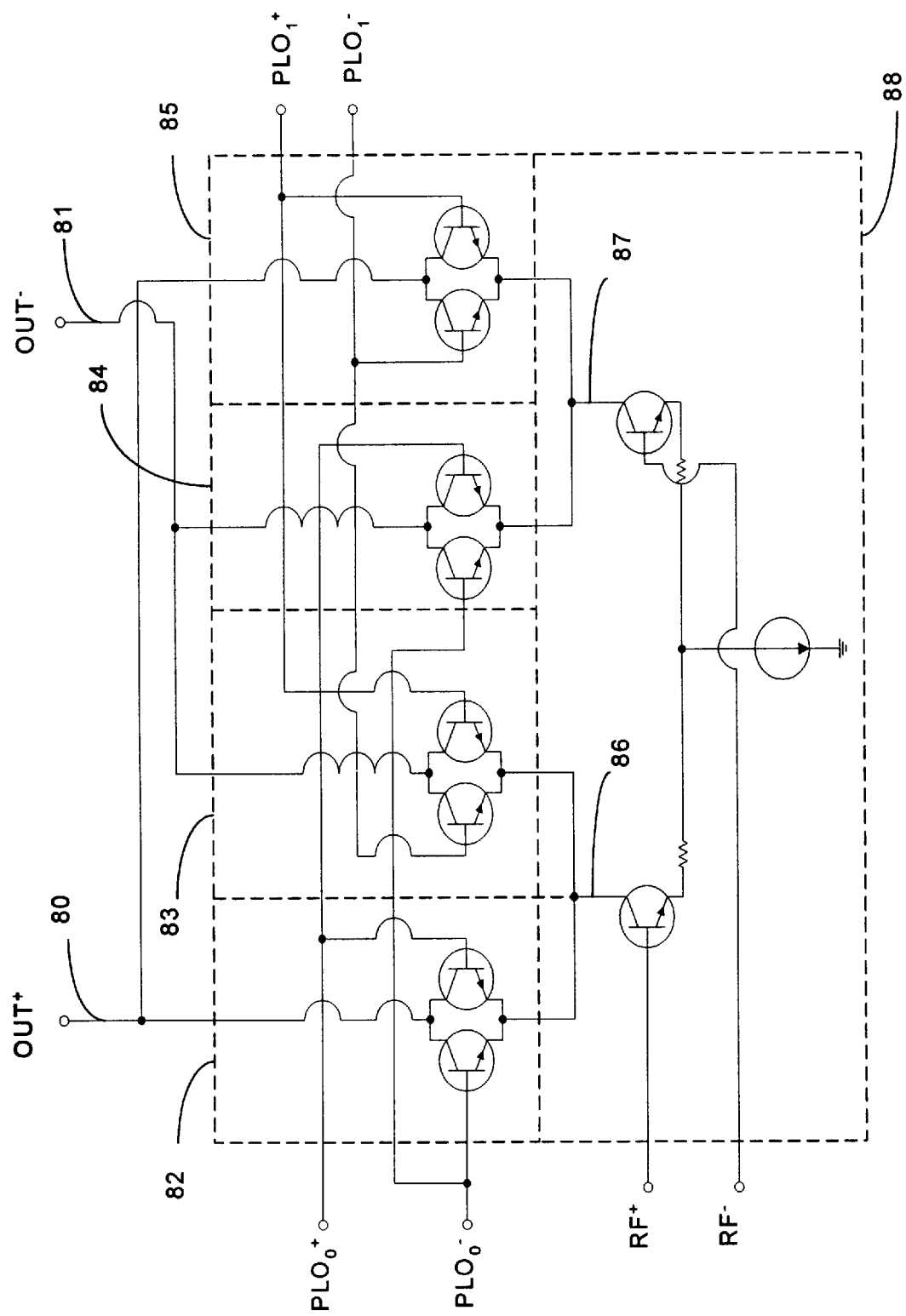
FIG. 13 illustrates an implementation example of a mixer in accordance with the subject invention in which n=2.

FIG. 13 illustrates an implementation example of a mixer of the subject invention in which n=2. The mixer is configured to operate from a differential voltage mode RF input, RF$^+$ and RF$^-$. A differential gm (transconductance) stage 88 is provided to function as a voltage to current converter. As illustrated, this stage comprises a degenerated differential pair which functions to reject the common mode input voltage, and output a differential current to nodes 86 and 87, respectively, with the positive phase portion of the current, IRF$^+$, being applied to node 86, and the negative phase portion of the current, IRF$^-$, being applied to node 87. The gm stage produces a differential current at these nodes which is proportional to the input differential RF input voltage.

Also provided is a current steering mixer core comprising switches 82, 83, 84, and 85 as shown. Each switch comprises, in this implementation, two cross-coupled NPN bipolar transistors. Switches 82 and 84 are configured to close whenever the PLO$_0^+$ or PLO$_0^-$ signals are active, that is, the "a" or "d" signals, and switches 83 and 85 are configured to close whenever the PLO$_1^+$ or PLO$_1^-$ signals are active, that is, the "c" or "b" signals.

Differential current mode outputs 80 and 81 are also provided, with OUT$^+$ identified with numeral 80, and with OUT$^-$ identified with numeral 81. During the times that either the PLO$_0^+$ and PLO$_1^-$ signals are active, i.e., the a and d periods, the current IRF$^+$ is steered to the output OUT$^+$, and the current IRF$^-$ is steered to the output OUT$^-$, and during the times that either the PLO$_1^+$ and PLO$_1^-$ signals are active, i.e., the c and b periods, the current IRF$^-$ is steered to the output OUT$^+$, and the current IRF$^+$ is steered to the output OUT$^-$.

Examples of the waveforms RF$^+$, RF$^-$, PLO$_0^+$, PLO$_0^-$, PLO$_1^+$, PLO$_1^-$, OUT$^+$, and OUT$^-$ are illustrated in FIGS.

14A–14B, respectively. Waveform (1) represents the positive phase portion, RF⁺, of the incoming differential current mode RF input. Waveform (2) represents the negative phase portion, RF⁻, of the incoming differential current mode RF input. Waveform (3) represents the "a" signal, or $PLO_0^+$. Waveform (4) represents the "d" signal, or $PLO_0^-$. Waveform (5) represents the "c" signal, or $PLO_1^+$. Waveform (6) represents the "d" signal, or $PLO_1^-$. Waveform (7) represents the positive phase portion of the output signal, OUT⁺, which results. Waveform (8) represents the negative phase portion of the output signal, OUT⁻, which results.

Figure 6:
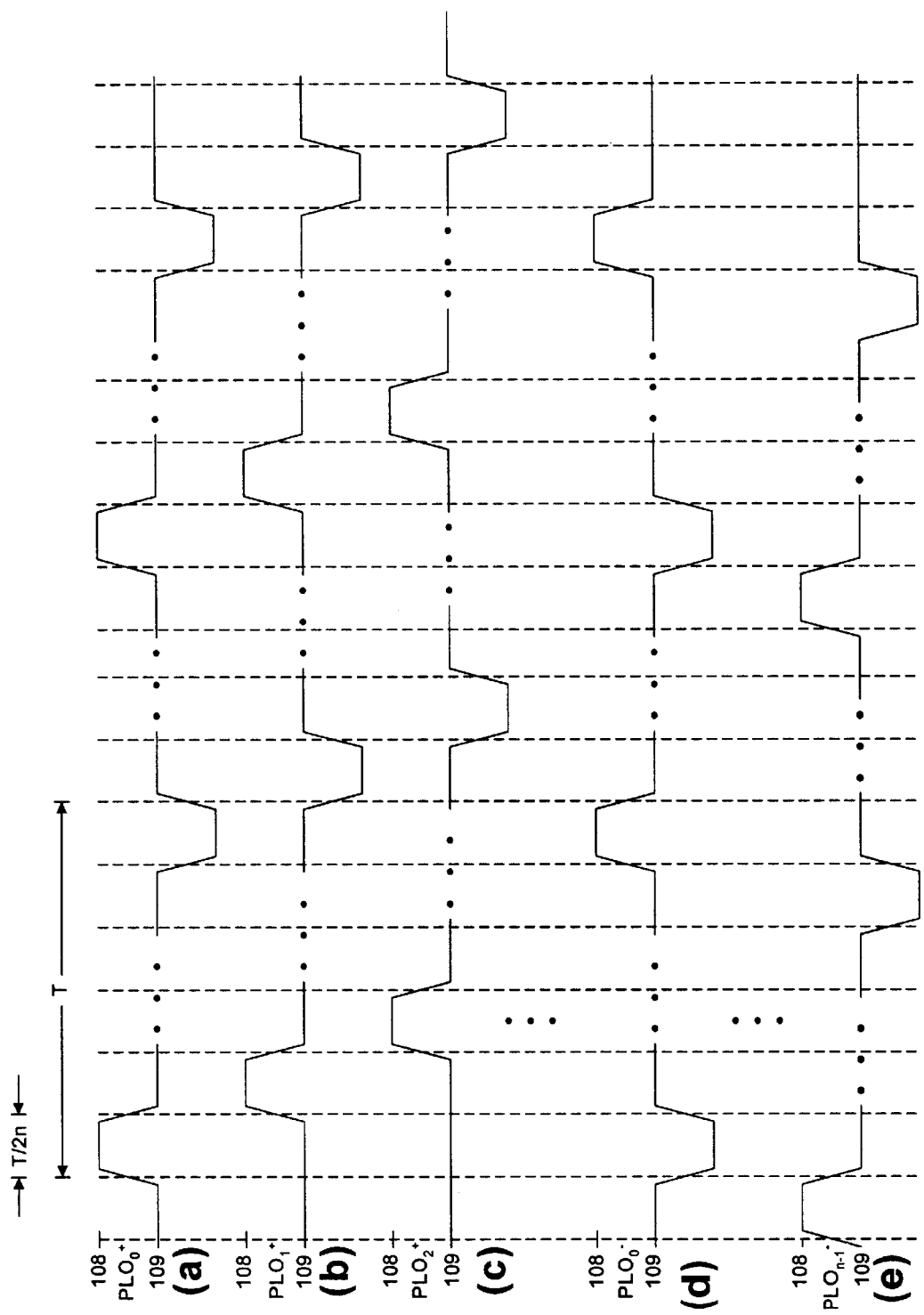
FIGS. 6A–6E illustrate example LO inputs to the mixer implementation of FIG. 5.
Figure 11:
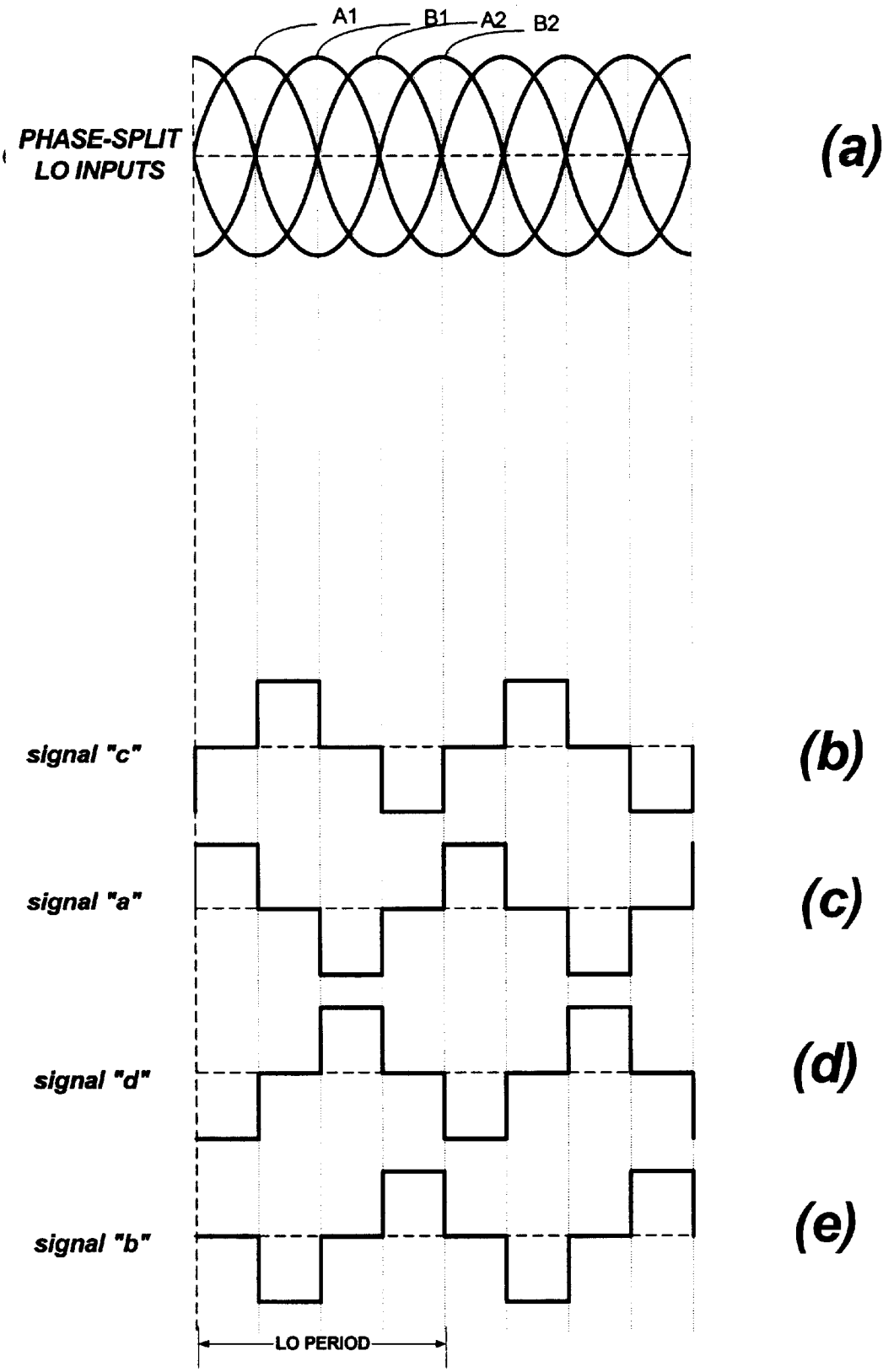
FIGS. 11A–11E and 12A–12H illustrate example LO inputs for an implementation of a mixer in accordance with the subject invention in which n=2.
Figure 12:
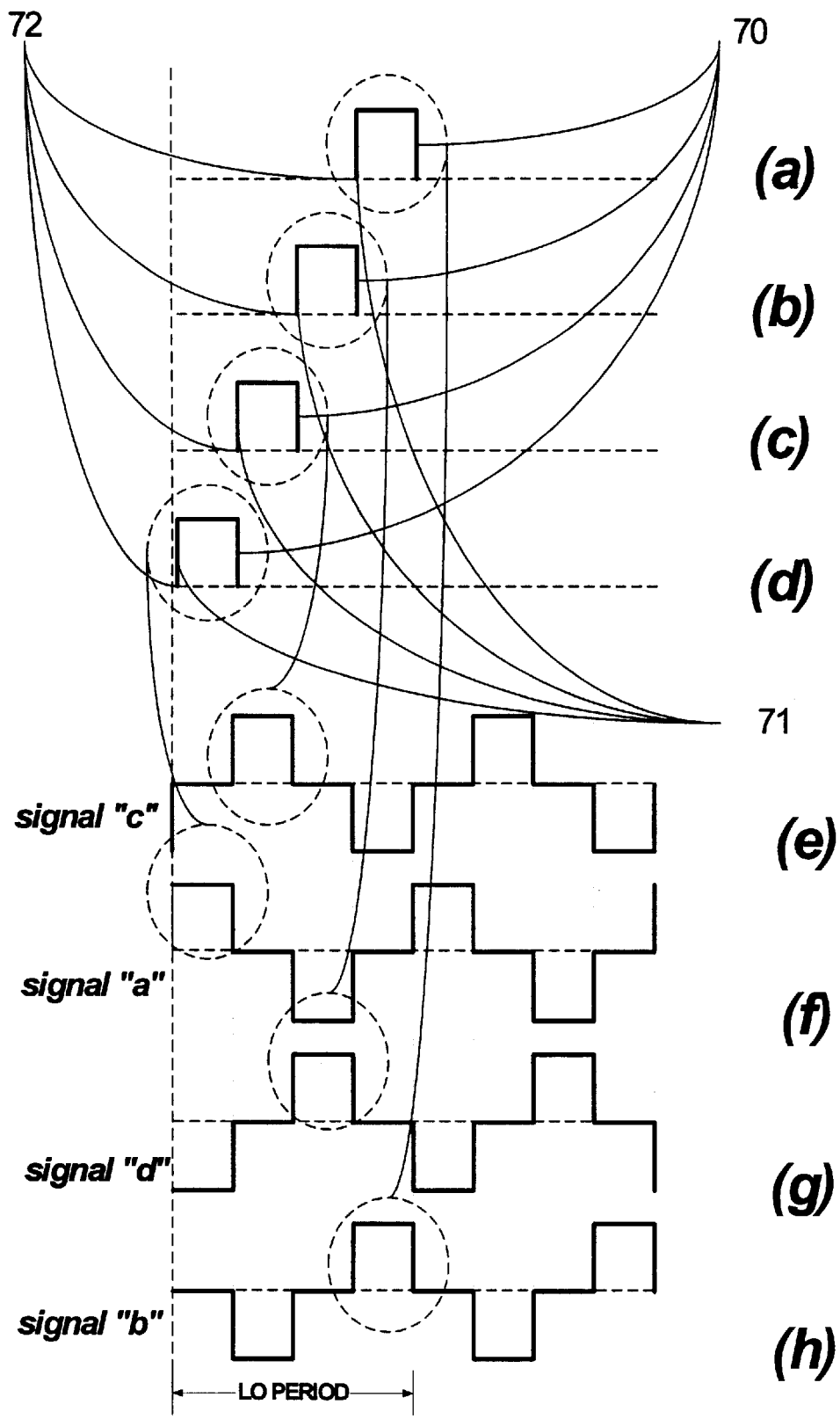
Figure 14A:
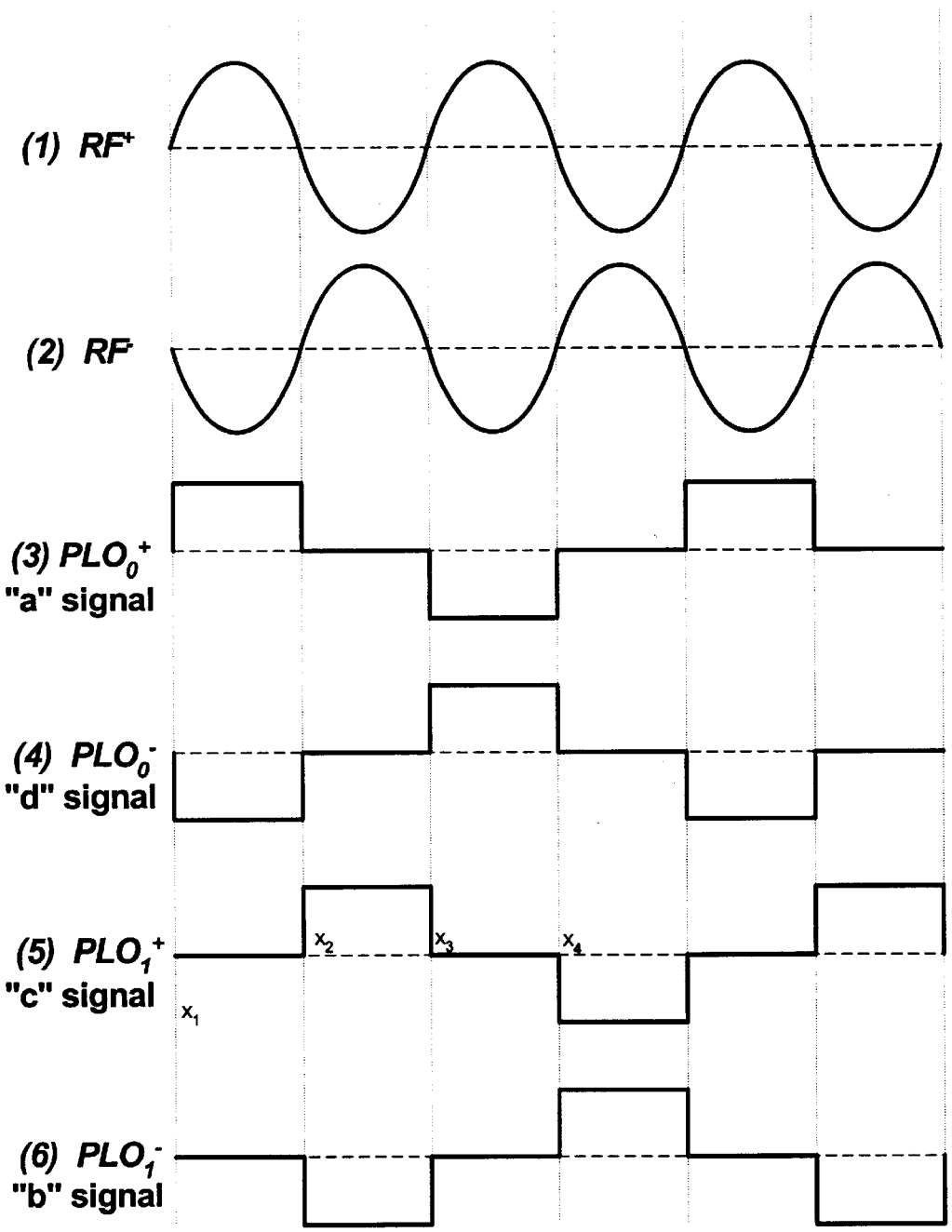

It should be appreciated that the depiction of the signals a, b, c, and d in FIGS. 11, 12, and 14 are idealized in that, in actual implementations, there will be some finite slope to the signal transitions. The signals illustrated in FIG. 6 depict examples of the finite slope transitions that might result in practice.

Figure 15A:
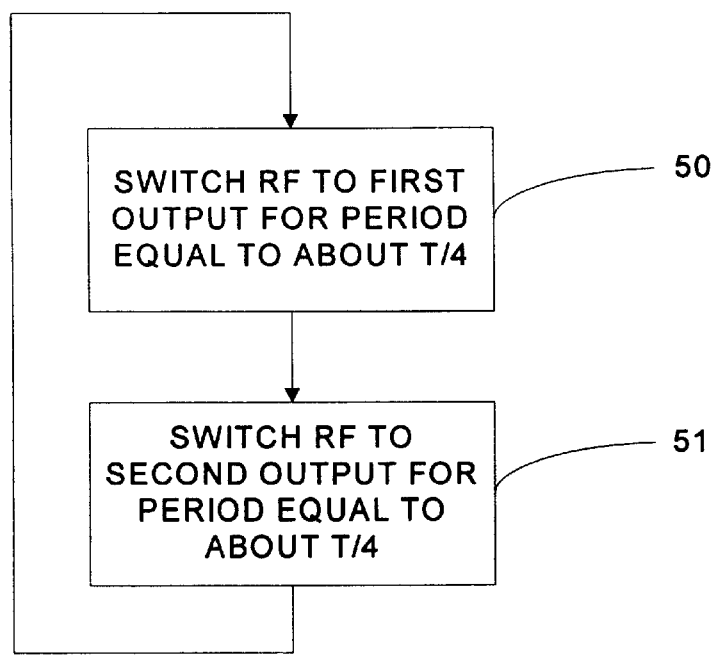
FIGS. 15A–15B illustrate methods of operation of an implementation of the subject invention in which n=2.
Figure 15B:
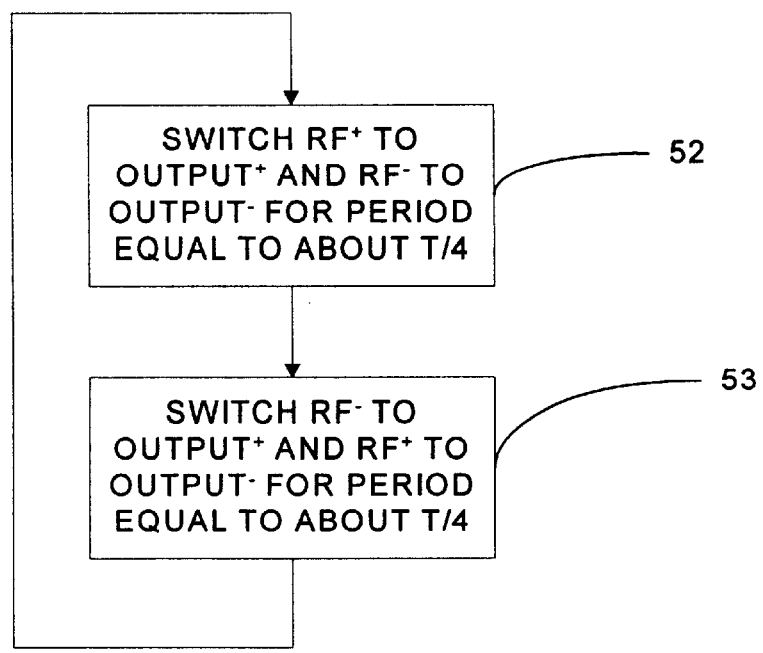

Methods of operation of this implementation of the mixer are illustrated in FIGS. 15A–B. In the method of FIG. 15A, steps 50 and 51 are alternately performed. In step 50, an RF input signal is switched to a first output for a period equal to about T/4, where T is the period of the LO input, and in step 51, the RF input signal is switched to a second output for a period equal to about T/4. Optionally, the signals produced at the two outputs are combined to form a single-ended signal.

Again, the signals produced at the two outputs may be single-ended signals, or may be components of a differential mode signal. In addition, the RF input signal may be a single-ended input signal or a component of a differential mode input signal.

In the method of FIG. 15B, steps 52 and 53 are alternately performed. In step 52, a positive phase component of a differential mode RF input signal, RF⁺, is switched to the positive phase component of a differential mode output, OUTPUT⁺, and the negative phase component of the differential mode input signal, RF⁻, is switched to the negative phase component of the differential mode output, OUTPUT⁻, for a period equal to about T/4, and in step 53, the signal RF⁻ is switched to OUTPUT⁺, and the signal RF⁺ is switched to OUTPUT⁻ for a period equal to about T/4.

Figure 24:
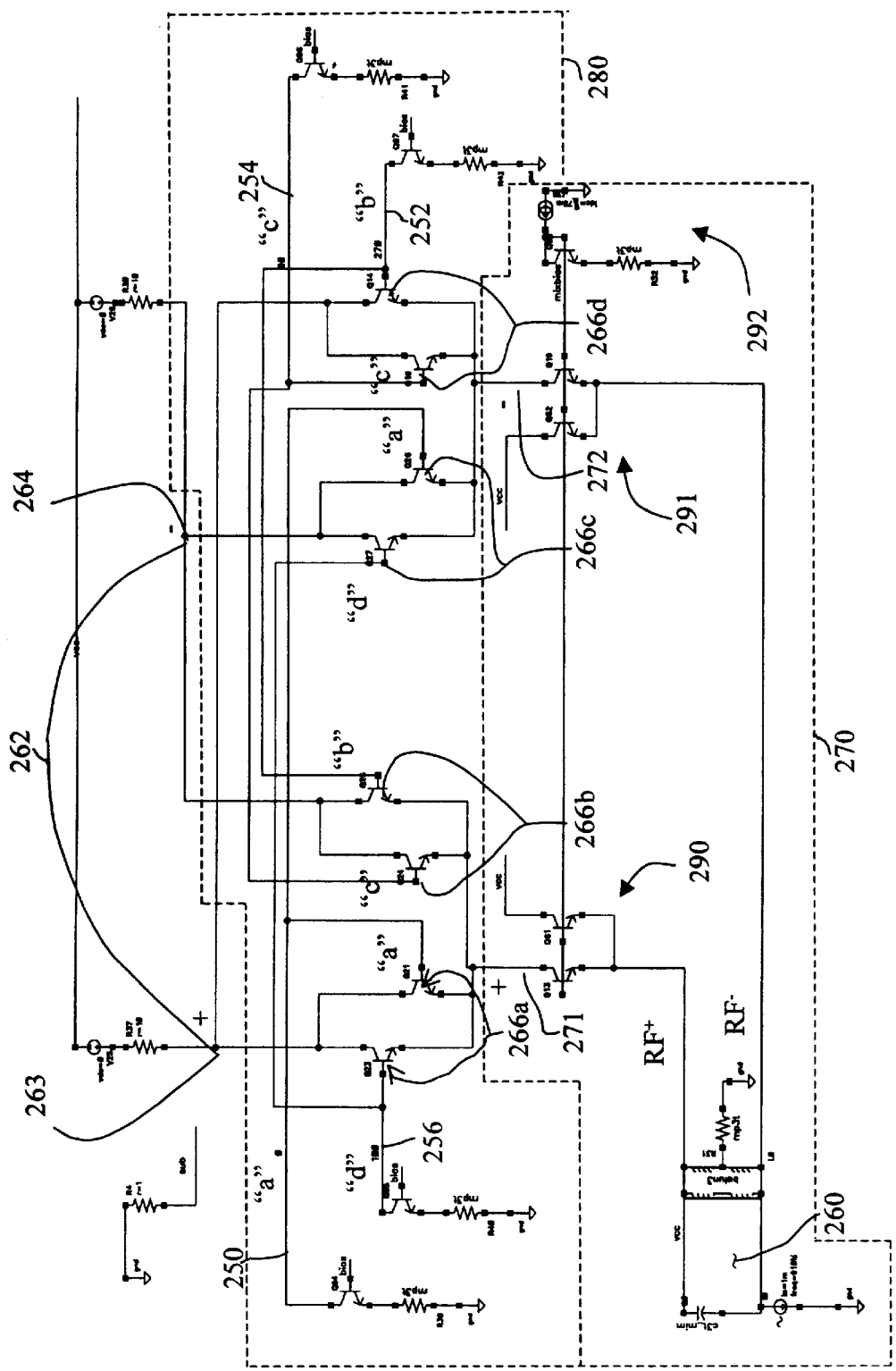
FIG. 24 illustrates a detailed implementation example of a mixer in accordance with the subject invention.

FIG. 24 illustrates a detailed example implementation of a mixer in accordance with the subject invention. As illustrated, the mixer in this implementation comprises an input stage 270, a current steering mixer core 280, and differential output 262. In this implementation, source 260 is a single ended RF input which has been amplified by a low noise amplifier. The amplified signal is passed through a transformer which provides isolation and converts the single-ended signal to a differential current mode signal having positive and negative phase components, RF⁺ and RF⁻. The components of the differential current mode signal are then respectively passed through common base stages 290 and 291. These stages pass the current to nodes 271 and 272, respectively, and increase the impedance to achieve isolation with the input stage. A bias circuit 292 is provided to appropriately bias the common base stages 290 and 291.

The differential RF input current components are then passed to current steering mixer core 280, which, as illustrated, comprises switches 266a, 266b, 266c, and 266d. In this implementation, each of the switches comprises a pair of emitter/collector coupled NPN bipolar transistors. The mixer core receives the differential RF current components as inputs over lines 271 and 272. Its also receives as inputs the four preprocessed signals, that is, the "a", "b", "c", and "d" signals, with the "a" input provided to signal line 250, the "d" signal to signal line 256, the "c" signal to signal line 254, and the "b" signal to signal line 252.

Switches 266a and 266c close when either the "a" or "d" signals are asserted, and switches 266b and 266d close when either the "c" or "b" signals are asserted. In the implementation of FIG. 24, a signal is asserted when it is capable of turning on the transistor to which it is coupled.

The differential output 262 has a positive phase portion, OUT⁺, and a negative phase portion, OUT⁻. The positive portion, OUT⁺, is provided on signal line 263, and the negative portion, OUT⁻, is provided on signal line 264. The mixer core couples the differential RF current inputs on signal lines 271 and 272 to the differential outputs 263 and 264 in the manner shown and described previously.

In operation, the preprocessed signals applied to inputs 250, 252, 254, and 256 are at a frequency which is about ½ the frequency of the incoming signal received at input port 260. The differential RF current output from the gm stage is applied to the mixer core through signal lines 271 and 272. The mixer core provides a switching action at about twice the frequency of the preprocessor outputs provided to inputs 250, 252, 254, and 256. The result is that a differential output signal is provided to output port 262 which is representative of the product of a multiplication factor which switches between +1 and −1 at a rate which is about twice the frequency of the preprocessor outputs, and the differential RF signal provided on signal lines 271 and 272. In short, the modified Gilbert mixer accomplishes sub-harmonic mixing by using a limiter structure (to form the preprocessed signals) and a double-balanced mixer, including a gm-state with a cross-coupled current steering mixer core. In particular, the circuit advantageously uses a pair of bipolar transistors to steer current at about twice the frequency of the local oscillator. It should be appreciated, however, that in lieu of bipolar technology, MOS, CMOS, BJT, HBT, HEMT, MODFET, diode, MESFET, or JFET technology or the like can be used depending on the application. It should also be appreciated that the input stage 270 is entirely optional, as is the input stage 88 in FIG. 13, and can be eliminated or altered in a particular application.

The defining characteristics of this detailed implementation are considered to be a mixer core which receives differential RF current inputs, a mixer core which effectively switches at about twice the LO frequency, and the generation of an output signal which is representative of the product of a multiplication factor, which switches at about twice the LO frequency, and the RF differential input current, all without substantially generating a signal at twice the LO frequency at a pin or node.

The signals a, b, c, and d applied respectively to inputs 250, 252, 254, and 256 are advantageously the preprocessed signals previously described and illustrated in FIGS. 11, 12, and 14.

The advantages of a direct conversion receiver in accordance with the subject invention include greater sensitivity compared to a conventional direct conversion receiver, lower LO frequency, reduced LO to RF coupling, and therefore ease of design.

The advantages of a subharmonic mixer in accordance with the subject invention, compared to a conventional subharmonic mixer, include reduction in the unwanted DC component in the output signal caused by self-mixing of the LO or RF input signals. Leakage from the LO to the RF ports is at the actual LO frequency, while the frequency of the original LO signal is effectively increased n times due to the switching action of the mixer. The result is that unwanted mixing will occur between a signal at the LO frequency, and a signal at about n times the LO frequency. Since the two are substantially different, little or no baseband components will result.

Leakage from the RF to the LO ports, which is nominally at the RF frequency, is effectively increased in frequency n times due to the switching action of the mixer. The frequency of the original RF signal remains the same, however. The result is that unwanted mixing will occur between a signal at the RF frequency, and a signal at about n times the RF frequency. Again, since the two are substantially different, little or no baseband component will occur.

Still another advantage is on-chip manufacturability given that, in one embodiment, all the components of the mixer core are transistors, and transistors are easily implementable on-chip.

Yet another advantage, compared to conventional subharmonic mixers, is a more linear RF transfer function given that, through the switching action of the mixer, the RF$^+$ and RF$^-$ currents are alternatively steered directly to the outputs of the mixer.

Finally, yet another advantage of the mixer of the subject invention is that, because it is similar in topology to a Gilbert mixer, a great deal of pre-existing experience can be brought to bear, thus speeding design.

3. Preprocessor

Figure 18A:
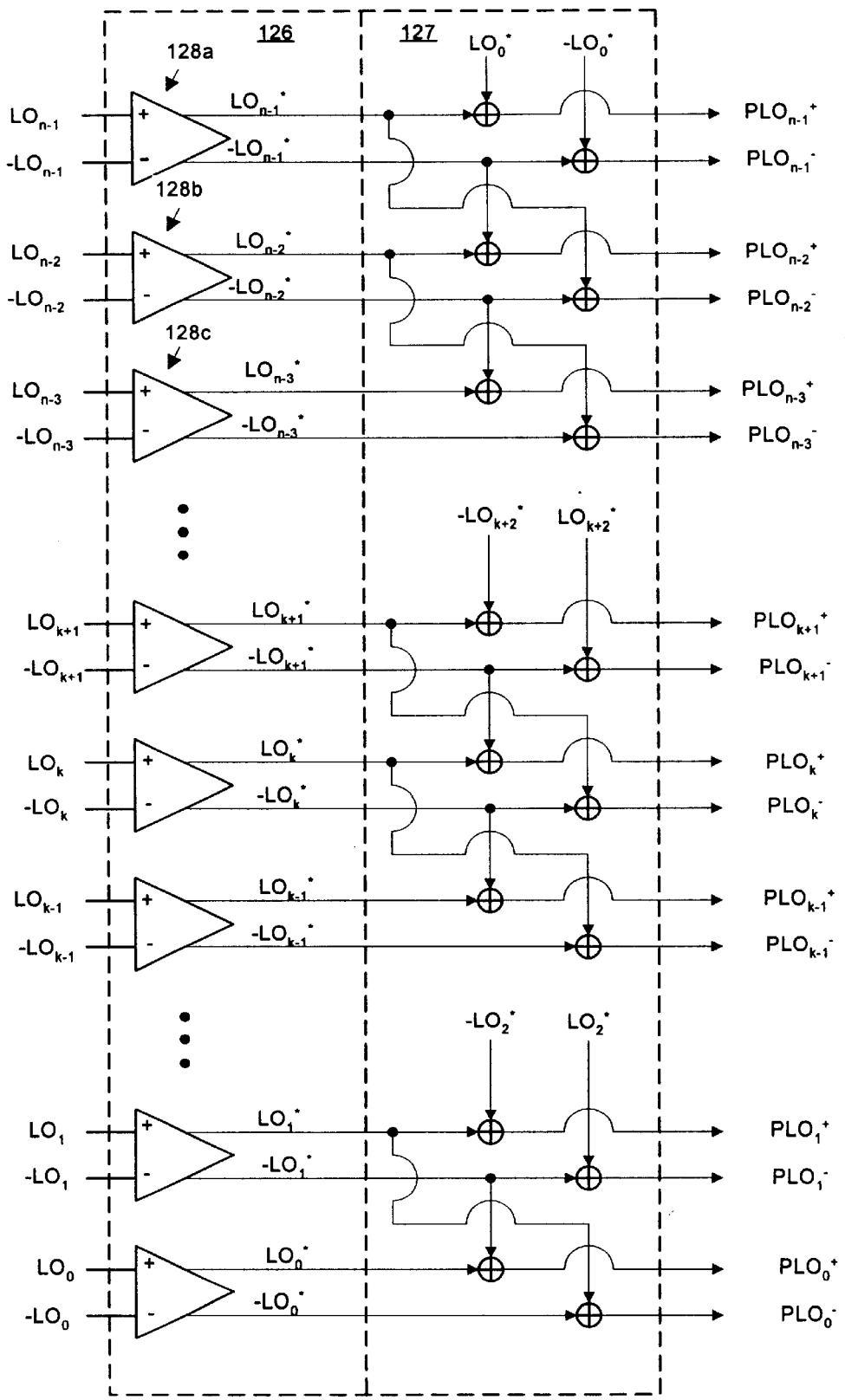
FIGS. 18A–18D illustrate embodiments of the preprocessor of the subject invention.

An embodiment of a preprocessor in accordance with the subject invention is illustrated in FIG. 18A. As illustrated, the preprocessor comprises limiter circuitry 126 and arithmetic circuitry 125. The preprocessor receives a 180/n degree phase-split LO signal, wherein n is an integer greater than 1, and produces a preprocessed 180/n degree phase-split LO signal which has improved switching characteristics in relation to the input signal.

Figure 26:
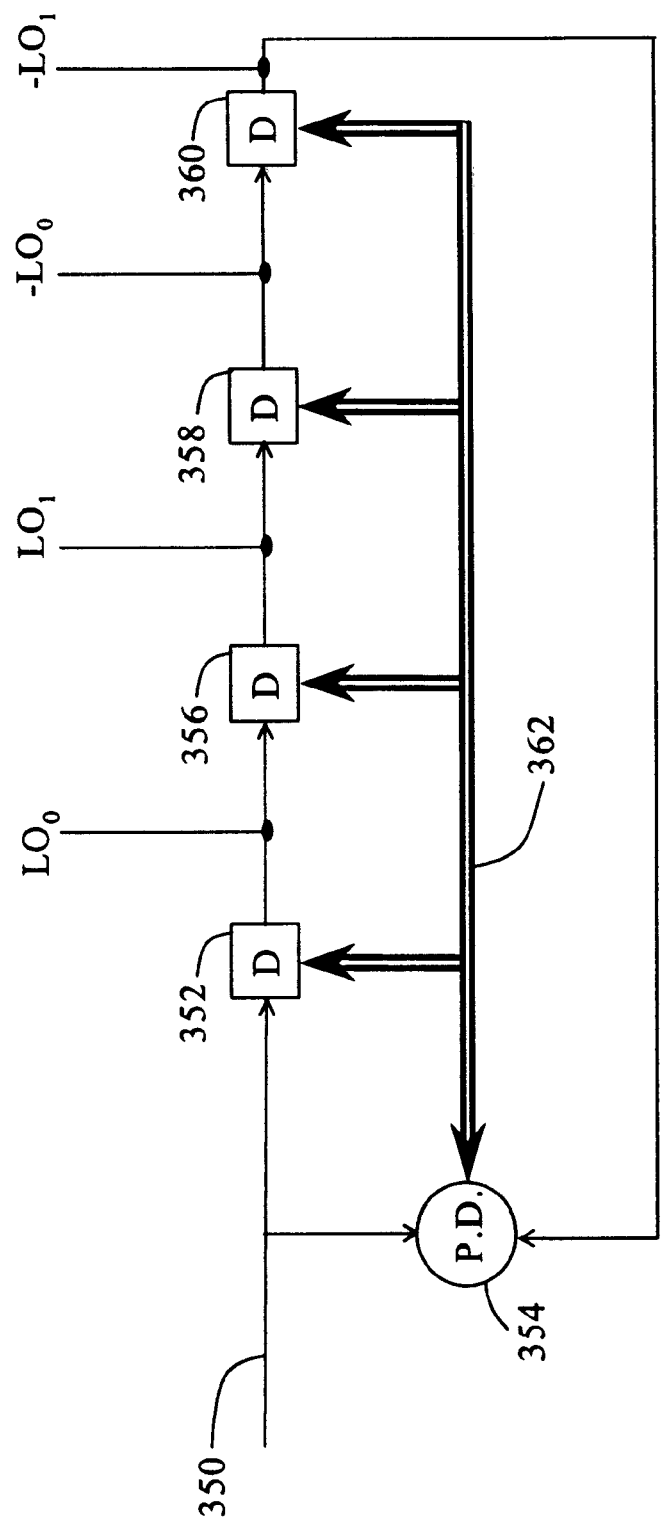
FIG. 26 illustrates a conventional LO oscillator configured to provide a phase-split sinusoidal LO signal.

In one embodiment, the input signal is a phase-split sinusoidal signal. However, it should be appreciated that other types of signals, such as square waves, ramps, sawtooth waveforms, or the like, are possible. FIG. 26 illustrates one example of a local oscillator configured to generate a 90° phase-split sinusoidal signal.

As illustrated, an input line 350 connects to a first delay module 352, and a phase detector 354. First delay module 352 connects to delay module 356, delay module 356 connects to delay module 358, and delay module 358 connects to delay module 360 in serial fashion as shown. In one embodiment, each delay module is a programmable delay element. The phase detector 354 connects to each delay 352, 356, 358, 360 over respective ones of data lines 362.

Phase detector 354 also connects to the output of delay module 360. Finally, a tap $LO_0$, $LO_1$, $-LO_0$, and $-LO_1$ connects to the local oscillator intermediate each delay and after delay 360.

In operation, a sine wave signal is provided on an input 350 to delay 352 and phase detector 354. The phase detector detects the phase of the received sine wave in relation to the signals output from each of the delay modules 352, 356, 358, and 360. The delays in each of the modules 352, 356, 358, and 360 are adjusted until the phase between the incoming signal on line 350, and the outputs of each of the modules, is 0. At this point, each of the signals output on taps $LO_0$, $LO_1$, $-LO_0$, and $-LO_1$ will be 90° out of phase with respect to the adjacent signal. The signals at these taps correspond to the signals A1, B1, A2, and B2 illustrated in FIG. 11A. It should be appreciated that the LO circuit depicted in FIG. 26 can easily be extended to the case in which a 180/n degree phase-split LO signal is desired.

With reference to FIG. 18A, the components of the 180/n phase split input signal are identified as $LO_0, LO_1, \ldots L_{n-1}$, $-LO_0, -LO_1 \ldots -LO_{n-1}$. As should be appreciated, there are 2n such components, which can either be 2n single-ended components, or n differential components. However, to be consistent with the previous discussions, both cases will be referred to in terms of 2n components, it being understood that, in the differential case, the 2n components form n differential signals, each of which comprises positive and negative phase components, both of which are one of the 2n components.

With reference to the terminology $LO_0, LO_1, \ldots LO_{n-1}$, $-LO_0, -LO_1, \ldots -LO_{n-1}$ used to refer to the components, the subscript, which ranges from 0 to n-1, refers to one of n differential mode signals, and the sign of the component indicates whether it is a positive or negative phase component of the differential mode signal, with a positive sign assumed, and a negative sign, if present, indicating a negative phase component of the differential signal.

The limiter circuitry 126 limits the input signal to produce a phase-split limited signal. In one implementation, the limiter circuitry limits each component of the input signal by amplifying and then clipping it to form a square wave. The arithmetic circuitry 127 receives the phase-split limited signal, and responsive thereto, arithmetically combines the components thereof to produce a phase-split output signal.

In one embodiment, the phase-split limited signal is a 180/n phase-split signal, the 2n components of which are identified as $LO_0{}^*, LO_1{}^*, \ldots LO_{n-1}{}^*, -LO_0{}^*, -LO_1{}^*, \ldots -LO_{n-1}{}^*$. As will be appreciated, this is essentially the same nomenclature discussed previously in relation to the input components, the only difference being that a superscipt * has been added to distinguish these limited components from the input components. Again, it should be appreciated that these 2n components can either be 2n single-ended signals, or n differential signals, and that the 2n terminology will be used in both cases to maintain consistency with the previous discussions, it being understood that, in the differential case, there will be n differential signals, each having positive and negative phase components, both of which are one of the 2n components.

In this embodiment, the output signal is similarly a 180/n phase-split signal, the 2n components of which are identified as $PLO_0{}^+, PLO_1{}^+, \ldots PLO_{n-1}{}^+, PLO_0{}^-, PLO_1{}^-, \ldots PLO_{n-1}{}^-$. Again, it should be appreciated that these 2n components can either be 2n single-ended components, or n differential components, and that the 2n terminology will be used to refer to the components in both cases to maintain consistency with the previous discussions.

With respect to the nomenclature $PLO_0{}^+, PLO_1{}^+, \ldots PLO_{n-1}{}^+, PLO_0{}^-, PLO_1{}^-, \ldots PLO_{n-1}{}^-$ used to refer to the components of the output signal, the subscript indicates one of n differential signals ranging from 0 to n-1, and the superscipt, either + or −, indicates, respectively, whether the component is the positive or the negative phase component of the differential signal.

In one implementation, illustrated in FIG. 18A, the limiter circuitry comprises a plurality of differential comparators 128a, 128b, 128b, each of which receives as an input a component $LO_j$ of the input signal, and its inverse $-LO_j$, and, responsive thereto, outputs two signals, $LO_j{}^*$ and $-LO_j{}^*$ where j ranges from 0 to n-1. The signal $LO_j{}^*$ is a limited version of the signal $LO_j$, and the signal $-LO_j{}^*$ is a limited version of the signal $-LO_j$. Both of these output signals are components of the limited phase-split output signal produced by the limiter circuitry.

Each of the differential comparators is configured to assert one of its outputs when the corresponding input signal exceeds its inverse. However, it should be appreciated that embodiments are possible in which the output is asserted when the corresponding input equals or exceeds its inverse, or in which the output is asserted when the corresponding input is falls below, or equals or falls below, its inverse. It should also be appreciated that assertion of a signal may, depending on the circumstances, mean placing the signal in a high state or a low state.

Figure 19A:
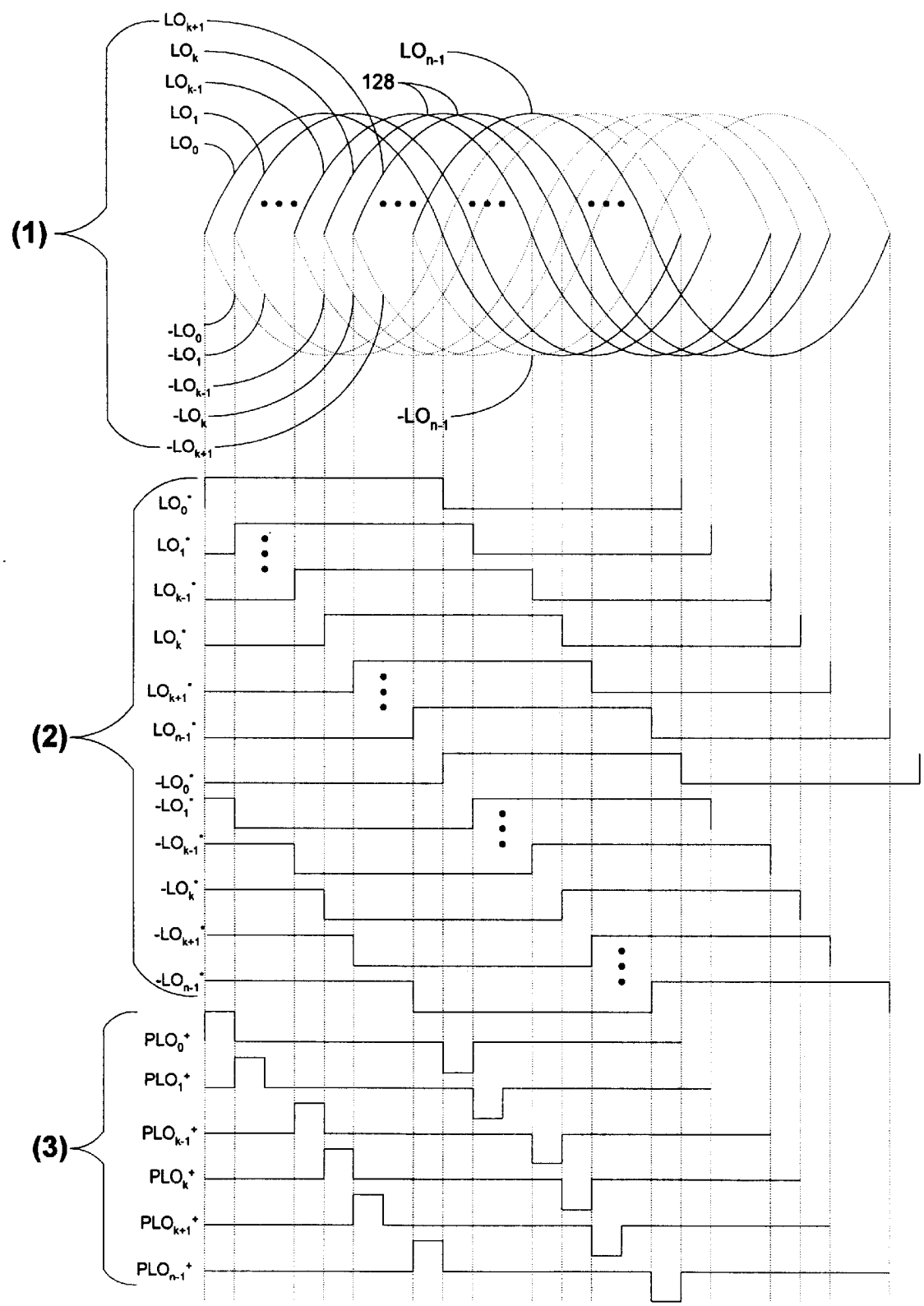
FIGS. 19A–19B illustrates example waveforms illustrating operation of the preprocessor embodiments of FIGS. 18A–18D.
Figure 19B:
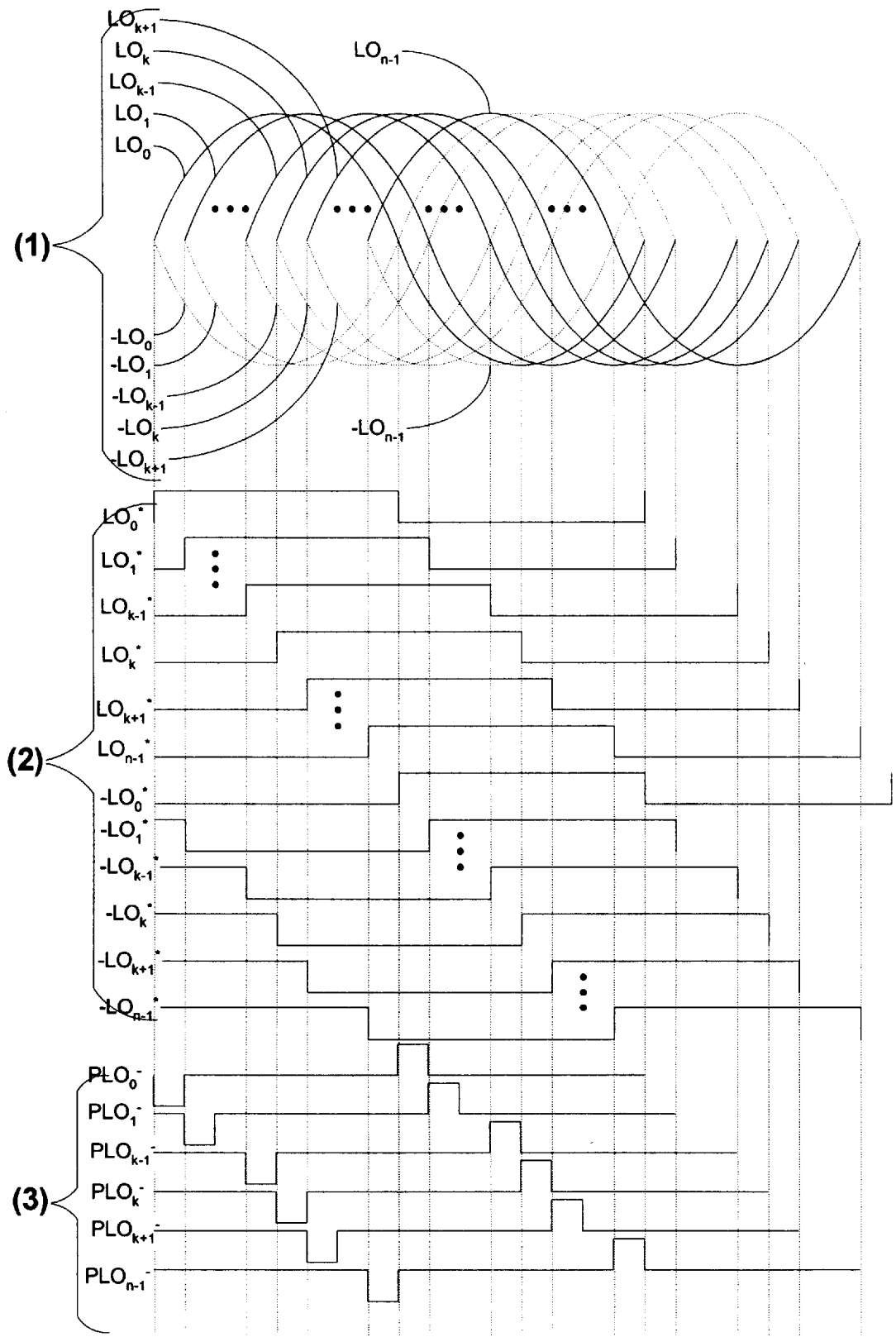

FIGS. 19A–19B are example waveforms which further illustrate operation of this implementation of the limiter circuitry. These figures are identical except that FIG. 19A(3) illustrates $PLO_0^+$, $PLO_1^+$, ... $PLO_{n-1}^+$, while FIG. 19B(3) illustrates $PLO_0^-$, $PLO_1^-$, ... $PLO_{n-1}^-$.

FIG. 19A(1) illustrates the components of an example phase-split input to the limiter circuitry. The components $LO_0$, $LO_1$, $LO_{k-1}$, $LO_k$, $LO_{k+1}$, $LO_{n-1}$, $LO_0$, $-LO_1$, $-LO_{k-1}$, $-LO_k$, $-LO_{k+1}$, and $-LO_{n-1}$ are specifically illustrated. These components are reproduced in FIG. 19B(1).

FIG. 19A(2) illustrates components of the limited phase-split output signal produced by the limiter circuitry. The components , $LO_1^*$, $LO_{k-1}^*$, $LO_k^*$, $LO_{k+1}^*$, $LO_{n-1}^*$, $-LO_0^*$, $-LO_1^*$, $-LO_{k-1}^*$, $-LO_k^*$, $-LO_{k+1}^*$, $-LO_{n-1}^*$ are specifically illustrated, with $LO_0^*$ representing a limited version of $LO_0$, $LO_1^*$ representing a limited version of $LO_1$, $LO_{k-1}^*$ representing a limited version of $LO_{k-1}$, $LO_k^*$ representing a limited version of $LO_k$, $LO_{k+1}^*$ representing a limited version of $LO_{k+1}$, $LO_{n-1}^*$ representing a limited version of $LO_{n-1}$, $-LO_0^*$ representing a limited version of $-LO_0$, $-LO_1^*$ representing a limited version of $-LO_k$, $-LO_{k+}^*$ representing a limited version of $-LO_{k+1}^*$, $-LO_{k+1}^*$ representing a limited version of $-LO_k^*$, $-LO_{k+1}^*$ representing a limited version of $-LO_{k+1}$, and $-LO_{n-1}^*$, representing a limited version of $-LO_{n-1}$. These components are reproduced in FIG. 19B(2).

As can be seen, each of the limited components in this example is a square wave which is asserted in a logical high state when the corresponding sinusoidal input signal is greater than its inverse, an intermediate state when the two are equal, and which is placed in a logical low state when the corresponding input component is less than its inverse. Thus, for example, $LO_0^*$ is high when $LO_0$ is greater than $-LO_0$, -and is low when $LO_0$ is less than $-LO_0$.

With reference to FIG. 18A, the limited components are input to arithmetic circuitry 127, which arithmetically combines these signals to form the preprocessed output signal. In one implementation, shown in FIG. 18A, each component of the preprocessed output signal is formed from and corresponds to a component of the limited signal. In this implementation, an output component is formed by adding, to the corresponding limited component, the inverse of the next successive phase-lagged limited component. For example, with reference to FIG. 18A, the output component $PLO_k^+$ is formed by adding $-LO_{k+1}^*$ to $LO_k^*$. Similarly, the output component $PLO_{n-3}^-$ is formed by adding $LO_{n-2}^*$ to $-LO_{n-3}^*$. As another example, the output component $PLO_{n-1}^*$ is formed by adding $LO_0^*$ to $LO_{n-1}^*$.

Since addition of the inverse of a phase-lagged component is equivalent to subtraction of the phase-lagged component, the foregoing operation is logically equivalent to forming an output component by subtracting from the corresponding limited component the next successive phase-lagged limited component. Thus, with reference to FIG. 19A, $PLO_0^+$ is formed by subtracting $LO_1^*$ from $LO_0^*$, or equivalently, adding $-LO_1^*$ to $LO_0^*$, $PLO_1^+$ is formed by subtracting $LO_2^*$ from $LO_1^*$, or equivalently, adding $-LO_2^*$ to $LO_1^*$, $PLO_{k-1}^+$ is formed by subtracting $LO_k^*$ from $LO_{k-1}^*$, or equivalently, adding $-LO_k^*$ to $LO_{k-1}^*$, $PLO_k^+$ is formed by subtracting $LO_{k+1}^*$ from $LO_k^*$, or equivalently, by adding $-LO_{k+1}^*$ to $LO_k^*$, $PLO_{k+}^+$ is formed by subtracting $LO_k^*$ from $LO_{k+1}^*$, or equivalently, adding $-LO_k^*$ to $LO_{k+1}^*$, and $PLO_{n-1}^+$ is formed by subtracting $-LO_0^*$ from $LO_{n-1}^*$, or equivalently, adding $LO_0^*$ to $LO_{n-1}^*$. Similarly, with reference to FIG. 19B(3), $PLO_0^-$ is formed by subtracting $-LO_1^*$ from $-LO_0^*$, or equivalently, adding $LO_1^*$ to $-LO_0^*$, $PLO_1^-$ is formed by subtracting $-LO_2^*$ from $-LO_1^*$, or equivalently, adding $LO_2^*$ to $-LO_1^*$, $PLO_{k-1}^-$ is formed by subtracting $-LO_k^*$ from $-LO_{k-1}^*$, or equivalently, adding $LO_k^*$ to $-LO_{k-1}^*$, $PLO_k^-$ is formed by subtracting $-LO_{k+1}^*$ from $-LO_k^*$, or equivalently, by adding $LO_{k+1}^*$ to $-LO_k^*$, $PLO_{k+1}^-$ is formed by subtracting $-LO_k^*$ from $-LO_{k+1}^*$, or equivalently, adding $LO_k^*$ to $-LO_{k+1}^*$, and $PLO_{n-1}^-$ is formed by subtracting $LO_0^*$ from $-LO_{n-1}^*$, or equivalently, adding $-LO_0^*$ to $-LO_{n-1}^*$.

The components $PLO_0^+$, $PLO_1^+$, ... $PLO_{k-1}^+$, $PLO_k^+$, $PLO_{k+1}^+$, ... $PLO_{n-1}^+$, $PLO_0^-$, $PLO_1^-$, ... $PLO_{k-1}^-$, $PLO_{k+1}^-$, $PLO_{k+}^-$, ... $PLO_{n-1}^-$ of the preprocessed signal shown in FIGS. 19A–19B have improved switching characteristics compared to the components $LO_0$, $LO_1$, ... $LO_{k-1}$, $LO_k$, $LO_{k+1}$, ... $LO_{n-1}$, $-LO_0$, $-LO_1$, ... $-LO_{k-1}$, $-LO_k$, $-LO_{k-1}$, ... $-LO_{n-1}$ of the local oscillator output also shown in those figures. More specifically, they have steeper transitions between the on and off states thereof. Second, only one such component is clearly in the on state at a time.

Third, the transitions between the on and off states represented thereby are defined by zero crossings of the waveforms $LO_0^*$, $LO_1^*$, ... $LO_{k-1}^*$, $LO_k^*$, $LO_{k+1}^*$, ... $LO_{n-1}^*$, $LO_0^*$, $-LO_1$, ... $-LO_{k-}^*$, $-LO_k^*$, $-LO_{k+1}^*$, ... $-LO_{kn-1}$. That removes the sensitivity to amplitude mismatch that is present when the signals $LO_0$, $LO_1$, ... $LO_{k-1}$, $LO_k$, $LO_{k+1}$, ... $LO_{n-1}$, $-LO_0$, $-LO_1$, ... $-LO_{k-1}$, $-LO_k$, $-LO_{k+1}$, ... $-LO_{n-1}$ are used to directly drive the switching action in the mixer. This problem is shown most readily in FIG. 19A(1), in which numeral 128 identifies the crossover points respectively between signals $LO_{k-1}$, $LO_k$, and $LO_{k+1}$. These points define the intended on state for $LO_k$. As can be seen, the duration of this on state is highly dependent on the relative amplitudes of the signals $LO_{k-1}$, $LO_k$, and $LO_{k+1}$. In contrast, it will be observed that the on state for the corresponding preprocessed component, $PLO_k^+$, is not dependent at all on the relative amplitudes of the signals from which it is derived, $LO_k^*$ and $LO_{k+1}^*$, only the zero crossings of these signals.

Another desirable attribute of the signals $PLO_0^+$, $PLO_1^+$, ... $PLO_{k+1}^+$, $PLO_k^+$, $PLO_{k+1}^+$, ... $PLO_{n-1}^+$, $PLO_0^-$, $PLO_1^-$, ... $PLO_{k-1}^-$, $PLO_k^-$, $PLO_{k+1}^-$, ... $PLO_{n-1}$ is that each is symmetric about a horizontal axis. Such symmetry ensures that the signal components lack even harmonics, and even harmonics are undesirable in applications involving half LO injection, since even harmonics can result in self-mixing of the RF or LO inputs, and introduction of an unwanted DC component into the output signal. (In applications involving an LO frequency which is 1/n times the RF frequency, it might be useful to avoid harmonics of degree n in the preprocessed components.) Even harmonics are also undesirable in applications involving differential inputs or outputs since the objective of using differential inputs or outputs is to avoid even harmonics.

Figure 18B:
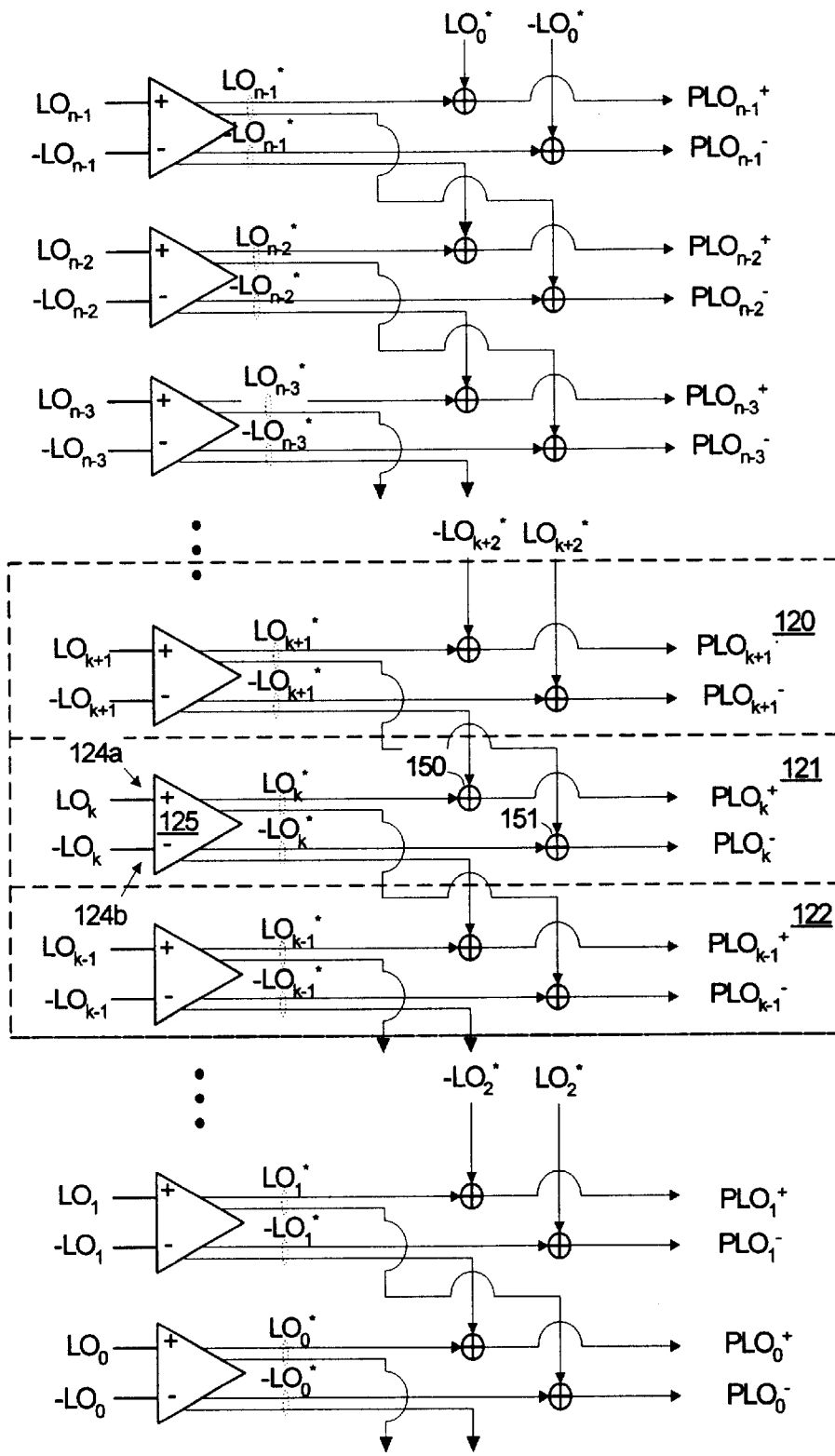

A second embodiment of a preprocessor in accordance with the subject invention is illustrated in FIG. 18B. This embodiment is identical to the previous embodiment of FIG. 18A except that the differential comparators of FIG. 18A, depicted as having two voltage mode outputs, $LO_j$ * and $-LO_j$ *, are replaced with differential comparators having four current mode outputs, wherein two of the outputs bear the current $LO_j$ *, and two bear of the current $-LO_j^*$.

Figure 18C:
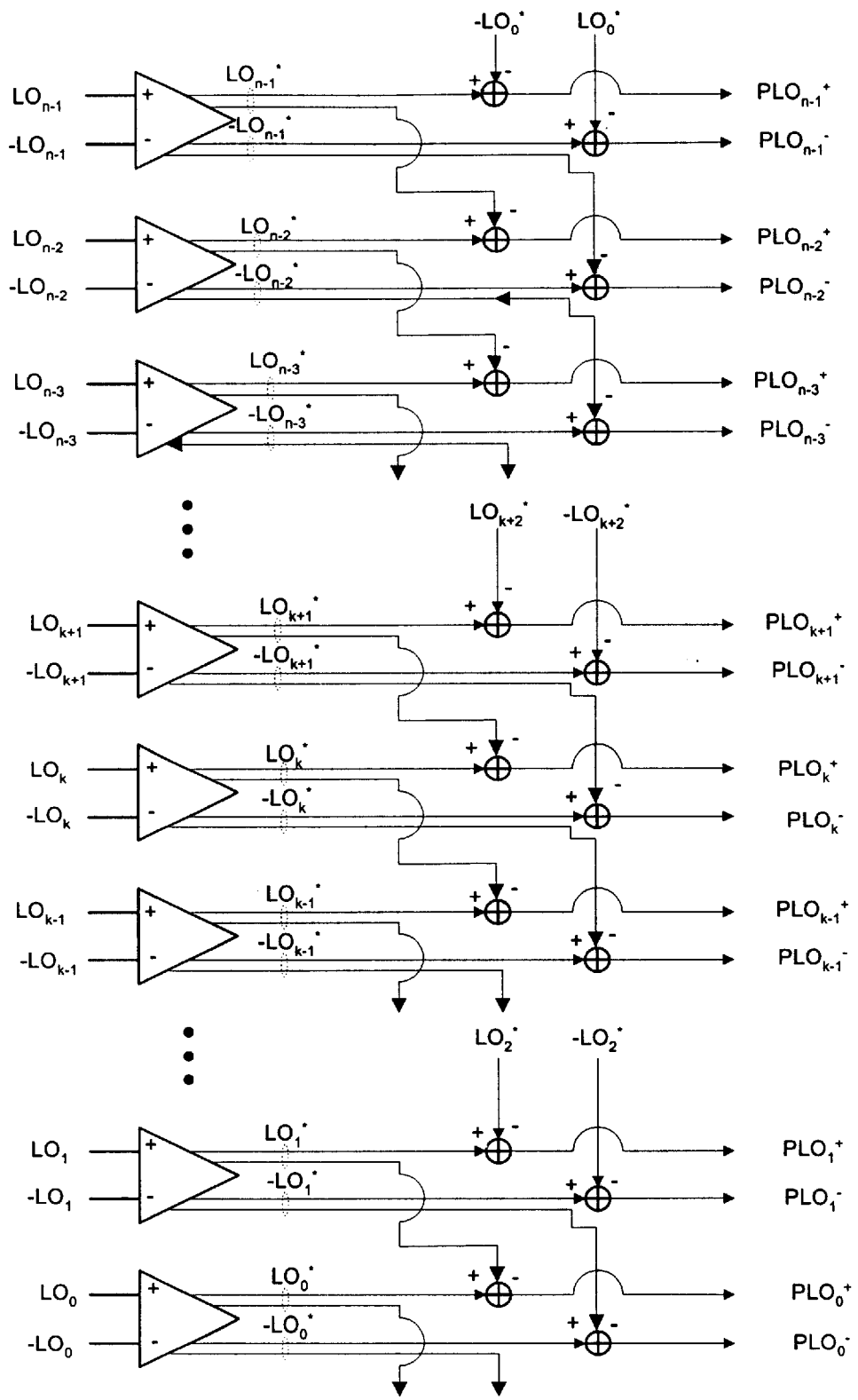

A third embodiment of a preprocessor in accordance with the subject invention is illustrated in FIG. 18C. This embodiment is identical to the previous embodiment of FIG. 18B, except that, instead of adding to a component $LO_j^*$ ($-LO_j^*$) the inverse - $LO_{j+1}^*$ ($LO_{j+1}^*$) of the next phase-lagged component to derive a preprocessed output component $PLO_j^+(PLO_j^-)$, the next phase-lagged component $LO_{j+1}^*$ ($-LO_{j+1}^*$) is subtracted from the component $LO_j^*$ ($-LO_j^*$) to derive a preprocessed output component $PLO_j^+(PLO_j^-)$.

Figure 18D:
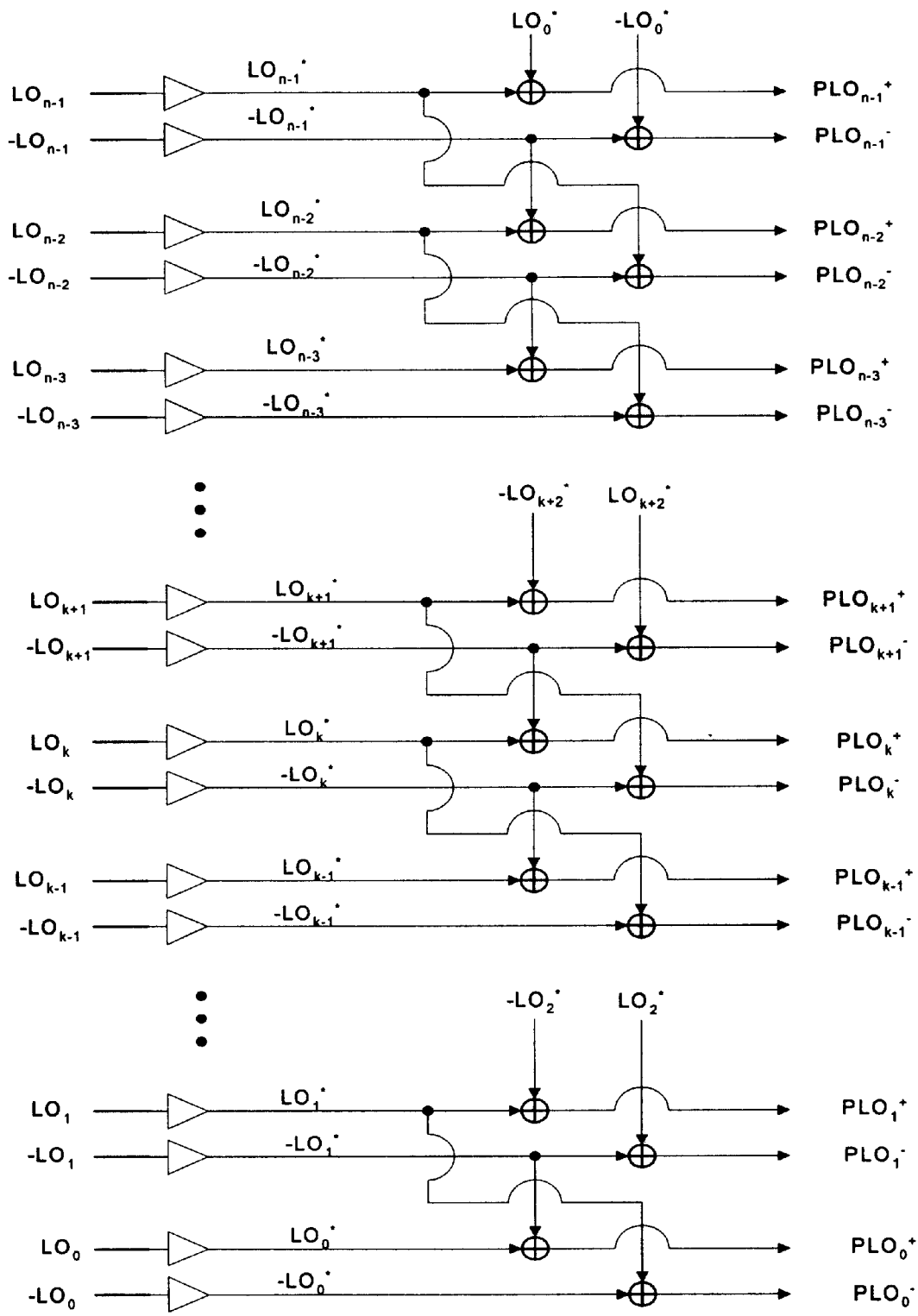

A fourth embodiment of a preprocessor in accordance with the subject invention is illustrated in FIG. 18D. This embodiment is identical to the embodiment of FIG. 18A, except that each differential comparator is replaced with two single-ended comparators, one for $LO_j$, the other for $-LO_j$. Each of these single-ended comparators is configured to place its output signal in an asserted state when the corresponding input signal exceeds a reference DC level. In one example, the reference level is the threshold voltage of a bipolar transistor.

Figure 16:
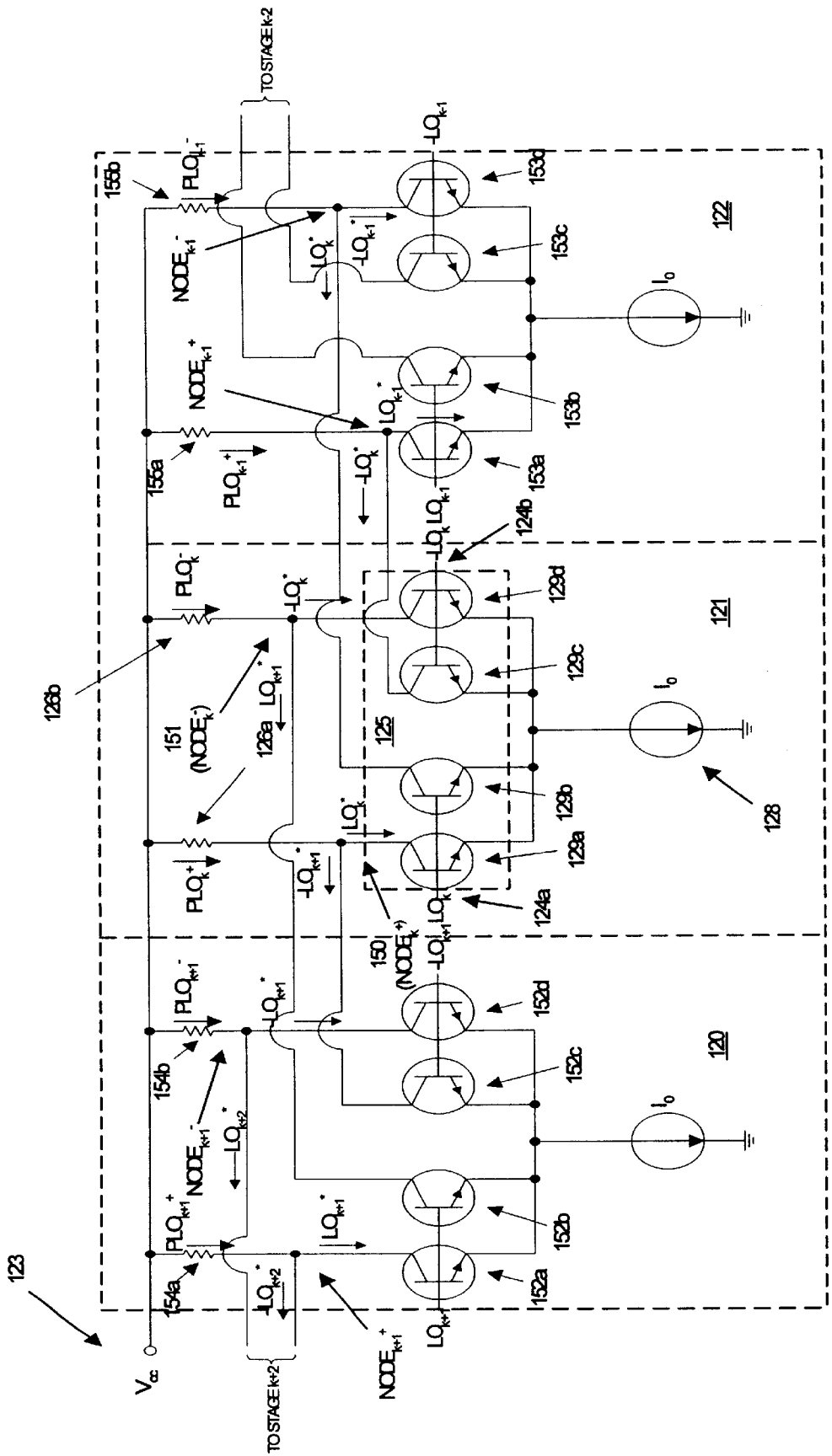
FIG. 16 illustrates an implementation of a preprocessor in accordance with the subject invention.

An implementation of the embodiment of FIG. 18B is illustrated in FIG. 16, in which like elements are referenced with like identifying numerals. More specifically, implementations of stages 120, 121, and 122 are illustrated in FIG. 16. Stage 120 receives $LO_{k+1}$ and $-LO_{k+1}$ as inputs, and produces $PLO_{k+1}^+$ and $PLO_{k+1}^-$ as outputs. Stage 121 receives $LO_k$ and $-LO_k$ as inputs, and produces $PLO_k^+$ and $PLO_k^-$ as outputs. Stage 122 receives $LO_{k-1}$ and $-LO_{k-1}$ as inputs, and produces $PLO_{k-1}^+$ and $PLO_{k-1}^-$ as outputs.

Stage 121 is representative of the other stages, and will be now be explained in detail. As indicated, $LO_k$ is applied to input 124a and $-LO_k$ is applied to input 124b of differential comparator 125. Differential comparator 125 comprises four NPN transistors, 129a, 129b, 129c, and 129d. The component $LO_k$ is applied to the base of the two left-most transistors, 129a and 129b, and the component $-LO_k$ is applied to the base of the two right-most transistors, 129c and 129d. Responsive to $LO_k$ achieving a higher state than $-LO_k$, a current mode signal $LO_k^*$ is produced on the collectors of the two transistors 129a and 129b. Responsive to $-LO_k$ achieving a higher state than $LO_k$, a current mode signal $-LO_k^*$ is produced on the collectors of the two transistors 129c and 129d.

The collector of transistor 129a is coupled to $NODE_k^+$, identified with numeral 150, which in turn is coupled to $V_{cc}$, identified with numeral 123, through resistor 126a. As shown, the collector of transistor 152c from stage 120 is also coupled to $NODE_k^+$. This transistor draws current $-LO_{k+1}^*$ upon assertion of the signal component $-LO_k$ in a high state. The current $PLO_k^+$ is thus produced through resistor 126a, which through conservation of current at $NODE_k^+$, is equal to $LO_k^* + (-LO_{k+1}^*)$ as desired.

Similarly, the collector of transistor 129d is coupled to $NODE_k^-$, identified with numeral 151, and $NODE_k^-$ in turn is coupled to $V_{cc}$ through resistor 126b. The collector of transistor 152b from node 120 is also coupled to $NODE_k^-$. Transistor 152b draws current $LO_{K+1}^*$ upon assertion of the signal component $LO_{K+1}$ in a high state. The current $PLO_k^-$ is thus produced through resistor 126b which, through conservation of current at $NODE_k^-$, equals $(-LO_k^*) + LO_{k+1}^*$ as desired.

A similar analysis applies to stages 120 and 122. In stage 120, the current $PLO_{k+1}^+$ is produced through resistor 154a which, through conservation of current at $NODE_{k+1}^+$, equals $LO_{k+1}^*+(-LO_{k+2}^*)$ as desired. Similarly, the current $PLO_{k+1}^-$ is produced through resistor 154b which, through conservation of current at $NODE_{k+1}^-$, equals $(-LO_{k+1}^*) +LO_{k+2}^*$ as desired.

In stage 122, the current $PLO_{k-1}^+$, is produced through resistor 156a which, through conservation of current at $NODE_{k-1}^+$, equals $LO_{k-1}^*+(-LO_k^*)$ as desired. Note that current $-LO_k^*$ is drawn from node $NODE_{k-1}^+$ through the collector of transistor 129c in stage 121. This collector is coupled to $NODE_{k-1}^+$ in stage 122 and draws current $-LO_k^*$ upon assertion of the signal component $-LO_k$. Similarly, the current $PLO_{k-1}^-$ is produced through resistor 155b which, through conservation of current at $NODE_{k-1}^-$, equals $(-LO_{k-1}^*) +LO_k^*$ as desired. Note that current $LO_k^*$ is drawn from $NODE_{k-1}^-$ through the collector of transistor 129b in stage 121. This collector is coupled to $NODE_{k-1}^-$ in stage 122 and draws current $LO_k^*$ upon assertion of the signal component $LO_k$.

Each stage has a current source of which source 128 in stage 121 is a representative example. Each source draws a current $I_0$ from the transistors in a stage which are active at a time. These current sources fix the value of $LO_{k-1}^*$, $LO_k^*$, $LO_{k+1}^*$, $LO_{k-1}^*$, $-LO_k^*$, and $-LO_{k+1}^*$, when asserted, to $I_0/2$, and the value of $PLO_{k-1}^+$, $PLO_k^+$, $PLO_k^+$, $PLO_{k-1}^-$, $PLO_{k+1}^-$, and $PLO_{k+1}^-$, when asserted, to $I_0$.

Figure 17A:
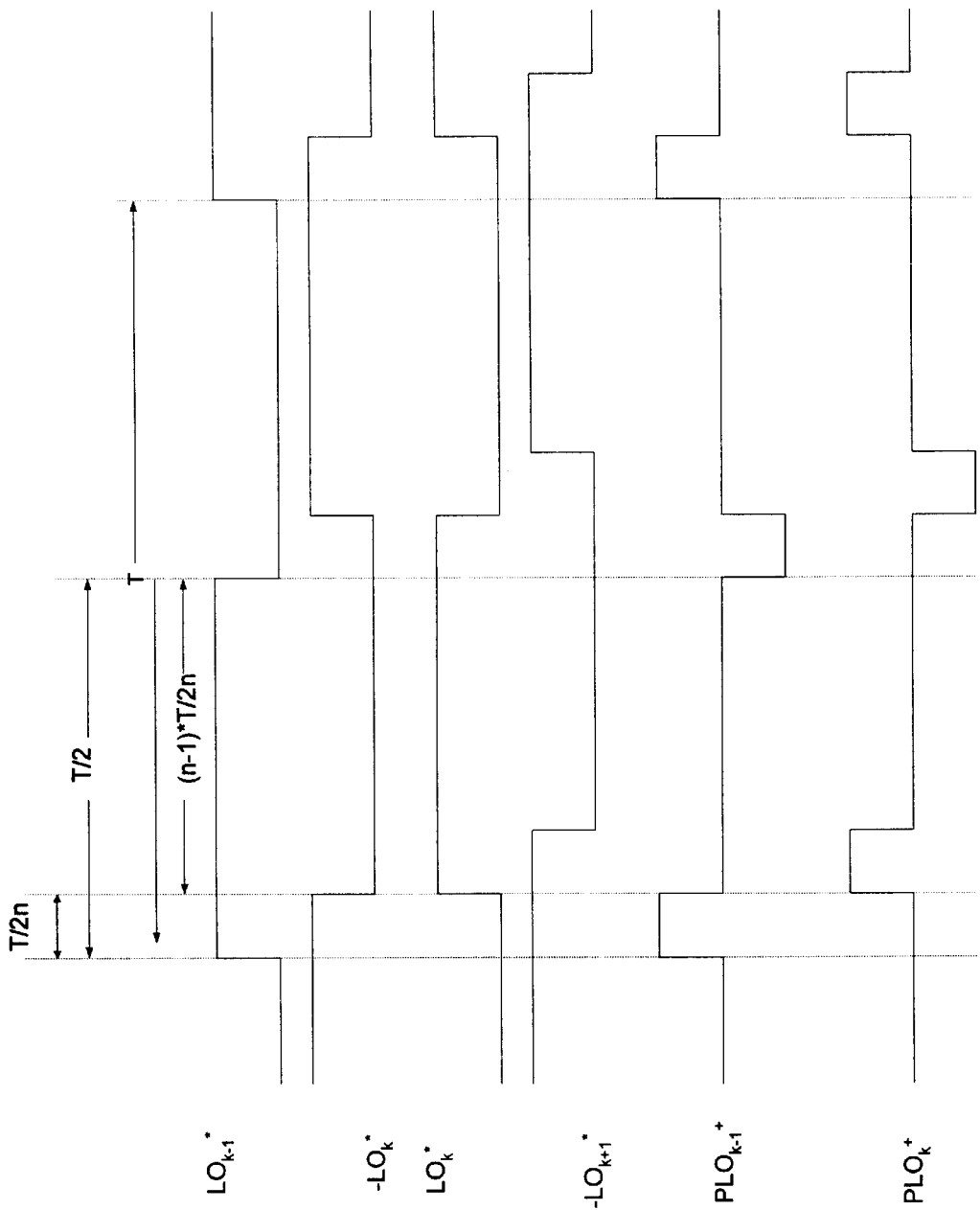
FIGS. 17A–17B are example waveforms illustrating operation of the preprocessor of FIG. 16.
Figure 17B:
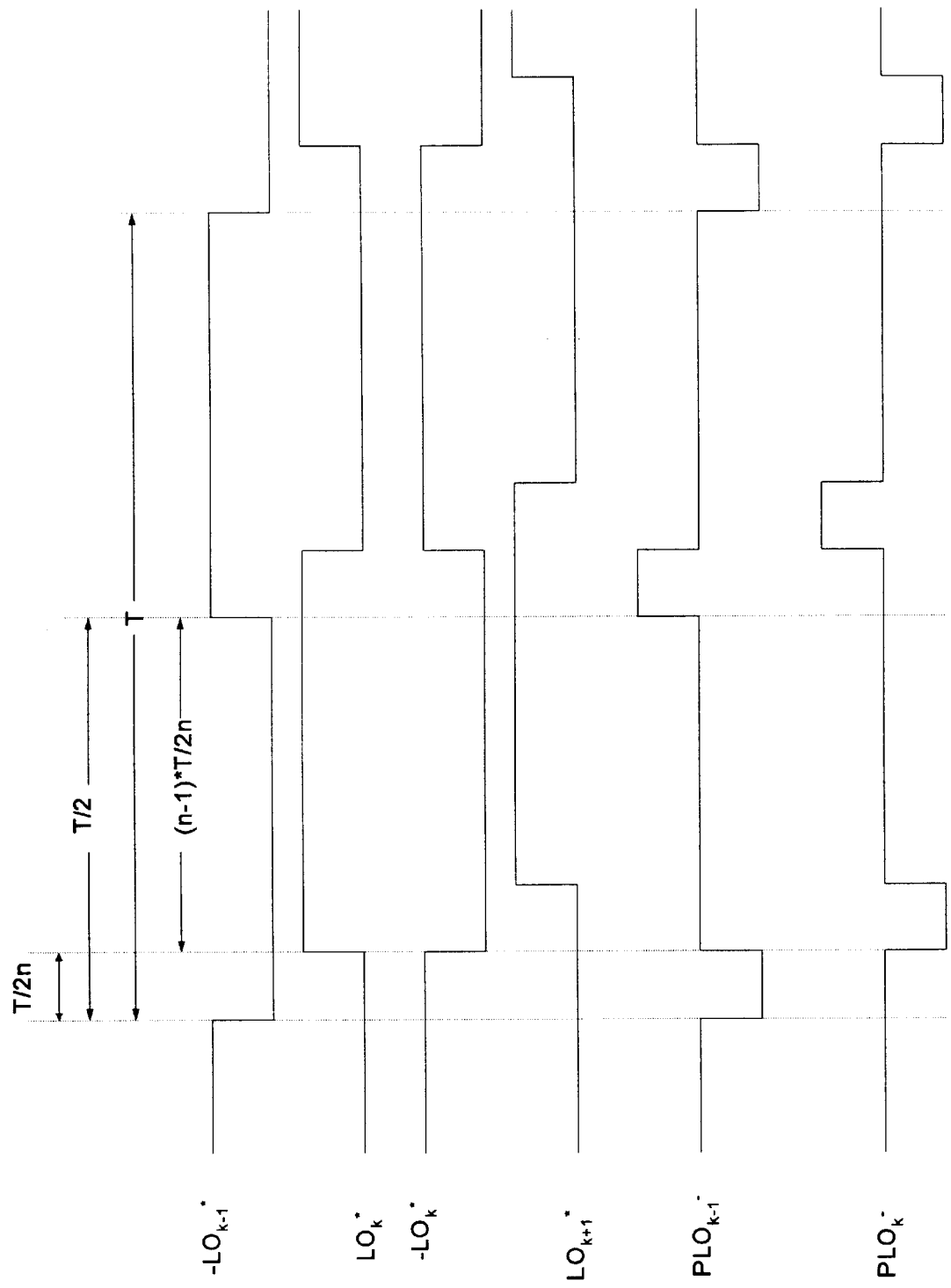

FIGS. 17A–17B are example waveforms which further illustrate operation of the implementation of FIG. 16. Each of the signal components $LO_k^*$, $-LO_{k-1}^*$, $LO_k^*$, $-LO_k^*$, $LO_{k+1}^*$, and $-LO_{k+1}^*$ have a period T, the same as the period of the signal components $LO_{k-1}$, $-LO_{k-1}$, $LO_k$, $-LO_k$, $LO_{k+1}$, and $-LO_{K+1}$ from which the signal components $LO_{k-1}^*$, $-LO_{k-1}^*$, $LO_k^*$, $-LO_k^*$, $LO_{k+1}^*$, and $-LO_{k+1}^*$, are derived. As illustrated, the signal components $LO_{k-1}^*$, $LO_k^*$, and $LO_{K+1}^*$ are successively phase-lagged with respect to one another by T/2n, as are the signal components $-LO_{k-1}^*$, $-LO_k^*$, and $-LO_{k+1}^*$, wherein n is an integer greater than 1 greater than 1.

With reference to FIG. 17A, the signal $PLO_k^+$ is formed by adding $LO_{k-1}^*$ to ($-LO_k^*$), and the signal $PLO_k^+$ is formed by adding $LO_k^*$ to ($-LO_{k+1}^*$), and, with reference to FIG. 17B, the signal $PLO_{k-1}^-$ is formed by adding ($-LO_{k-1}^*$) to $LO_k^*$, and the signal $PLO_k^-$ is formed by adding ($-LO_k^*$) to $LO_{k+1}^*$. As illustrated, each of these signals comprises successive alternating sequences of positive going and negative going pulses, each of which have a duration of T/2n, and where the spacing between successive positive and negative going pulses is $(n-1)*T/2n$.

A second embodiment of a preprocessor in accordance with the subject invention can be explained with reference to FIGS. 6A–6E. In this embodiment, the preprocessor is configured to a receive a phase-split input signal having 2n components, where n is an integer greater than 1, and also having a period T, and produce therefrom a phase-split output signal, also having 2n components, wherein the period T comprises 2n substantially non-overlapping subperiods of duration T/2n. The output signal is such that the switching characteristics thereof are improved in relation to the input signal. More specifically, during each of the 2n/T subperiods of the period T, only one of the components of the output signal is asserted at a time, and a different one of the output components is asserted in each of the subperiods. Moreover, each of the components is substantially symmetrical about a horizontal axis, identified with numeral 109 in FIGS. 6A–6E. Thirdly, the transistion times between the off and on states, and vice-versa, identified in FIGS. 6A–6E respectively with numerals 109 and 108, are fast, which for purposes of this disclosure, mean that the rate of these transistions exceeds $(2n+A)/T$, wherein A is the amplitude achieved in the asserted or on state in relation to the off state. With reference to FIGS. 6A–6E, it is the difference between the levels 108 and 109.

These characteristics also apply in the case n=2 to the waveforms illustrated in FIGS. 11, 12, 14, 21, and 22, and in the generalized case in FIGS. 17 and 19.

Figure 20A:
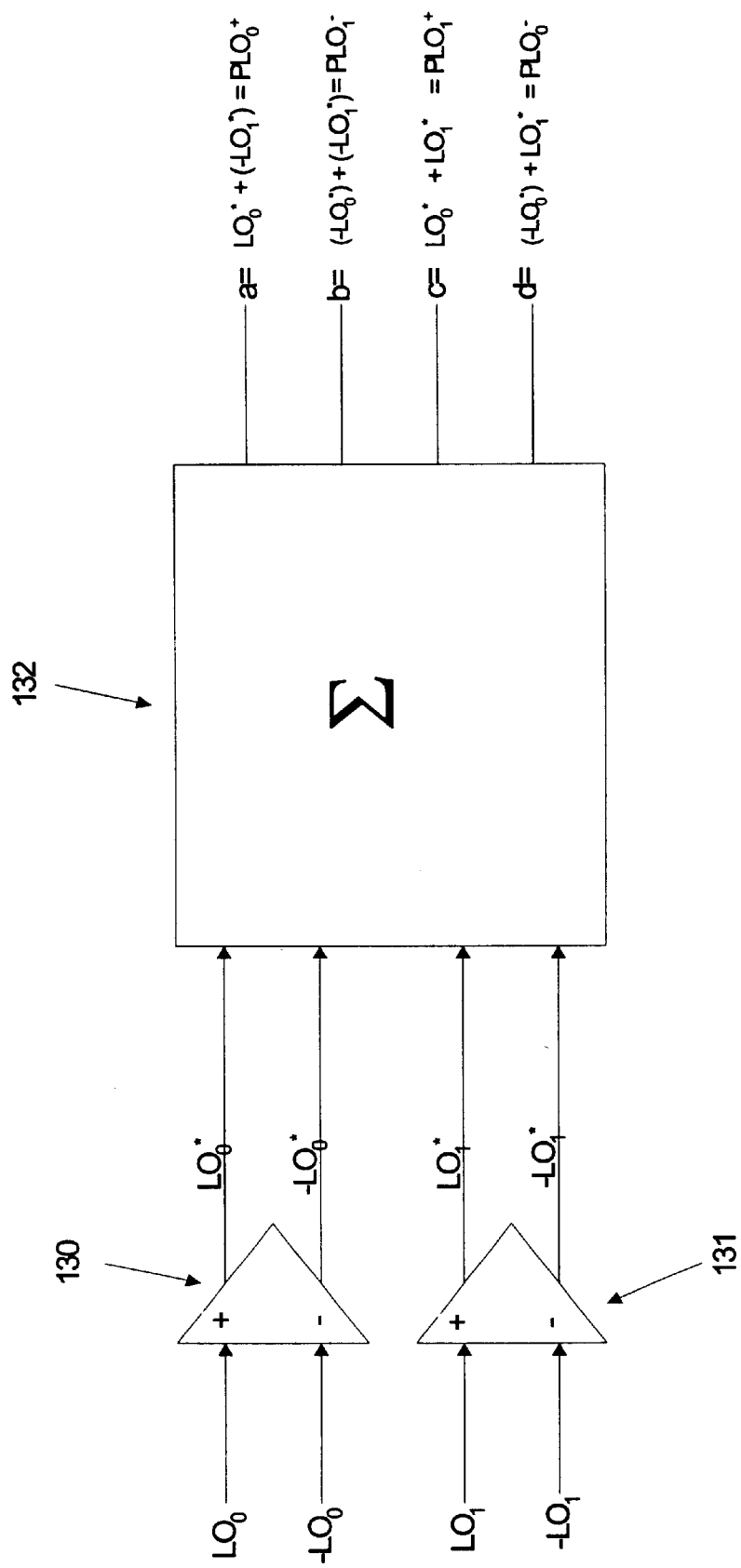
FIGS. 20A–20B are block diagrams of embodiments of the preprocessor of the subject invention in the case in which n=2.

FIG. 20A illustrates a block diagram of an implementation of the preprocessor of the subject invention in the case in which n=2. The preprocessor shown in FIG. 20A includes a first comparator 130 and a second comparator 131. The first comparator 130 includes an input $LO_0$ and an input $-LO_0$. The first comparator 130 in this configuration includes dual outputs labeled herein as $LO_0^*$ and $-LO_0^*$ respectively. Both of these outputs connect to a summing unit 132.

A second comparator 131 includes an input $LO_1$ and an input $-LO_1$. The second comparator 131 includes dual outputs labeled herein as $LO_1^*$ and $-LO_1^*$. Both of these outputs connect to summing unit 132. Summing unit 132 provides the four outputs labeled a, b, c, and d, which have been previously discussed. As shown, the output a equals $PLO_0^+$ which in turn equals $LO_0^*+(-LO_1^*)$; the output c equals $PLO_1^+$ which in turn equals $LO_0^*+LO_1^*$; the output d equals $PLO_0^-$ which in turn equals $(-LO_0^*)+LO_1^*$; and the output b equals $PLO_1^-$ which in turn equals $(-LO_0^*)+(-LO_1^*)$.

In operation, the first comparator 130 receives inputs $LO_0$ and $-LO_0$, and produces outputs $LO_0^*$ and $-LO_0^*$ as follows:

If $-LO_0 < LO_0$ then $LO_0^*=0, -LO_0^*=1$

If $-LO_0 < LO_0$ then $LO_0^*=0, -LO_0^*=1$

If $-LO_0 = -LO_0^* =), -LO_0^* = \frac{1}{2}$

The operation of the second comparator 131 mirrors operation of the first comparator 130. The following equations define the relationship and operation of the second comparator 131:

If $LO_1 > -LO_1$ then $LO_1^*=1, -LO_1^*=0$

If $LO_1 < -LO_1$ then $LO_1^*=0, -LO_1^*=1$

If $LO_1 = -LO_1$ then $LO_1^*=0, -LO_1^*=\frac{1}{2}$

The signal components $LO_0^*$, $-LO_0^*$, $LO_1^*$, and $-LO_1$ are presented to the summing unit 132. The summing unit arithmetically combines these signal components to generate outputs a, b, c, and d. The following equations define operation of summing unit 132 in this implementation:

Output $a=PLO_0^+=LO_0^*+(-LO_1^*)$

Output $c=PLO_1^+=LO_0^*+LO_1^*$

Output $d=PLO_0^-=(-LO_0^*)+LO_1^*$

Output $b=PLO_1^-=(-LO_0^*)+(-LO_1^*)$

Figure 20B:
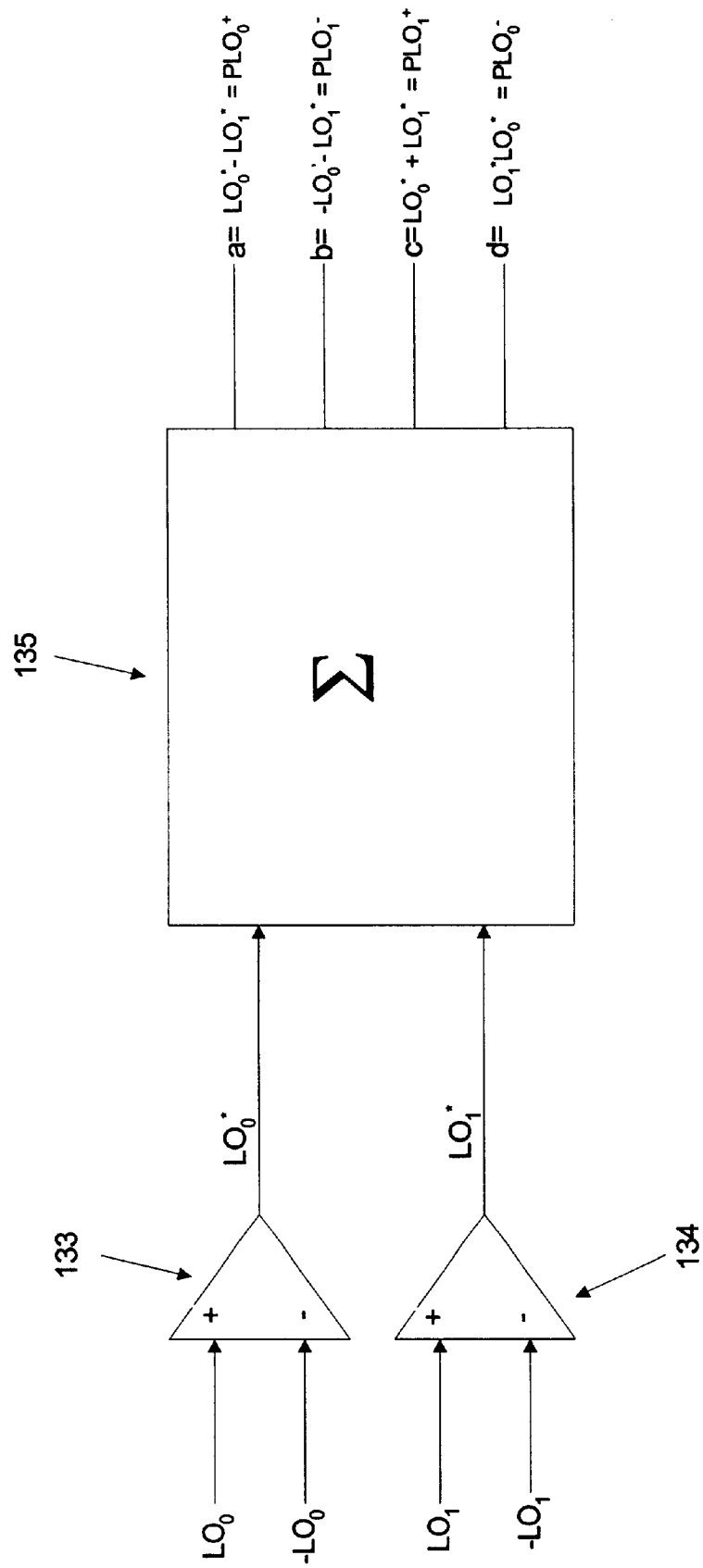

FIG. 20B illustrates a second implementation of the preprocessor of the subject invention in the case in which n=2 in which wherein single output comparators 133, 134 replace the dual output comparators of the first implementation of FIG. 20A. In relation to FIG. 20A, like elements are referenced with like reference numerals in FIG. 20B. As shown, a first single output comparator 133 connects to input $LO_0$ and input $-LO_0$, and has a single output $LO_0^*$ which is connected to arithmetic unit 135. Similarly, a second single output comparator 134 connects to input $LO_1$ and input $-LO_1$, and has a single output $LO_1^*$ which is connected to arithmetic unit 135.

The first comparator 133 operates in accordance with the following equations.

If $LO_0 > -LO_0$ then $LO_0^*=1$

If $-LO_0 < LO_0$ then $LO_0^*=0$

If $LO_0 = -LO_0$ then $LO_0^*=\frac{1}{2}$

The operation of comparator 134 mirrors operation of first single output comparator 133. The following equations define operation of second comparator 134:

If $LO_1 > -LO_1$ then $LO_1^*=1$

If $LO_1 < -LO_1$ then $LO_1^*=0$

If $LO_1 = -LO_1$ then $LO_1^*=\frac{1}{2}$

The signal components $LO_0^*$ and $LO_1^*$ are presented to the arithmetic unit 135. The arithmetic unit 135 combines these inputs to generate outputs a, b, c, and d. The following equations define operation of arithmetic unit 135:

Output $a=PLO_0^+=LO_0^*-LO_1^*$

Output $c=PLO_1^+=LO_0^*+LO_1^*$

Output $d=PLO_0^-=LO_1^*-LO_0^*$

Output $b=PLO_1^-=-LO_0^*-LO_1^*$

FIGS. 21A–21I illustrate additional details about the operation of the preprocessor implementation illustrated in FIG. 20A. FIG. 21A illustrates an example of a phase-split input to the preprocessor from a local oscillator. It represents four phase-split sinusoidal signal components, $LO_0$, $LO_1$, $-LO_0$, and $-LO_1$, which are 90 degrees out of phase with respect to one another. In this example, $LO_1$ is shifted by 90 degrees with respect to $LO_0$, $-LO_0$ is shifted by 180 degrees with respect to $LO_0$, and $-LO_1$ is shifted by 270 degrees with respect to $LO_0$.

FIG. 21B illustrates the signal component $LO_0^*$ which appears at an output of comparator 130 in the implementation of FIG. 20A responsive to the inputs of FIG. 21A. As can be seen, it is a logical "1" when $LO_0 > -LO_0$, ½ when the two are equal, and a logical "0" otherwise.

FIG. 21C illustrates the signal component $-LO_0^*$ which appears at an output of comparator 130 responsive to the inputs of FIG. 21A. As can be seen, it is a logical "1" when $-LO_0 > LO_0$, ½ when the two are equal, and a logical "0" otherwise.

FIG. 21D illustrates the signal component $LO_1^*$ which appears at an output of comparator 131 responsive to the inputs of FIG. 21A. As can be seen, it is a logical "1" when $LO_1 > -LO_1$, ½ when the two are equal, and a logical "0" otherwise.

FIG. 21E illustrates the signal component $-LO_1^*$ which appears at an output of comparator 131 responsive to the inputs of FIG. 21A. As can be seen, it is a logical "1" when $-LO_1 > LO_1$, ½ when the two are equal, and a logical "0" otherwise.

FIG. 21F illustrates the signal component "c" which is output from summing unit 132 in FIG. 20A. As can be seen, it is the sum of the signal components $LO_o^*$ and $LO_1^*$.

FIG. 21G illustrates the signal component "a" which is output from summing unit 132 in FIG. 20A. As can be seen, it is the sum of the signal components $LO_0^*$ and $-LO_1^*$.

FIG. 21H illustrates the signal component "d" which is output from summing unit 132 in FIG. 20A. As can be seen, it is the sum of the signal components $-LO_0^*$ and $LO_1^*$.

FIG. 21I illustrates the signal component "b" which is output from summing unit 132 in FIG. 20A. As can be seen, it is the sum of the signal components $-LO_0^*$ and $-LO_1^*$.

If the period of the local oscillator signal components of FIG. 21A is divided up into four substantially non-overlapping portions as shown in FIG. 21I, comparing the signals of FIGS. 21F–21I, it will be observed that, in each of these portions, only one of these signal components is asserted at a time, that is, only one is in a predefined state sufficient to actuate a mixer to reverse polarity. In one implementation, a signal component is asserted when it is the highest signal at a time in relation to the other components. It will also be observed that, in each of these portions, a different one of these signal components is asserted. In the first portion, signal component "a" is asserted; in the second portion, the signal component "c" is asserted; in the third portion, the signal component "d" is asserted; and in the fourth portion, the signal component "b" is asserted. It will also be observed that the boundaries between these portions define transition points, that the signals at these transition points are steep and sharp, and that the transition points are defined by crossover points of the signal components of FIGS. 21B–21E through a DC offset.

FIGS. 22A–22G illustrate additional details about the operation of the preprocessor implementation illustrated in FIG. 20B. FIG. 22A illustrates an example of a phase-split input to the preprocessor from a local oscillator. It is identical to FIG. 21A, and need not be explained further.

FIG. 22B illustrates the signal component $LO_0^*$ which appears at the output of comparator 133 in the implementation of FIG. 20B responsive to the inputs of FIG. 22A. As can be seen, it is a logical "1" when $LO_0 > -LO_0$, ½ when the two are equal, and a logical "0" otherwise.

FIG. 22C illustrates the signal component $LO_1^*$ which appears at the output of comparator 134 responsive to the inputs of FIG. 22A. As can be seen, it is a logical "1" when $LO_1 > -LO_1$, ½ when the two are equal, and a logical "0" otherwise.

FIG. 22D illustrates the signal component "c" which is output from arithmetic unit 135 in FIG. 20B. As can be seen, it is the sum of the signal components $LO_0^*$ and $LO_1^*$.

FIG. 22E illustrates the signal component "a" which is output from arithmetic unit 135 in FIG. 20B. As can be seen, it is the difference between the signal components $LO_0^*$ and $LO_1^*$.

FIG. 22F illustrates the signal component "d" which is output from arithmetic unit 135 in FIG. 20B. As can be seen, it is the difference between the signal components $LO_1^*$ and $LO_0^*$.

FIG. 22G illustrates the signal component "b" which is output from arithmetic unit 135 in FIG. 20B. As can be seen, it is the difference between the inverse of $LO_0^*$ and $LO_1^*$.

These signal components are identical to the signal components of FIGS. 21F–21I and need not be discussed further.

Figure 23A:
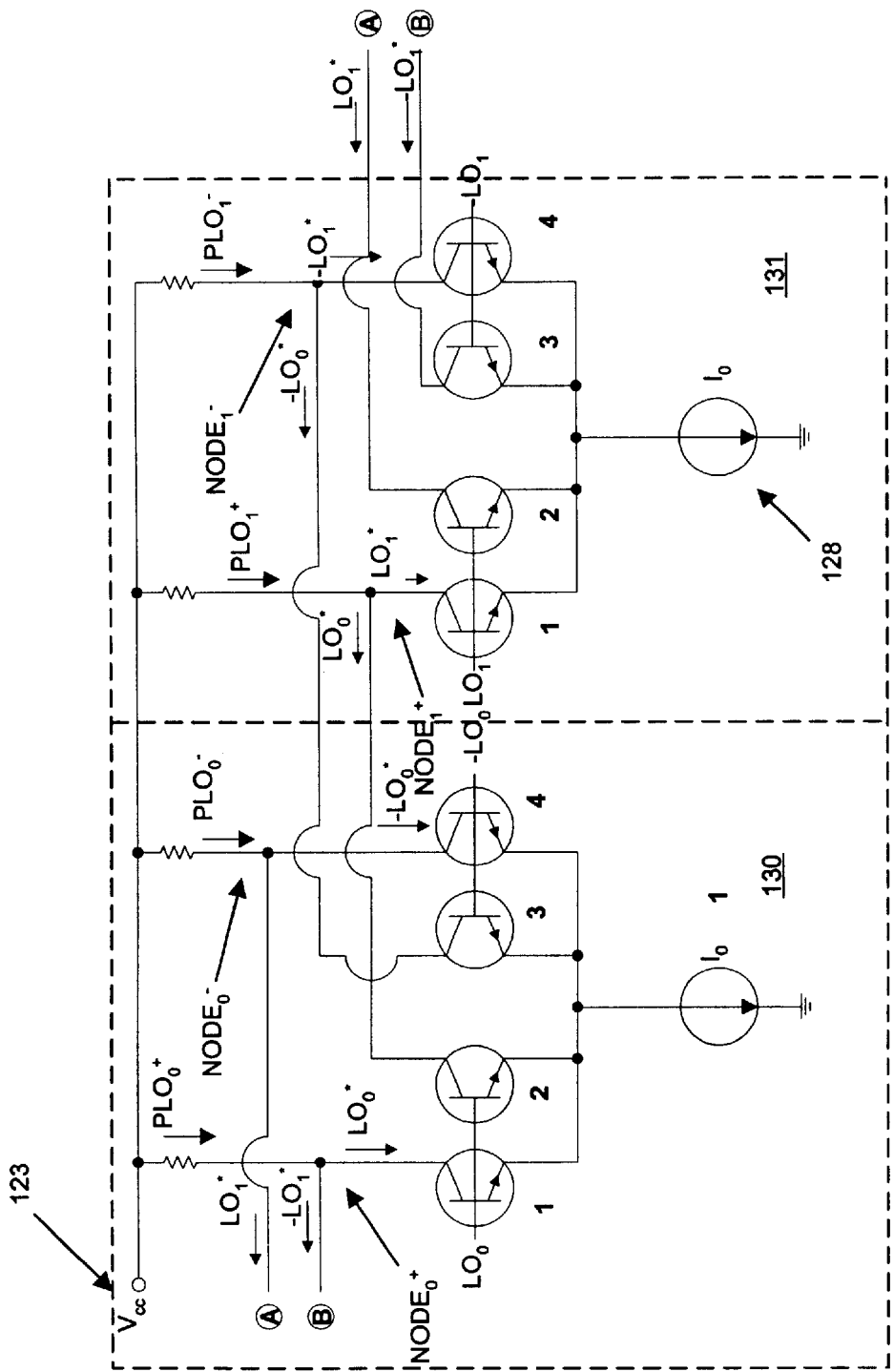
FIG. 23A is an implementation example of a preprocessor in accordance with the subject invention in the case in which n=2.

FIG. 23A illustrates an example of the implementation of FIG. 20A. Essentially, it is the implementation illustrated in FIG. 16 in the case in which n=2. As illustrated, stages 130 and 131 are provided. Each stage has four NPN transistors, numbered 1–4. A current source supplying current $I_0$ is provided to each stage, of which source 128 is a representative example. The source is coupled to the emitters of each transistor in the stage. The signal component $LO_0$ is coupled to the bases of transistors 1 and 2, and the signal component $-LO_0$ is coupled to the bases of transistors 3 and 4 in stage 130. Similarly, the signal component $LO_1$ is coupled to the bases of transistors 1 and 2, and the signal component $-LO_1$ is coupled to the bases of transistors 3 and 4 in stage 131.

The collector of transistor 1 in stage 130 is coupled to $NODE_0^+$ which in turn is coupled to $V_{cc}$, identified with numeral 123, through a resistor. Similarly, the collector of transistor 4 in stage 130 is coupled to $NODE_0^-$ which in turn is coupled to $V_{cc}$ through a resistor.

The collector of transistor 1 in stage 131 is coupled to $NODE_1^+$ which in turn is coupled to $V_{cc}$ through a resistor. Similarly, the collector of transistor 4 in stage 131 is coupled to $NODE_1^-$ which in turn is coupled to $V_{cc}$ through a resistor.

The collector of transistor 2 in stage 130 is coupled to $NODE_1^+$ in stage 131, and the collector of transistor 3 in stage 130 is coupled to $NODE_1^-$ in stage 131. Similarly, the collector of transistor 2 in stage 131 is coupled to $NODE_0^-$ in stage 130, and the collector of transistor 3 in stage 131 is coupled to $NODE_0^+$ in stage 130.

Through conservation of current at $NODE_0^+$, the current $PLO_0^+$ will equal the sum of $LO_0^*$ and $(-LO_1^*)$. Through conservation of current at $NODE_0^-$, the current $PLO_0^-$ will equal the sum of $(-LO_0^*)$ and $LO_1^*$. Through conservation of current at $NODE_1^+$, the current $PLO_1^+$ will equal the sum of $LO_1^*$ and $LO_0^*$. Through conservation of current at $NODE_1^-$, the current $PLO_1^-$ will equal the sum of $(-LO_1^*)$ and $LO_0^*$.

Figure 23B:
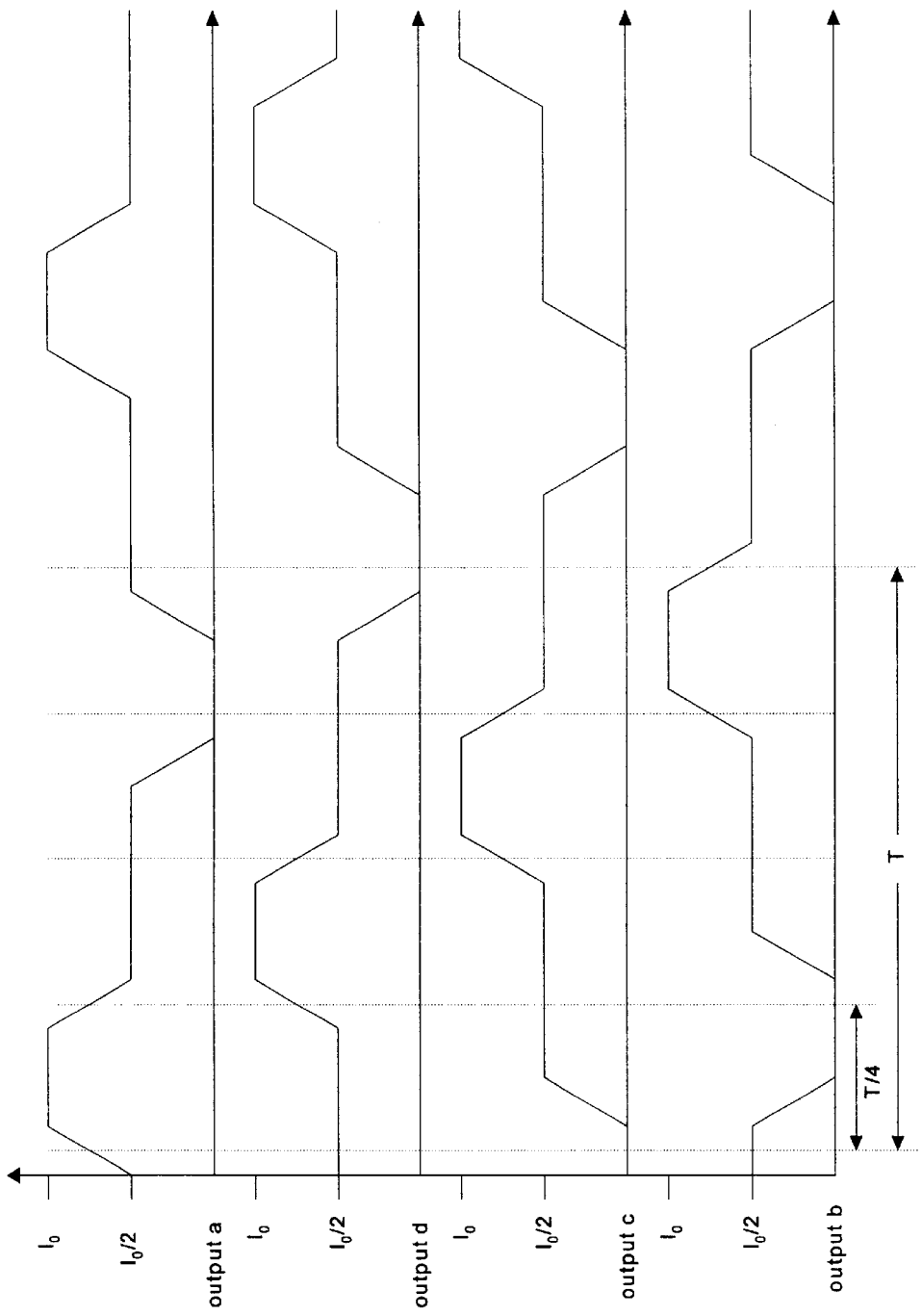
FIG. 23B is example waveforms illustrating operation of the preprocessor implementation example of FIG. 23A.

When asserted, each of the currents $LO_0^*$, $-LO_0^*$, $LO_1^*$, and $-LO_1^*$ will achieve the value $I_0/2$. The currents $PLO_0^+$, $PLO_0^-$, $PLO_1^+$, and $PLO_1^-$, when asserted, will achieve the value $I_0$, and will be symmetrical about a DC offset of $I_0/2$. The situation is depicted in FIG. 23B, which illustrates the signal components a ($PLO_0^+$), d ($PLO_0^-$), c ($PLO_1^+$), and b ($PLO_1^-$) in a real word implementation.

FIGS. 12A–12H illustrate desirable characteristics of the preprocessor outputs in one implementation of the invention. Defining in this example the predefined state as the state which actuates the mixer to reverse polarity, it can be seen that each of the signal components a, b, c, and d achieves this predefined state in one of the four substantially non-overlapping portions of the LO period indicated in the figures, and that only one of the signal components is asserted in this predefined state at a time. This is indicated in FIGS. 12A–12D. It will also be observed that the switching points 71 at which the mixer reverses polarity are defined by DC offset cross-over points of the components $LO_0^*$, $-LO_0^*$, $LO_1^*$, and $-LO_1^*$ used to generate the preprocessor outputs. Further, it will be observed that the slope of the signal components at these transition points, identified by numerals 70 and 72, is sharp and steep.

Figure 25:
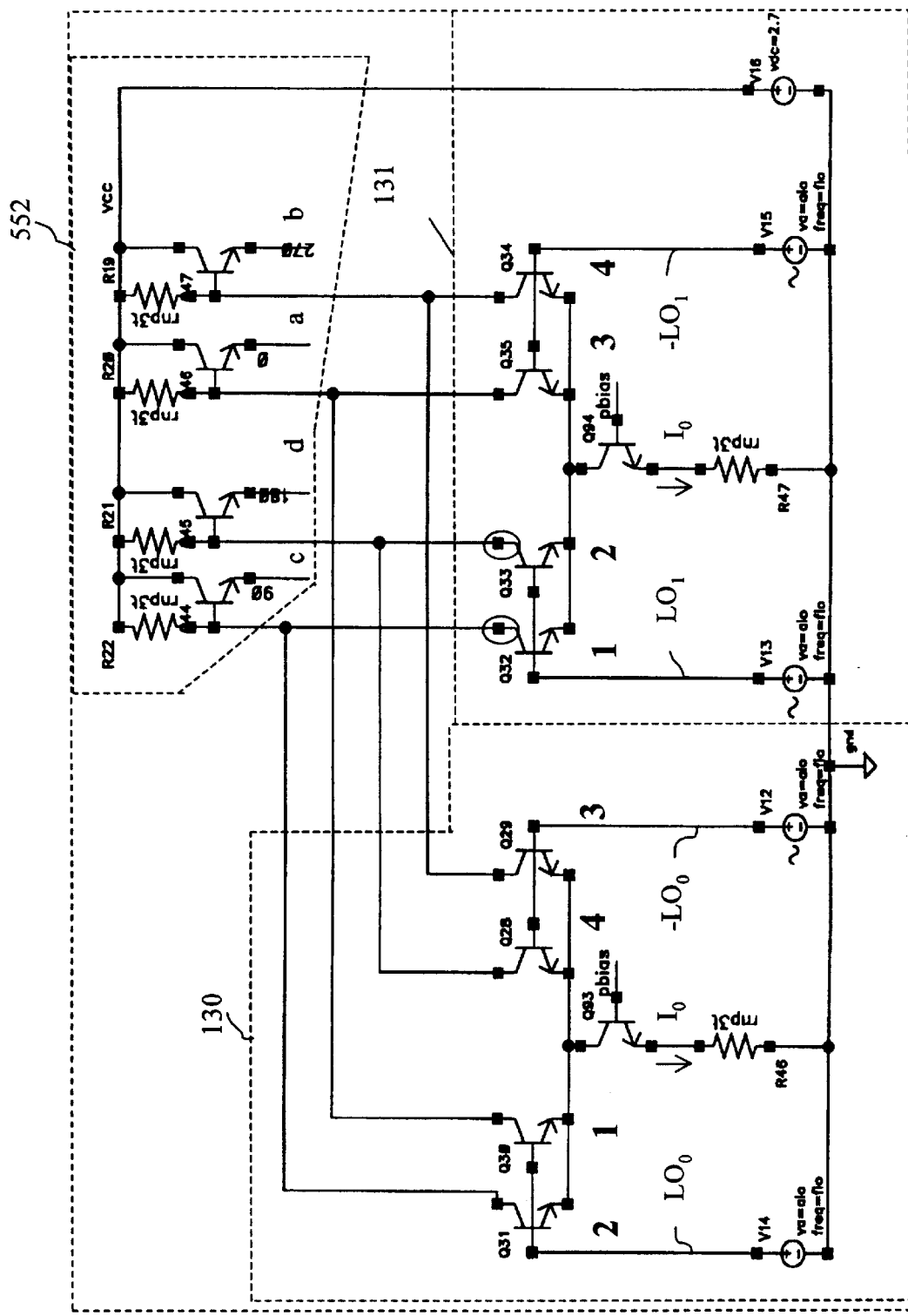
FIG. 25 illustrates a detailed implementation example of a preprocessor in accordance with the subject invention.

FIG. 25 is a detailed circuit level implementation of the preprocessor of FIG. 23A, and, compared to that figure, like elements are referenced with like identifying numerals. Some differences to be noted are that, in FIG. 25, the order of transistors 1 and 2 in stage 130 are reversed, as are the order of transistors 3 and 4. Another difference is that a buffer system 552 has been added. This buffer system causes impedance transformation by adding a high input impedance and a low output impedance to the output stage of the preprocessor to improve mixer and preprocessor performance. Each transistor Q44–Q47 acts as a voltage buffer to provide a voltage from Vcc at outputs a, b, c, d that is offset by a constant amount from the voltage at each transistor base, but with a low series impedance. Resistors R22–R19 in conjunction with Q44–Q47 achieve desired impedance transformation.

Otherwise, the structure and operation of this detailed implementation is identical to that of FIG. 23A, and need not be explained further.

Figure 28A:
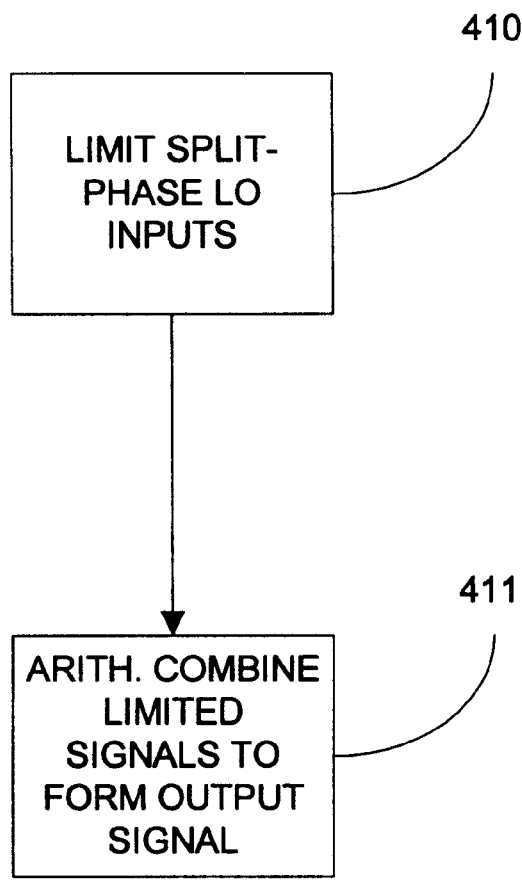
FIGS. 28A–28B illustrate embodiments of methods of operation of a preprocessor in accordance with the subject invention.

FIG. 28A illustrates one embodiment of a method of operation of a preprocessor in accordance with the subject invention. In step 410, phase-split LO inputs are limited to produce a phase-split limited signal, and in step 411, the components of the limited signal are arithmetically combined to form the components of the output signal.

Figure 28B:
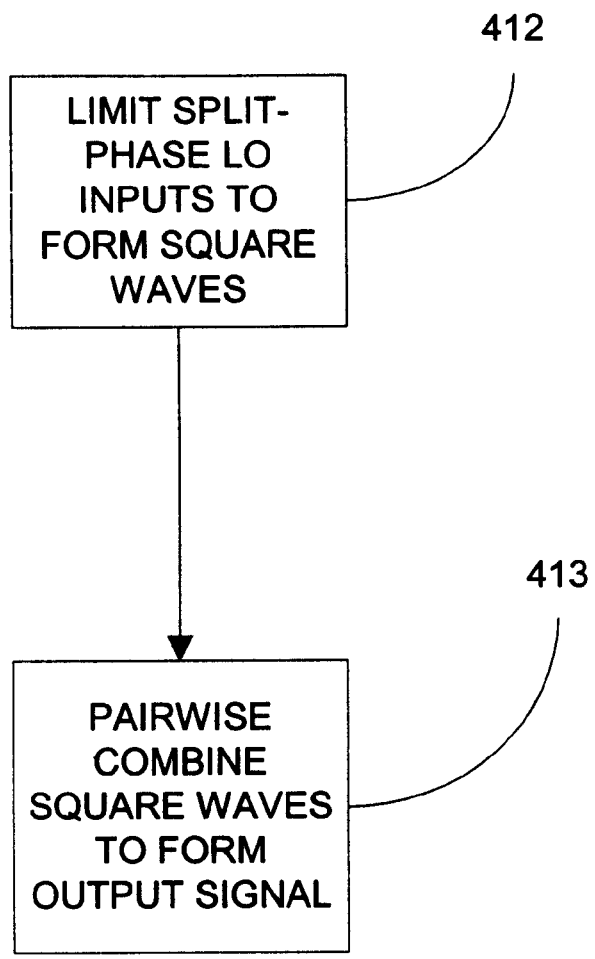

FIG. 28B illustrates a second embodiment of a method of operation of a preprocessor in accordance with the subject invention. In step 412, a phase-split LO input is limited to form a phase-split limited output signal, the components of which are square waves. In step 413, the square waves are pairwise arithmetically combined to form a phase-split output signal. In one implementation, each square wave has subtracted from it its phase-lagged successor to form a component of the output signal, and is also subtracted from its immediate phase-leading predecessor to form another component of the output signal.

Figure 21:
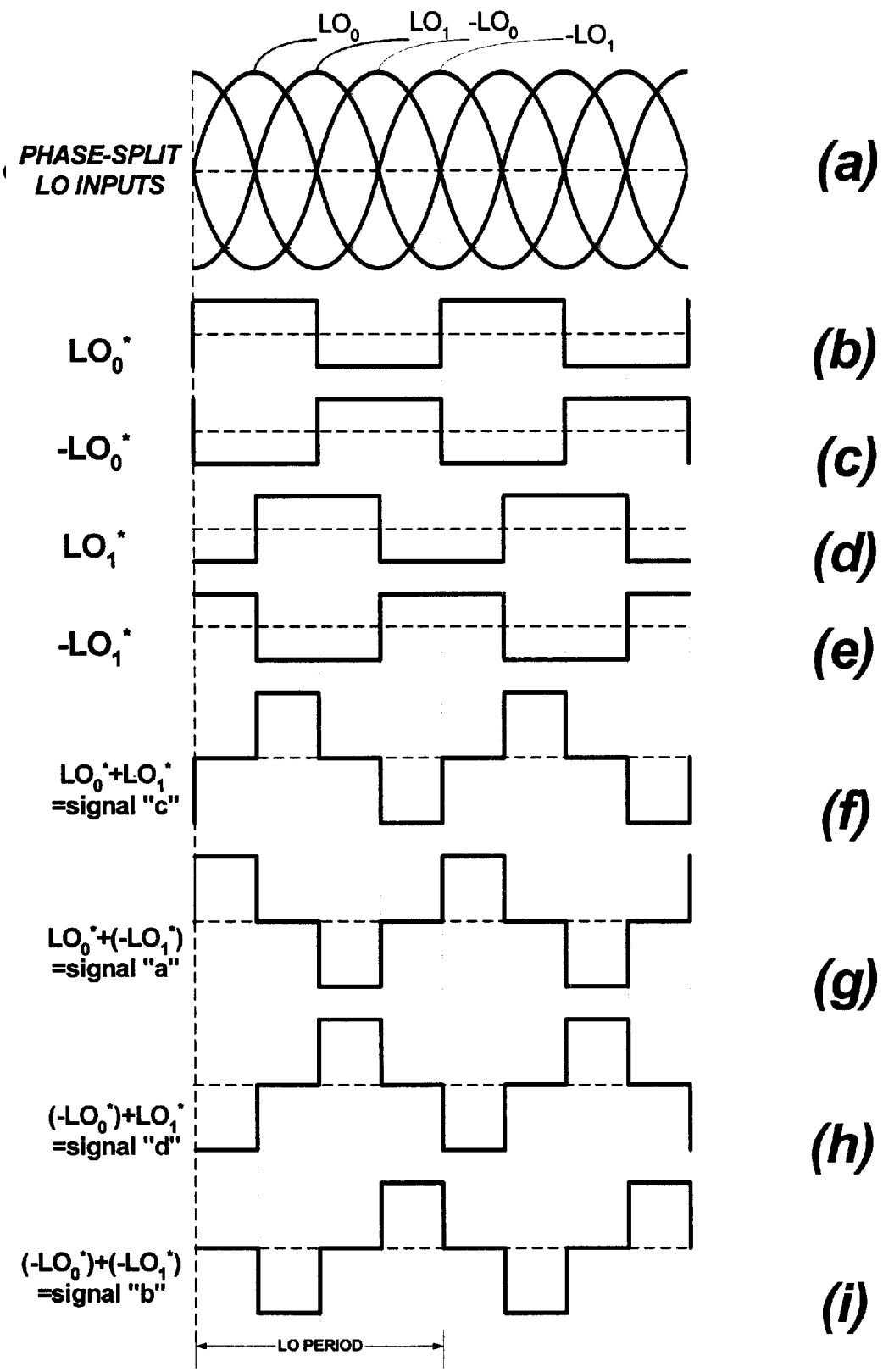
FIGS. 21A–21I and 22A–22G, are example waveforms illustrating operation of the preprocessor embodiments of FIGS. 20A–20B.
Figure 22:
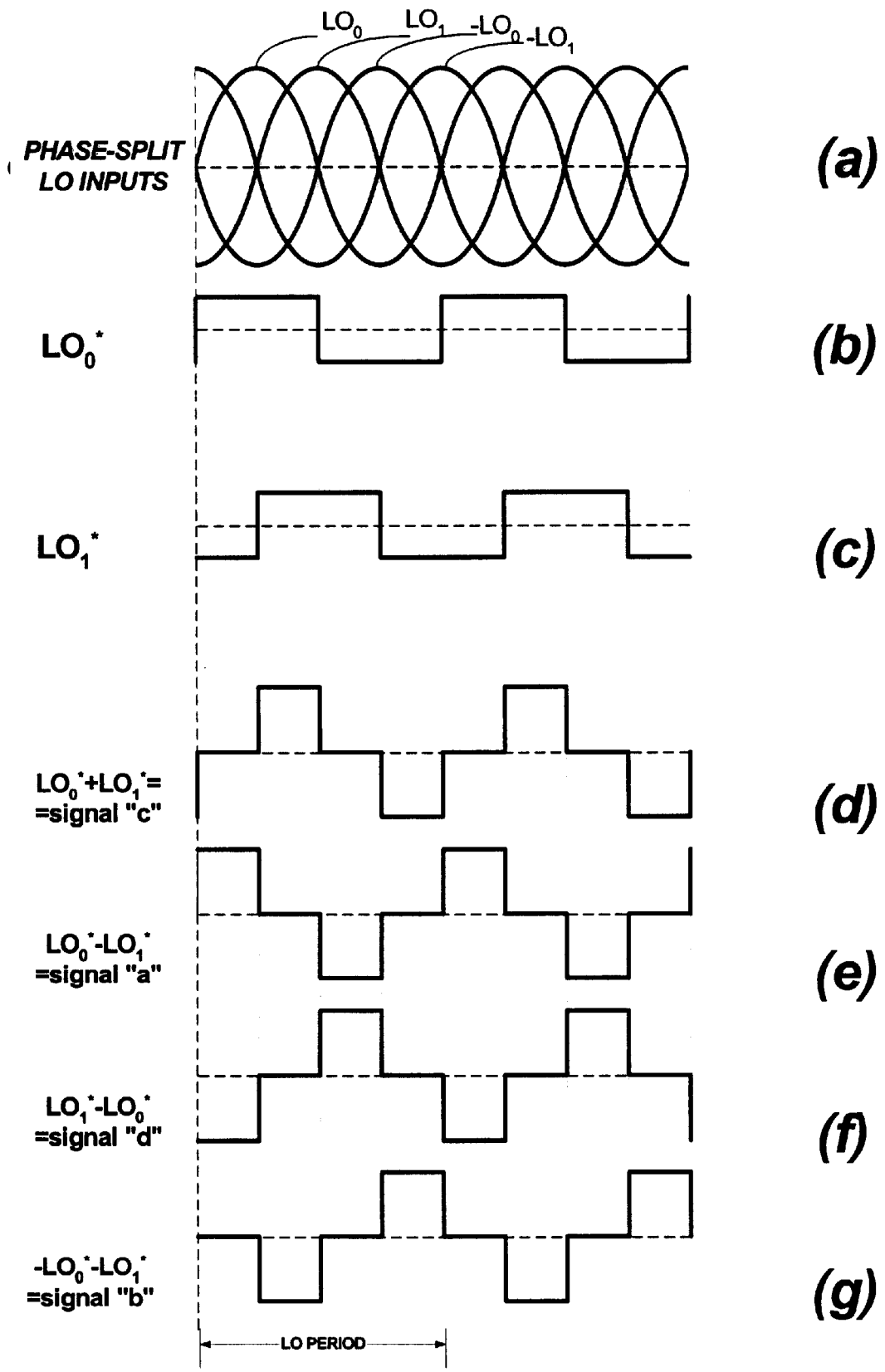

It should be appreciated that the depiction of the signal components a, b, c, and d in FIGS. 21 and 22, and of $LO_0^*$, $LO_1^*, \ldots LO_{k-1}^*, LO_k^*, LO_{k+1}^*, \ldots LO_{n-1}^*, -LO_0^*, -LO_1, \ldots -LO_{k-1}^*, -LO_k^*, -LO_{K+1}^*, \ldots -LO_{n-1}^*$ in FIGS. 19A–19B are idealized in that, in actual implementations, there will be some finite slope to the signal transitions. The signals depicted in FIGS. 6 and 23B depict examples of the finite-sloped transitions that might result in an actual implementation.

Implementation examples are possible in which the any of the differential mode signals in the foregoing examples are single-ended signals, or in which any of the current mode signals in the foregoing examples are voltage mode, and vice-versa. Further implementation examples are possible in which the transistors in the preprocessor core comprise or embody bipolar PNP transistors, MOSFETs, BJTs, CMOS technology, HBTs, HEMTs, MODFETs, diodes, MESFETs, JFETs, or the like.

From the foregoing, it should be appreciated that an advantage of the preprocessor of the subject invention is a phase-split LO signal having steeper transitions between the on and off states thereof compared to a sinusoidal LO phase-split signal, resulting in improved gain, noise performance, and therefore sensitivity, in a mixer driven by such LO signal.

Another advantage of the preprocessor of the subject invention is a phase-split signal in which the transitions between on and off states thereof are defined by LO zero crossings, which provides better rejection of RF self-mixing, and less dependence on LO amplitude matching, and the type or shape of the LO waveform.

An advantage of the combination of the subharmonic mixer and the preprocessor of the subject invention compared to a subharmonic mixer driven by a sinusoidal phase-split LO signal is low conversion loss given that virtually all the RF input current is retained in the output.

Another advantage of such a combination is reduced noise and sensitivity to interference due to the steeper transitions between the on and off states of the preprocessed phase-split LO inputs.

Another advantage of the preprocessor of the present invention is its ability to reduce or eliminate unwanted coupling or leakage from the RF input to the LO input of the mixer. In systems lacking preprocessing as described herein, a strong blocker may be present on the RF input line and thus couples itself onto the local oscillator lines. During the mixing process, the unwanted blocker frequencies cause DC interference in the output signal. This type of coupling occurs even though the actual local oscillator in one embodiment oscillates at about ½ the desired RF frequency, because the mixer core switches polarity 4 times per local oscillator cycle, i.e. at twice the local oscillator frequency.

The preprocessor can reduce the DC error in the mixer output resulting from the RF blocker by over 40 dB.

Figure 8:
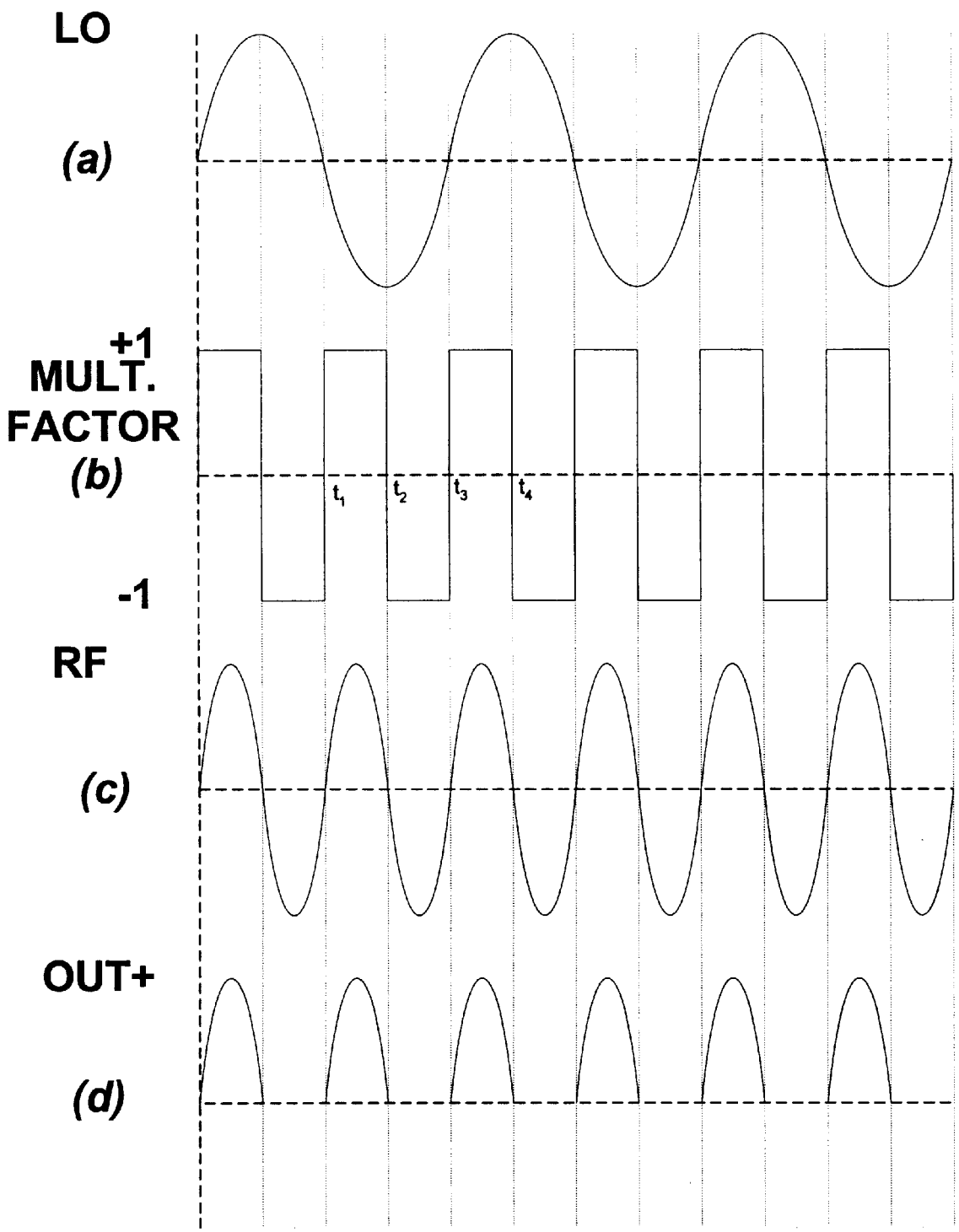
FIGS. 8A–8F illustrate example waveforms in an implementation of a mixer of the subject invention in which n=2.
Figure 8:
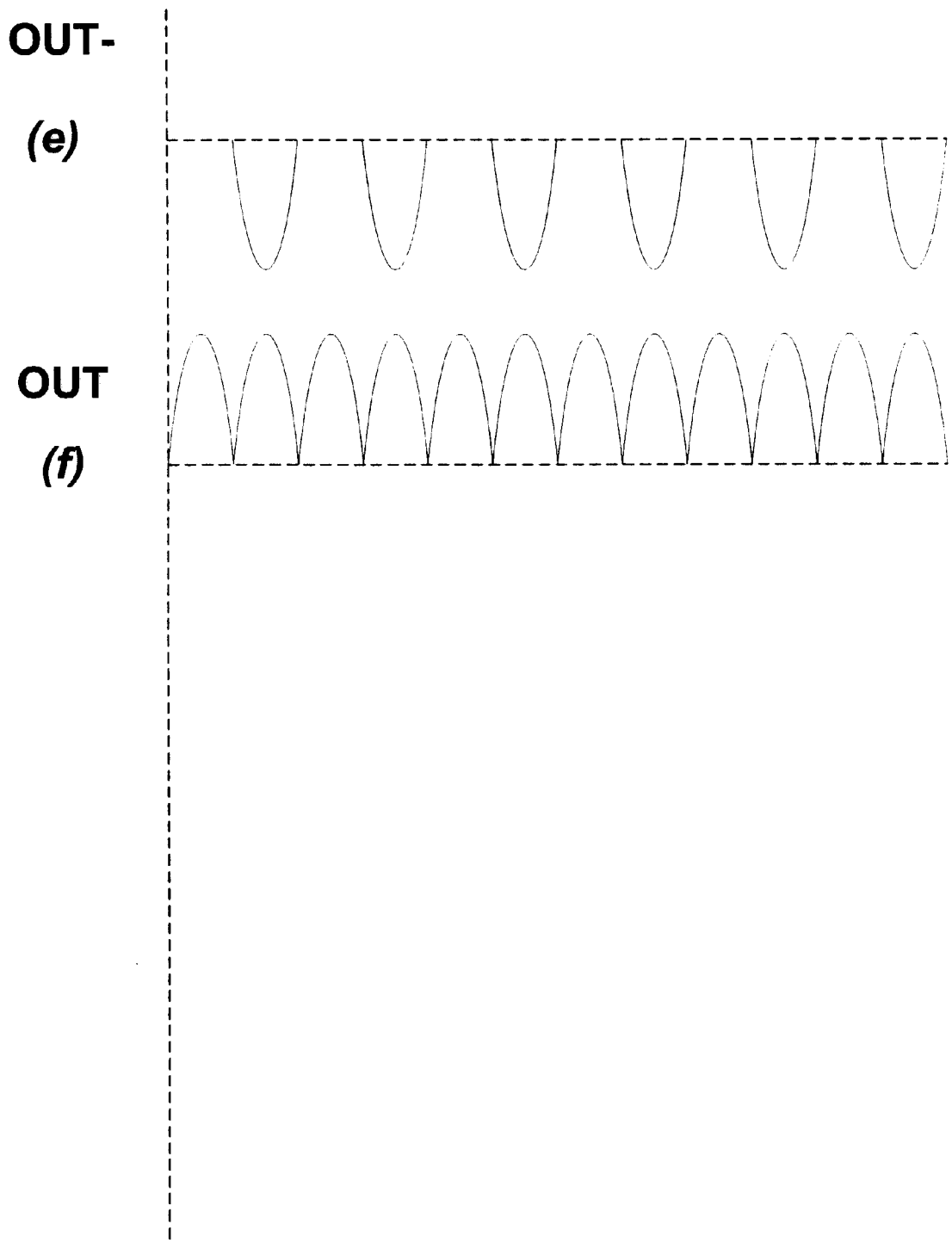

The derivation of this conclusion in the case in which the LO frequency is ½ the RF frequency will now be provided. With reference to FIG. 8, the transitions of the mixer polarity are labeled $(\tau_1, \tau_2, \tau_3, \tau_4)$. These transitions occur when two local oscillator signals cross one another, causing switching between two separate transistors in the mixer core. Thus, the relational timing of $\tau_1, \tau_2, \tau_3, \tau_4$ is important.

However, interference undesirably affects the timing of $\tau_1, \tau_2, \tau_3$, and $\tau_4$. This is undesirable because shifting $\tau_1, \tau_2, \tau_3, \tau_4$ has an effect on the selectivity performance of the mixer. This change in timing occurs because each change in mixer polarity occurs at the crossing of two local oscillator signals. Hence when an interferring signal couples on top of one of these local oscillator signals, it can shift the time of the switch. For example, assuming the local oscillator signals are sinusoidal for a small interferring signal of magnitude $V_{int}$, at $\tau_1$, the transition time will be shifted:

$$\tau_1 - \tau_1 = \frac{\sqrt{2}}{2} \frac{V_{int}(\tau_1)}{2\pi - F_{LO}V_{LO}} = \Delta_1$$

and at $\tau_2$:

$$\tau_2 - \tau_2 = \frac{-\sqrt{2}}{2} \frac{V_{int}(\tau_2)}{2\pi - F_{LO}V_{LO}} = \Delta_2$$

where $V_{LO}$ and $F_{LO}$ are the amplitude and frequency of the local oscillator respectively.

Now, if $V_{int}(t) = A \cos(2\pi F_{RF} t + \phi(t))$ (where $F_{RF}$ is the desired RF frequency and $\phi(t)$) is a slow-varying phase) as in the case of an in-band blocker, then as the local oscillator signal progresses from $\tau_1$ to $\tau_2$, passing through ¼ of its cycle, or 90°, $V_{int}(t)$ passes through 180° and so reverses polarity. (The references to polarity and polarity reversing in this section refer to the same concept discussed earlier in relation to the effective switching action of a multiplication factor at a rate which is twice the LO frequency.) In other words, $V_{int(\tau 1)} = -V_{int(\tau 2)}$, which is equivalent in mathematical terms to:

$$\Delta_1 = \Delta_2 = \frac{\sqrt{2}}{2} \frac{A\cos(2\pi F_{RF}\tau_1 + \phi(t))}{2\pi F_{LO} V_{LO}}$$

The next question is how the foregoing shifts in the switching times $\tau_1, \tau_2$ etc. affects the performance of the mixer. The output of the mixer is simply the product of its polarity and its RF input. Thus, the Fourier coefficients of the mixer polarity over time describe the behavior of the mixer.

To ease the following mathematical discussion, a few transforms are needed:

$$x = \tau - \frac{T}{8} \text{ (where } T \text{ is the period of the } LO)$$

Therefore, it follows:

$$x_1 = \tau_1 - T/8, x_2 = \tau_2 - T/8, x_3 = \tau_3 - T/8, x_4 = \tau_4 - T/8$$

$$f(x) = (polarity)/2 + 1/2$$

Starting with:

$$f(x) = \sum_{n=o}^{\infty} a_n \cos\left(\frac{2\pi nx}{T}\right) + b_n \sin\left(\frac{2\pi nx}{T}\right)$$

$$a_0 = \frac{1}{T}\left(\int_{x_1}^{x_2} dx + \int_{x_1}^{x_2} dx\right) = \frac{x_2 + x_4 - x_1 - x_3}{T}$$

$$a_n = \frac{2}{T}\int_{x_{1T}}^{x_2} \cos\left(\frac{2\pi nx}{T}\right)dx + \frac{2}{T}\int_{x_3}^{x_4} \cos\left(\frac{2\pi nx}{T}\right)dx$$

$$= \frac{1}{n\pi}\left(\sin\left(\frac{2\pi nx_2}{T}\right) + \sin\left(\frac{2\pi nx_4}{T}\right) - \sin\left(\frac{2\pi nx_1}{T}\right) - \sin\left(\frac{2\pi nx_3}{T}\right)\right)$$

$$b_n = \frac{-1}{n\pi}\left(\cos\left(\frac{2\pi nx_2}{T}\right) + \cos\left(\frac{2\pi nx_4}{T}\right) - \cos\left(\frac{2\pi nx_1}{T}\right) - \cos\left(\frac{2\pi nx_3}{T}\right)\right)$$

and applying this to the case in which a RF blocker has coupled onto the sinusoidal local oscillator output:

$$x_1 = \frac{\sqrt{2} A\cos(\phi(t))}{4\pi F_{LO}V_{LO}} \quad x_2 = \frac{T}{4} + \frac{\sqrt{2} A\cos(\phi(t))}{4\pi F_{LO}V_{LO}}$$

$$x_3 = \frac{T}{2} \quad x_4 = \frac{3T}{4}$$

Upon solving for the Fourier coefficients;

$$a_0 = 1/2$$

$$a_1 = \frac{-\sqrt{2} A\cos(\phi(t))}{2V_{LO}\pi} \quad b_1 = \frac{\sqrt{2} A\cos(\phi(t))}{2V_{LO}\pi}$$

$$a_2 = \frac{-\sqrt{2} A\cos(\phi(t))}{V_{LO}\pi} \quad b_2 = \frac{2}{\pi}$$

In the foregoing, the $a_2$ is the problem. It results in the following term in the output:

$$a_2\cos\left(\frac{4\pi t}{T}\right) = -\frac{\sqrt{2} A\cos(\phi(t))}{V_{LO}\pi}\cos\left(\frac{4\pi t}{T}\right)$$

$$= \frac{-\sqrt{2} A}{2V_{LO}\pi}\left[\cos\left(\frac{4\pi t}{T} + \phi(t)\right) + \cos\left(\frac{4\pi t}{T} - \phi(t)\right)\right]$$

where the first term directly above is identical to the original RF blocker on the RF input, $(A\cos(2\pi f_{RF}t+\phi(t)))$, where $F_{RF}=2/T$. Hence this term will mix down the blocker to DC.

The next question is the effect preprocessing has on this mechanism. There are two different places where an RF blocker can couple onto the local oscillator (LO) signal or signals: 1) prior to preprocessing; and 2) after preprocessing.

If a RF blocker couples onto the local oscillator signal after preprocessing, a similar mechanism will be active. However, the effect will be reduced for two reasons: 1) The physical connections between preprocessor and mixer can be kept short, thereby reducing the coupling effect to negligible levels; and 2) the signal transitions after preprocessing will be considerably faster and steeper, thereby reducing the effects of time-shifting by a factor of $$\frac{1}{\sqrt{2} \cdot (gain)}$$

where (gain) is the input gain of the preprocessor.

Alternatively, if an RF blocker couples onto the local oscillator signal before it is preprocessed, an entirely different mechanism comes into play. Because the preprocessor compares $LO_0$ with $-LO_0$ and $LO_1$ with $-LO_1$ to generate two 90° phase-shifted square waves which are summed, with reference to FIG. 14A(5), an RF blocker riding on $LO_1$, for example, can only affect $x_1$ and $X_3$.

For a given (sinusoidal) local oscillator signal, switching is generated only at zero-crossings, which are 180° apart. An RF blocker, meanwhile, will pass through 360° between transitions, meaning that it will have approximately the same value at both transitions. The same value at both transitions causes the $a_2$ term to reduce to zero. It can be shown that:

$$x_1 = \frac{1}{2}\frac{V_{int}(\phi(t))}{2\pi F_{LO}V_{LO}}$$

$$x_3 = \frac{T}{2} - \frac{1}{2}\frac{V_{int}(\phi(t))}{2\pi F_{LO}V_{LO}} = \frac{T}{2} - x_1$$

Once again, setting $V_{int}=A \cos(2\pi F_{RF}t+\phi(t))$, the following results:

$$x_1 = \frac{A\cos(\phi(t))}{4\pi F_{LO}V_{LO}} \quad x_2 = \frac{T}{4}$$

$$x_3 = \frac{T}{2} - \frac{A\cos(\phi(t))}{4\pi F_{LO}V_{LO}} \quad x_4 = \frac{3T}{4}$$

Solving for the Fourier coefficients:

$$a_0 = 1/2$$

$$a_1 = \frac{A\cos(\phi(t))}{\pi V_{LO}} \quad b_1 = 0$$

$$a_2 = 0 \quad b_2 = \frac{2}{\pi}$$

where $a_2$ and $b_2$ are independent of $\phi(t)$. Therefore, RF blockers coupling onto the local oscillator links before preprocessing do not mix themselves down.

In summary, without preprocessing, assuming sinusoidal local oscillator outputs, the DC error resulting from the RF blocker is;

$$DC_{error} = \frac{A^2 K_1 \sqrt{2}}{4\pi V_{LO}}$$

A = BLOCKER AMPLITUDE $K_L$ = COUPLING COEFFICIENT $V_{LO}$ = LO AMPLITUDE

However, with preprocessing, the DC error from the RF blocker is:

$$DC_{error} = \frac{A^2 K_2}{4\pi V_{LO} \cdot gain}$$

$K_2$ = COUPLING FOR LINES FROM PREPROCESSOR TO MIXER $(K_2 << K_1)$

GAIN = GAIN OF PREPROCESSOR (BETWEEN 3 AND 10 IN EXEMPLARY EMBODIMENT)

By way of example, if gain=3 and estimating $K_2=K_1/30$, it can be seen that preprocessing in this example reduces the $DC_{error}$ term from blockers by more than 40 dB.

While particular embodiments, implementations, and implementation examples of the present invention have been described above, it should be understood that they have been presented by way of example only, and not as limitations. The breadth and scope of the present invention is defined by the following claims and their equivalents, and is not limited by the particular embodiments described herein

What is claimed is:

1. A circuit for improving switching characteristics of a phase-split input signal having 2n components, wherein n is an integer greater than 1, comprising:
    limiter circuitry for limiting the components of the input signal to produce a limited phase-split input signal; and
    arithmetic circuitry for arithmetically combining the components of the limited phase-split signal to produce an output phase-split signal, the output signal having 2n components which transition between first and second states at crossover points of the components of the input signal.

2. The circuit of claim 1 wherein the limiter circuitry limits a component of the input signal by amplifying and clipping it.

3. The circuit of claim 1 wherein the components of the output signal transition between on and off states at DC crossover points of the components of the input signal.

4. The circuit of claim 1 wherein the arithmetic circuitry produces a component of the output signal by pairwise combining two limited components.

5. The circuit of claim 4 wherein the arithmetic circuitry produces a component of the output signal by adding a limited component to an inverse of a next successive phase-lagged limited component.

6. The circuit of claim 4 wherein the arithmetic circuitry produces a component of the output signal by subtracting from a limited component a next successive phase-lagged limited component.

7. The circuit of claim 1 wherein the limiter circuitry comprises a plurality of differential comparators.

8. The circuit of claim 1 wherein the limiter circuitry comprises a plurality of single-ended comparators.

9. The circuit of claim 1 wherein the arithmetic circuitry comprises nodes formed from cross-coupled transistor collectors.

10. The circuit of claim 7 wherein each differential comparator has a pair of current mode outputs for each of its inputs.

11. The circuit of claim 1 wherein n=2.

12. The circuit of claim 1 wherein n>2.

13. A method of improving the switching characteristics of a phase-split input signal having 2n components, wherein n is an integer greater than 1, comprising:
    limiting the components of the input signal to produce a phase-split signal; and
    arithmetically combining the components of the limited signal to produce a phase-split output signal having 2n components which transition between first and second states at crossover points of the components of the input signal.

14. The method of claim 13 wherein the limiting step comprises, for each input component, amplifying and clipping the input component.

15. The method of claim 13 wherein the limited components are square waves.

16. The method of claim 13 wherein the arithmetically combining step comprises forming an output component by pairwise combining two limited components.

17. The method of claim 16 wherein the arithmetically combining step comprises forming an output component by subtracting from a limited component a next successive phase-lagged limited component.

18. The method of claim 16 wherein the arithmetically combining steps comprises forming an output component by adding to a limited component an inverse of a next successive phase-lagged limited component.

19. The method of claim 13 wherein the transitions between the on and off states of an output component occur at DC crossover points of the input components.

20. The method of claim 13 wherein n=2.

21. The method of claim 13 wherein n>2.

22. A circuit for improving switching characteristics of a phase-split input signal having 2n components, wherein n is an integer greater than 1, and also having a period T, comprising:
    at least one input for receiving the components of the phase-split input signal; and
    processing circuitry for producing, responsive to the phase-split input signal, a phase-split output signal, also having 2n components, wherein, for each substantially non-overlapping subperiod of duration T/2n of the period T, 1) only one of the components of the output signal is asserted at a time, and a different one of the output components is asserted in each of the subperiods; and 2) the transitions between first and second states for each of the components of the output signal occur at crossover points of the components of the input signal.

23. A method for improving switching characteristics of a phase-split input signal having 2n components, wherein n is an integer greater than 1, and also having a period T comprising:
    receiving the components of the phase-split input signal; and
    producing, responsive to the phase-split input signal, a phase-split output signal, also having 2n components, wherein, for each substantially non-overlapping subperiod of duration T/2n of the period T, 1) only one of the components of the output signal is asserted at a time, and a different one of the output components is asserted in each of the subperiods; and 2) the transitions between first and second states for each of the components of the output signal occur at crossover points of the components of the input signal.

24. A direct conversion receiver system comprising:
    a first input for receiving a first signal the signal having a frequency;
    the circuit of either of claims 1 or 22 for producing a second signal comprising a phase-split signal having 2n components, wherein n is an integer greater than 1, the second signal having a frequency which is about 1/n times the frequency of the first signal; and
    a frequency translator comprising first and second outputs and a frequency translator core configured to switch the first input signal to the first output responsive to assertion of any of a first group of components of the phase-split signal, and configured to switch the first input signal to the second output responsive to assertion of any of a second group of components of the phase-split signal.

25. The circuit of claim 22 wherein each of the output components is substantially symmetrical about a horizontal axis.

26. The circuit of claim 22 wherein the transitions between the first and second states for each of the output components are fast.

27. The method of claim 23 wherein each of the output components is substantially symmetrical about a horizontal axis.

28. The method of claim 23 wherein the transitions between the first and second states for each of the output components are fast.

29. A circuit for improving switching characteristics of a phase-split input signal having 2n components, wherein n is an integer greater than 1, comprising:

limiter means for limiting the components of the input signal to produce a limited phase-split input signal; and arithmetic means for arithmetically combining the components of the limited phase-split signal to produce an output phase-split signal, the components of the output signal having 2n components which transition between first and second states at crossover points of the components of the input signal.

30. A method of improving the switching characteristics of a phase-split input signal having 2n components, wherein n is an integer greater than 1, comprising:

a step for limiting the components of the input signal to produce a phase-split signal; and a step for arithmetically combining the components of the limited signal to produce a phase-split output signal having 2n components which transition between first and second states at crossover points of the components of the input signal.

* * * * *